United States Patent
Babbs et al.

(10) Patent No.: US 12,162,698 B2
(45) Date of Patent: *Dec. 10, 2024

(54) SUBSTRATE TRANSPORT APPARATUS

(71) Applicant: BROOKS AUTOMATION US, LLC, Chelmsford, MA (US)

(72) Inventors: Daniel Babbs, Austin, TX (US); Vincent W. Tsang, Lincoln, MA (US); Robert C. May, Austin, TX (US)

(73) Assignee: Brooks Automation US, LLC, Chelmsford, MA (US)

( * ) Notice: Subject to any disclaimer, the term of this patent is extended or adjusted under 35 U.S.C. 154(b) by 82 days.

This patent is subject to a terminal disclaimer.

(21) Appl. No.: 17/649,646

(22) Filed: Feb. 1, 2022

(65) Prior Publication Data

US 2022/0153535 A1    May 19, 2022

Related U.S. Application Data

(63) Continuation of application No. 17/156,007, filed on Jan. 22, 2021, now Pat. No. 11,235,935.

(60) Provisional application No. 62/964,817, filed on Jan. 23, 2020.

(51) Int. Cl.
*H01L 21/687* (2006.01)
*B65G 47/90* (2006.01)
*H01L 21/67* (2006.01)
*H01L 21/677* (2006.01)

(52) U.S. Cl.
CPC ........ *B65G 47/90* (2013.01); *H01L 21/67167* (2013.01); *H01L 21/68707* (2013.01)

(58) Field of Classification Search
CPC .................................................. H01L 21/68707
See application file for complete search history.

(56) References Cited

U.S. PATENT DOCUMENTS

| | | |
|---|---|---|
| 5,778,730 A | 7/1998 | Solomom et al. |
| 6,428,266 B1 | 8/2002 | Solomon et al. |
| 6,547,510 B1 | 4/2003 | Beaulieu |
| 6,794,664 B1 * | 9/2004 | Mitchell ............. H01L 21/6831 |
| | | 250/492.2 |
| 10,155,309 B1 | 12/2018 | Blank |
| (Continued) | | |

FOREIGN PATENT DOCUMENTS

| | | |
|---|---|---|
| CN | 103503127 | 1/2014 |
| JP | 6384883 | 4/1988 |
| (Continued) | | |

*Primary Examiner* — Gerald McClain
(74) *Attorney, Agent, or Firm* — Perman & Green, LLP

(57) ABSTRACT

A substrate transport apparatus comprising a frame, a drive section connected to the frame, and an articulated arm having at least one articulated arm link operably connected to the drive section so that the articulated arm rotates about a pivot axis relative to the frame and extends and retracts relative to the pivot axis. The articulated arm has an end effector pivotally mounted to at least one articulated arm link forming a joint between the end effector and the articulated arm link, with an arm joint pivot axis disposed so that the end effector rotates relative to at least one articulated arm link about the arm joint pivot axis. The articulated arm has a drive band transmission with drive and driven pulleys where the driven pulley is connected to the articulated wrist.

33 Claims, 35 Drawing Sheets

(56) References Cited

U.S. PATENT DOCUMENTS

| | | | |
|---|---|---|---|
| 10,325,795 B2 | 6/2019 | Caveney et al. | |
| 11,201,073 B2 | 12/2021 | Gilchrist | |
| 11,235,935 B2 * | 2/2022 | Babbs | B65G 47/90 |
| 11,270,904 B2 | 3/2022 | Tsang et al. | |
| 2004/0266574 A1 * | 12/2004 | Jinno | A61B 34/71 |
| | | | 474/174 |
| 2010/0178146 A1 * | 7/2010 | Kremerman | B25J 9/042 |
| | | | 74/490.06 |
| 2013/0039726 A1 | 2/2013 | Brodine et al. | |
| 2015/0190933 A1 | 7/2015 | Applied | |
| 2016/0327138 A1 | 11/2016 | Mu et al. | |
| 2018/0019155 A1 | 1/2018 | Tsang et al. | |
| 2022/0388158 A1 * | 12/2022 | Hudgens | B25J 9/142 |
| 2024/0075613 A1 * | 3/2024 | Hudgens | H01L 21/68707 |

FOREIGN PATENT DOCUMENTS

| | | | |
|---|---|---|---|
| JP | 6384887 | | 4/1988 |
| JP | 01240288 | | 9/1989 |
| JP | 07122620 | | 5/1995 |
| JP | 2006062046 | | 3/2006 |
| JP | 2008223974 | | 9/2008 |
| JP | 2014124741 | | 7/2014 |
| JP | 2014124741 A | * | 7/2014 |
| JP | 2016532299 | | 10/2016 |
| JP | 2019526171 | | 9/2019 |

* cited by examiner

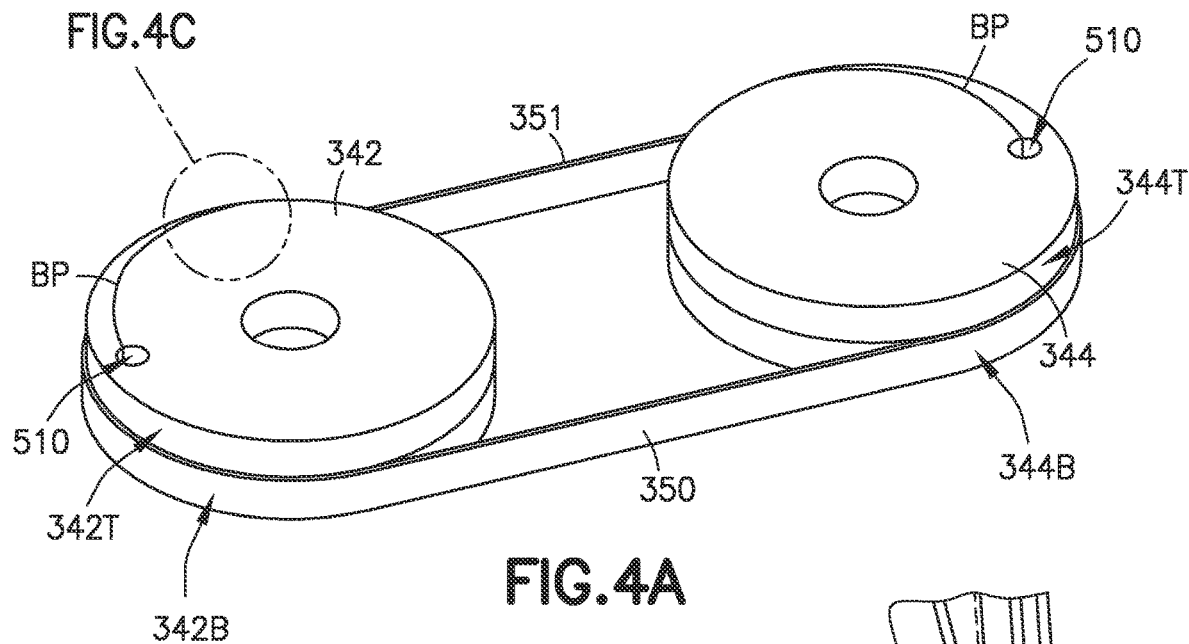
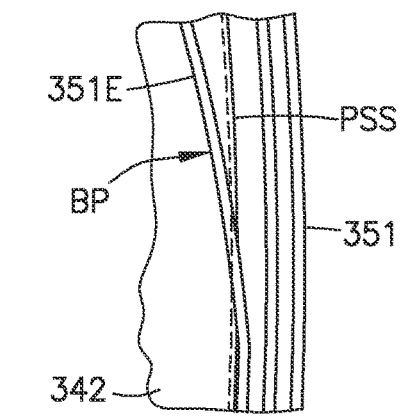
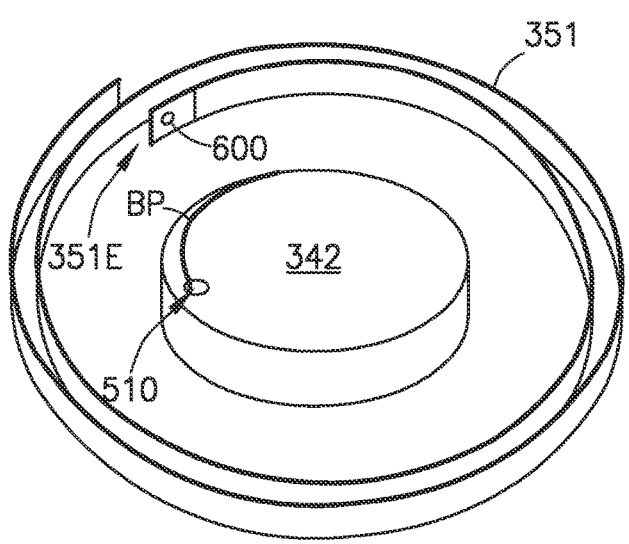
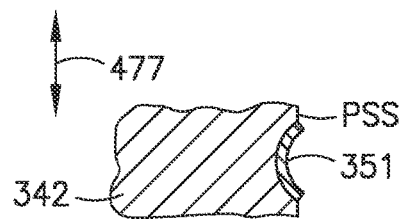
FIG.4A
FIG.4C
FIG.4B
FIG.4D

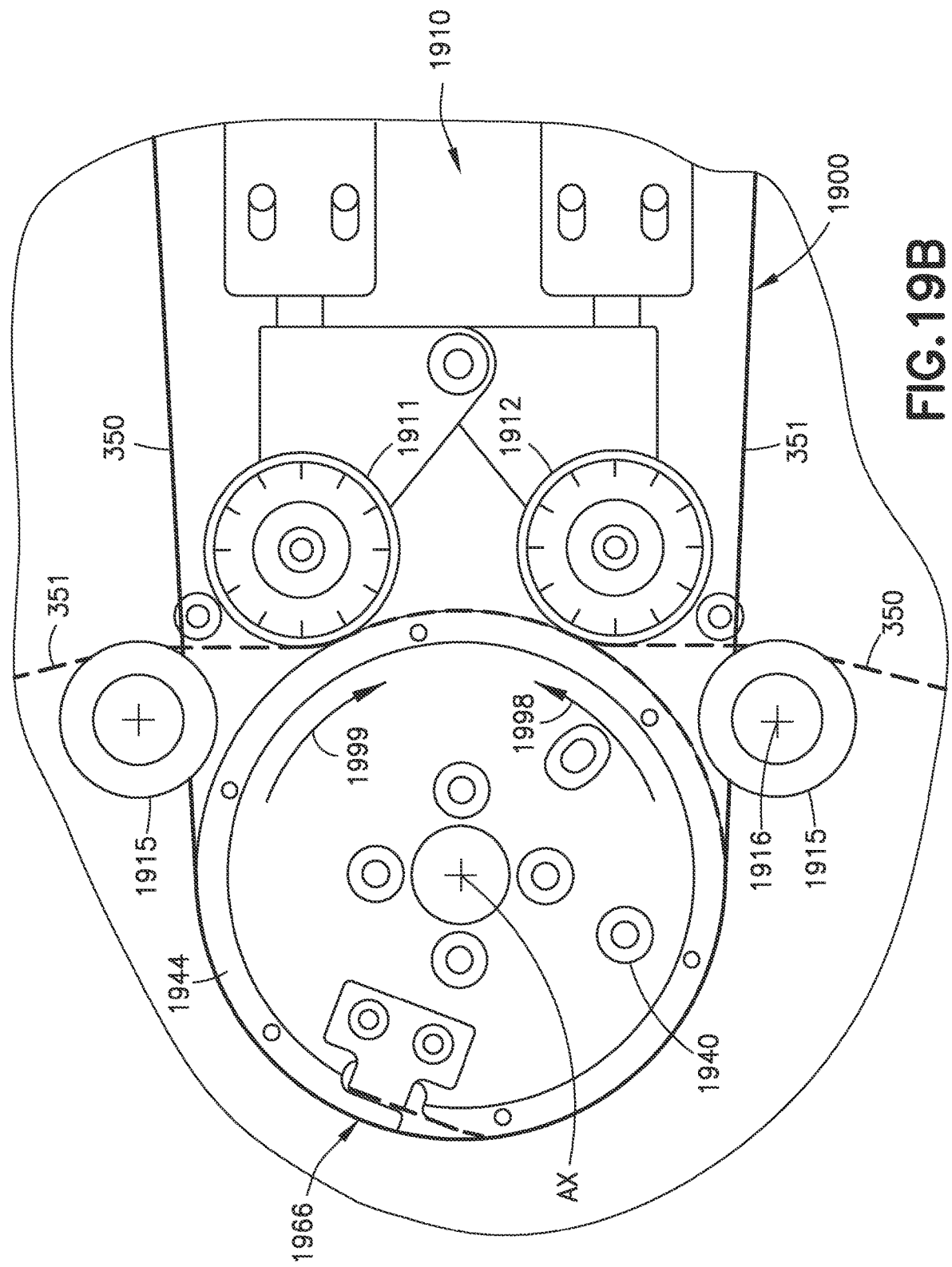

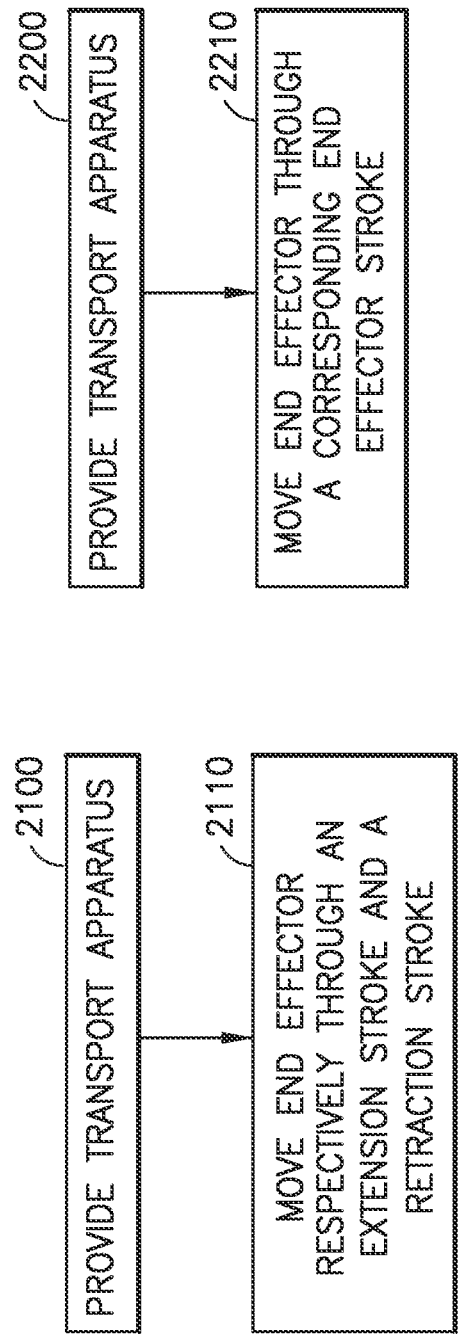

SUBSTRATE TRANSPORT APPARATUS

CROSS-REFERENCE TO RELATED APPLICATIONS

This application is a continuation of U.S. application Ser. No. 17/156,007, filed Jan. 22, 2021, (now U.S. Pat. No. 11,235,935) which is a non-provisional Patent Application that claims priority to and the benefit of United States Provisional Patent Application number 62/964,817, filed Jan. 23, 2020, the disclosures of which are incorporated by reference herein in their entirety.

BACKGROUND

1. Field

The exemplary embodiments generally relate to robotic transport apparatus, and more particularly, to robotic drive transmissions.

2. Brief Description of Related Developments

Generally, some robotic manipulators employ metal band and pulley drive systems for driving rotation of the different articulated links of the robotic manipulators. The metal bands are conventionally coupled to a respective pulley by a screw to transfer torque between the pulley and the band. The conventional screw type coupling between the band and the pulley may limit the range of motion for the pulley as the band may reverse direction and fold over itself if the pulley is rotated beyond the angle of contact between band and the pulley. As such, joints for a robotic manipulator driven by a conventional band and pulley drive system are typically limited to about 360° rotation or less (e.g., about +/−180° rotation).

BRIEF DESCRIPTION OF THE DRAWINGS

The foregoing aspects and other features of the disclosed embodiment are explained in the following description, taken in connection with the accompanying drawings, wherein:

FIGS. 4A-C illustrate an exemplary transmission of the substrate transport apparatus of FIGS. 1A-1E in accordance with aspects of the disclosed embodiment, FIG. 4D is a section view;

FIGS. 19A and 19B illustrate an exemplary band installation fixture in accordance with aspects of the disclosed embodiment;

FIG. 21 is an exemplary method in accordance with aspects of the disclosed embodiment; and FIG. 22 is an exemplary method in accordance with aspects of the disclosed embodiment.

DETAILED DESCRIPTION

Figure 1A:
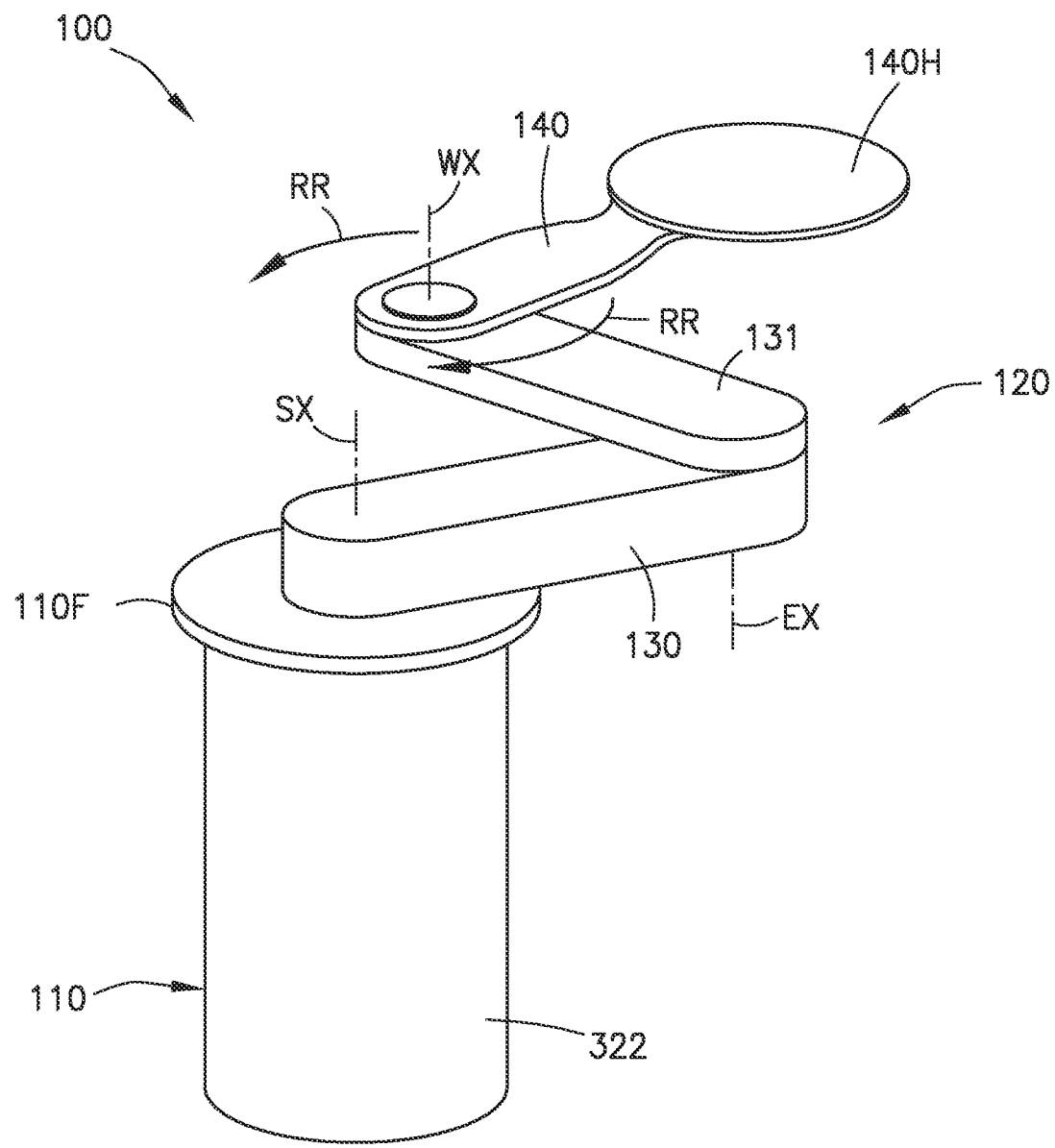
FIGS. 1A-1E illustrate exemplary substrate transport apparatus in accordance with aspects of the disclosed embodiment.

Referring to FIGS. 1A-2E, there are shown schematic views of substrate processing apparatus or tools incorporating the aspects of the disclosed embodiment as disclosed further herein. Although the aspects of the disclosed embodiment will be described with reference to the drawings, it should be understood that the aspects of the disclosed embodiment can be embodied in many forms. In addition, any suitable size, shape or type of elements or materials could be used.

The aspects of the disclosed embodiment described herein provide for a band and pulley torque transmission drive configuration for robotic manipulators. Generally there is a desire in the semiconductor processing industry for increase numbers of process modules in semiconductor processing apparatus (i.e., these processing apparatus may be referred to as high density process module tools). To transport substrate to and from the increased number of tools the substrate transport apparatus have to meet increased reach requirements. The aspects of the disclosed embodiment provided herein provide for increased joint angle rotation (compared to conventional transport arm described above) so as to provide arm movement that facilitates substrate transport to any of the process modules of a high density process module tool. The increased joint angle rotation is effected by, for example, the band and pulley torque transmission drive configuration of the aspects of the disclosed embodiment which provide for a rotation of the drive and/or driven pulleys by a rotation angle RR that is defined by the drive (or reduction) ratio between an input (e.g., drive) pulley and an output (e.g., driven) pulley (where the drive ratio is the ratio between the diameter of the drive pulley compared to the diameter of the driven pulley). In one aspect of the disclosed embodiment rotation of the drive pulley may be about 320° of rotation (e.g., about +/−160° from a midstroke position described herein). With about 320° of drive pulley rotation and a 2:1 ratio between the drive pulley and the driven pulley, the driven pulley may rotate up to about 640° (e.g., about +/−320° from midstroke). Where a 3:1 ratio is employed between the drive pulley and the driven pulley, the driven pulley may rotate up to about 960° (e.g., about +/−480° from midstroke). The greater than about 360° rotation of the driven pulley provides for an increased robotic manipulator range of motion due to, for example, increased stroke in the articulated links of the robotic manipulator.

Referring to FIGS. 1A-1E exemplary substrate transport apparatus 100-104 are illustrated and will be described in greater detail below. Each of the substrate transport apparatus 100-104 generally include a frame 110F, a drive section 110 connected to the frame 110F, and an articulated arm (e.g., also referred to as transport arm, such as transport arm 120-124) having at least one articulated arm link (e.g., upper arm link 130 or upper arm link 130 and forearm link 131) operably connected to the drive section 110 so that the articulated arm rotates about, a pivot axis (e.g., shoulder axis SX described herein), relative to the frame 110F and extends and retracts relative to the pivot axis (e.g., shoulder axis SX). As will be described in greater detail herein, the transport arm has an end effector 140, 140A, 140B, 141, 142 pivotally mounted to the at least one articulated arm link forming a joint (e.g., wrist joint 336—see FIG. 3A) between the end effector 140, 140A, 140B, 141, 142 and the at least one articulated arm link with an arm joint pivot axis (e.g., wrist joint WX) disposed so that the end effector 140, 140A, 140B, 141, 142 rotates relative to the at least one articulated arm link about the wrist axis WX.

While the transport arms 120-124 are described herein as having a SCARA arm configuration, in other aspects the transport arms may have any suitable configuration. Referring to FIG. 1A, the substrate transport apparatus 100 includes transport arm 120 and drive section 110. The transport arm 120 is coupled to an output of the drive section 110 (as will be described herein) and includes an upper arm link 130 rotatably coupled to the drive section 130 at a shoulder axis SX of rotation, a forearm link 131 rotatably coupled to the upper arm link 130 at an elbow axis EX of rotation, and at least one single ended end effector (e.g., substrate holder) 140 rotatably coupled to the forearm link 131 at a wrist axis WX of rotation. Here the end effector 140 includes a single substrate holding location 140H disposed on a single side of the wrist axis WX. In other aspects the end effector 140 may include, on the single side of the wrist axis WX, more than one substrate holding location arranged side-by-side in substantially the same plane or stacked one above the other. In one aspect, rotation of the end effector 140 may be slaved to, for example, the upper arm link 130 so that the end effector 140 remains aligned with an axis of extension and retraction of the transport 100. In other aspects, the end effector 140 may be coupled to a respective drive motor of the drive section 110 so that the rotation of the end effector 140 about the wrist axis WX is independent of (although rotation may be coordinated with) movement of the upper arm link 130 and the forearm link 131.

Figure 1B:
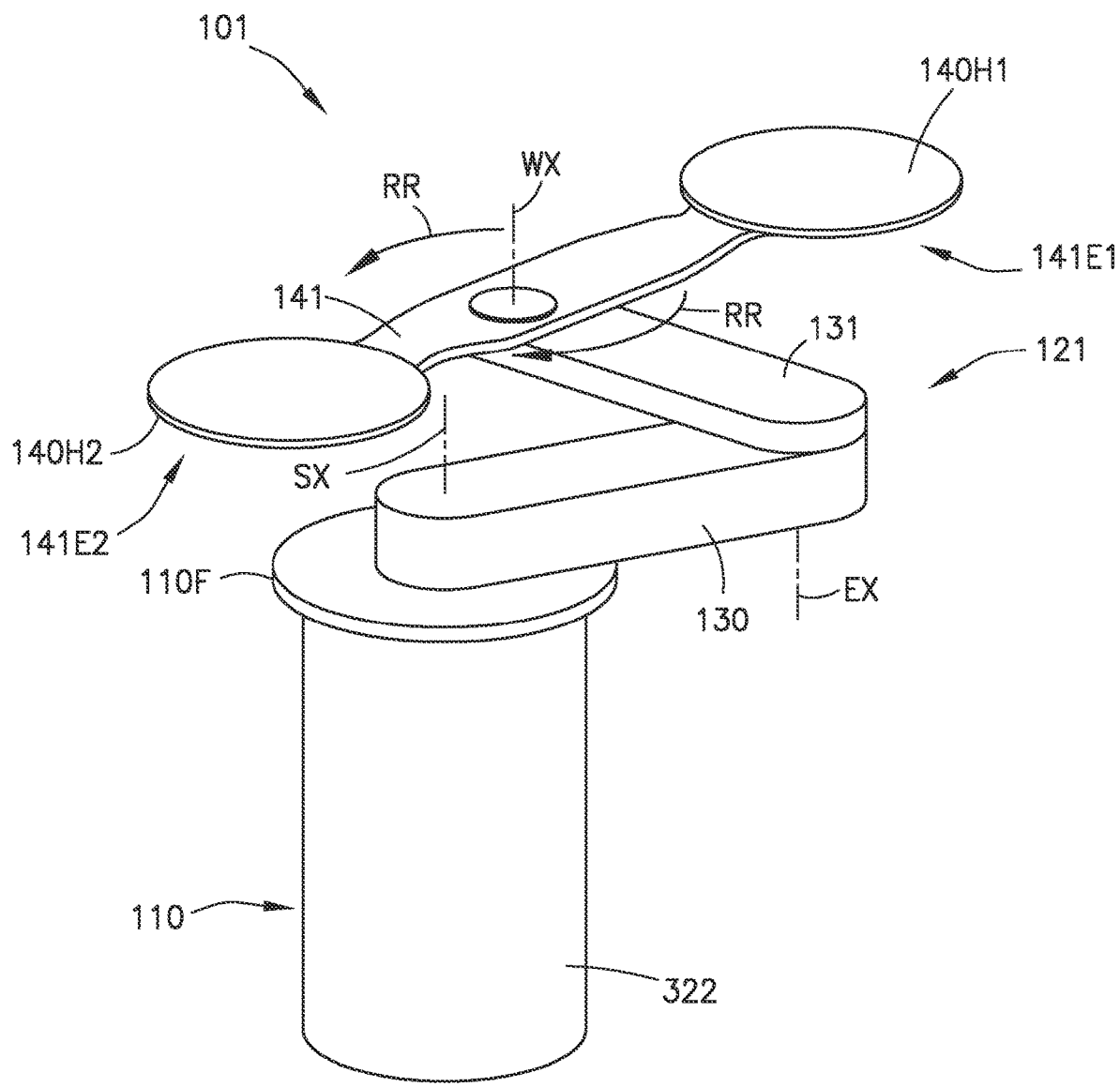

Referring now to FIG. 1B, the substrate transport apparatus 101 is substantially similar to transport apparatus 100. However, in this aspect, the transport arm 101 includes at least one dual pan end effector 141 having at least two opposing substrate holding locations 140H1, 140H2 (e.g., dual pans). For example, the end effector 141 extends on opposite sides of the wrist axis WX so that each opposing end 141E1, 141E2 of the end effector 141 has at least one respective substrate holding location(s) 140H1, 140H2 (e.g., the substrate holding locations 140H1, 140H2 are diametrically opposed across the wrist axis WX). In this example, the end effector 141 is illustrated as a substantially rigid end effector that is unarticulated between the ends 141E1, 141E2 (where the wrist axis WX is disposed between the ends 141E1, 141E2). It is also noted that while a single substrate holding station 140H1, 140H2 is illustrated on each end 141E1, 141E2 for explanatory purposes only, in other aspects one or more of the ends 141E1, 141E2 may have more than one substrate holding station arranged in a stack one above the other or arranged side-by-side in substantially the same plane. In one aspect, rotation of the end effector 141 may be slaved to, for example, the upper arm link 130 so that the end effector 141 remains aligned with an axis of extension and retraction of the transport 100. In other aspects, the end effector 141 may be coupled to a respective drive motor of the drive section 110 so that the rotation of the end effector 141 about the wrist axis WX is independent of (although rotation may be coordinated with) movement of the upper arm link 130 and the forearm link 131.

Figure 1C:
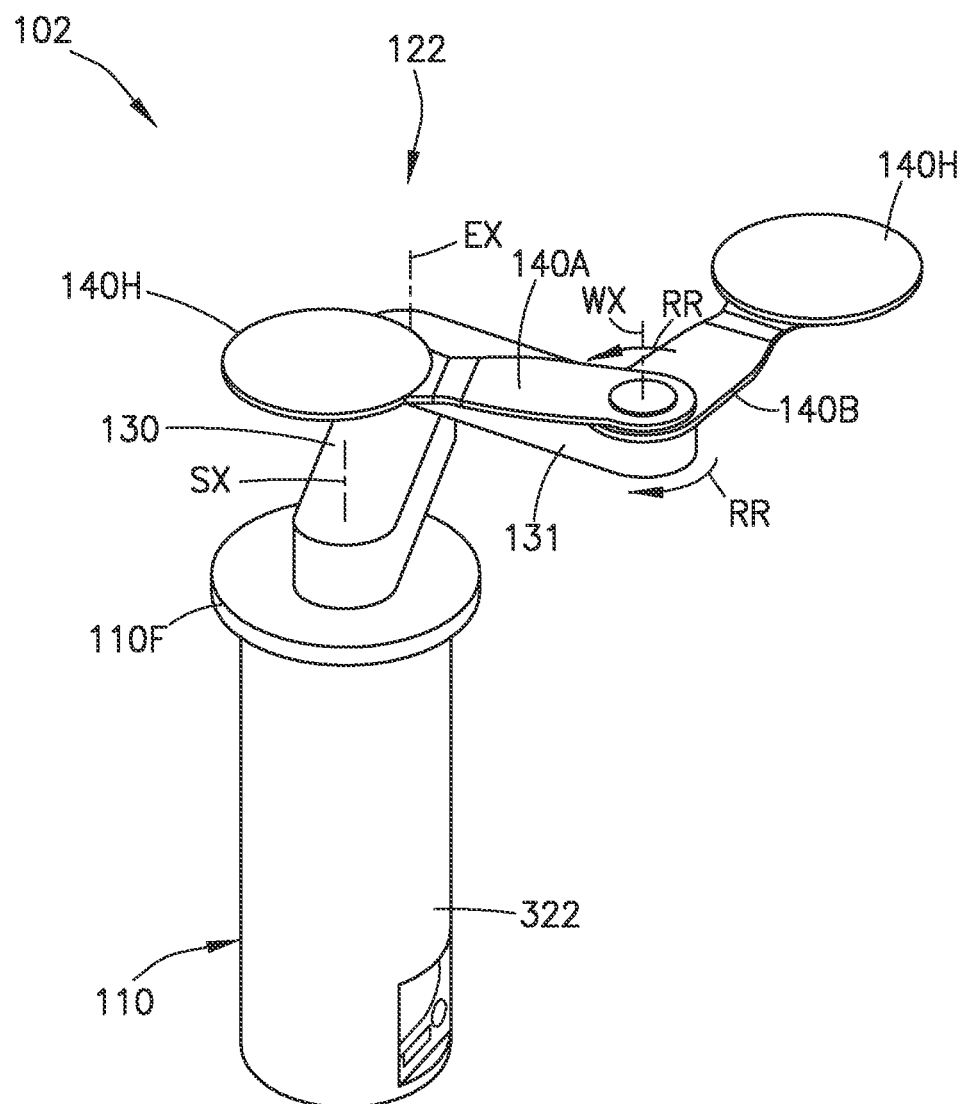

Referring to FIG. 1C, the substrate transport apparatus 101 is substantially similar to transport apparatus 100. However, in this aspect, the transport arm 102 includes two single ended end effectors 140A, 140B. Here each of the single ended end effectors 140A, 140B is substantially similar to end effector 140 described above. In other aspects the transport arm 102 may include two dual pan end effectors, where each of the dual pan end effectors is substantially similar dual pan end effector 141 described above. In one aspect, each of the end effectors 140A, 140B is independently rotatable about the wrist axis WX relative to the other end effector 140A, 140B, where each end effector is coupled to a respective drive motor of the drive section 110. In other aspects, the end effectors 140A, 140B may be differentially coupled to a common drive motor of the drive section in any suitable manner so that when one end effector 140A, 140B rotates the other end effector 140A, 140B rotates in the opposite direction about the wrist axis WX at the same rotational rate.

Figure 1D:
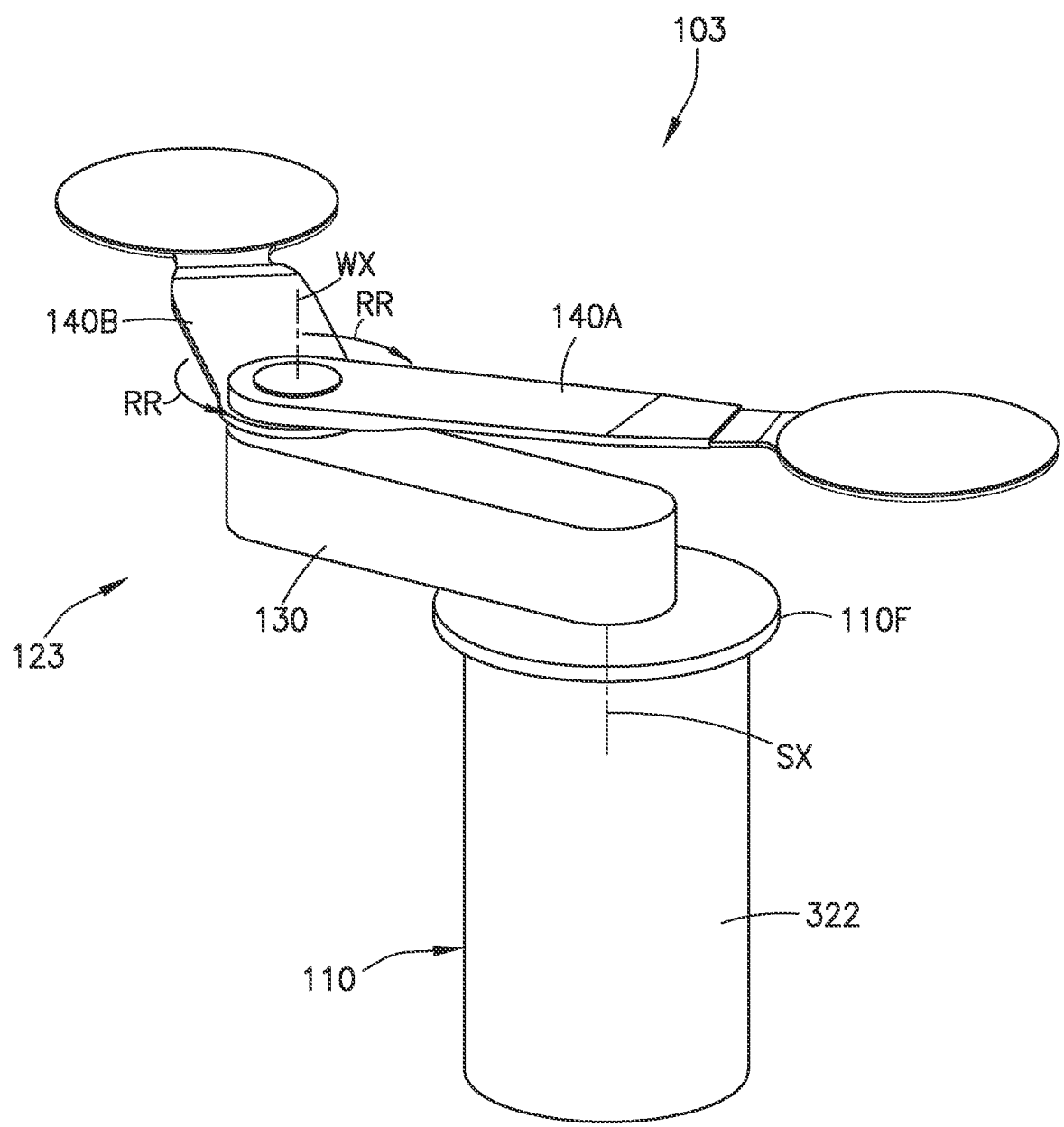

Referring to FIG. 1D, in this aspect the transport arm 123 includes an upper arm link 130 rotatably coupled to the drive section 110, and at least one end effector 140A, 140B rotatably coupled to the upper arm link 130 without any intervening arm links (i.e., the at least one end effector 140A, 140B is directly coupled to the upper arm link 130). In this example, the upper arm link 130 is a substantially unarticulated link between the shoulder axis SX and the wrist axis WX. Each of the at least one end effector 140A, 140B may be substantially similar to the end effectors 140, 140A, 140B described above. While two single ended end effectors 140A, 140B are illustrated for exemplary purposes only, in other aspects the transport arm 123 may have only one single ended end effector 140. In still other aspects, the substrate transport arm 123 may include one or more dual pan end effectors substantially similar to dual pan end effector 141 described above. Here each of the end effectors may be independently rotatable relative to the upper arm link 130 (such as by a respective drive motor of the drive section).

Figure 1E:
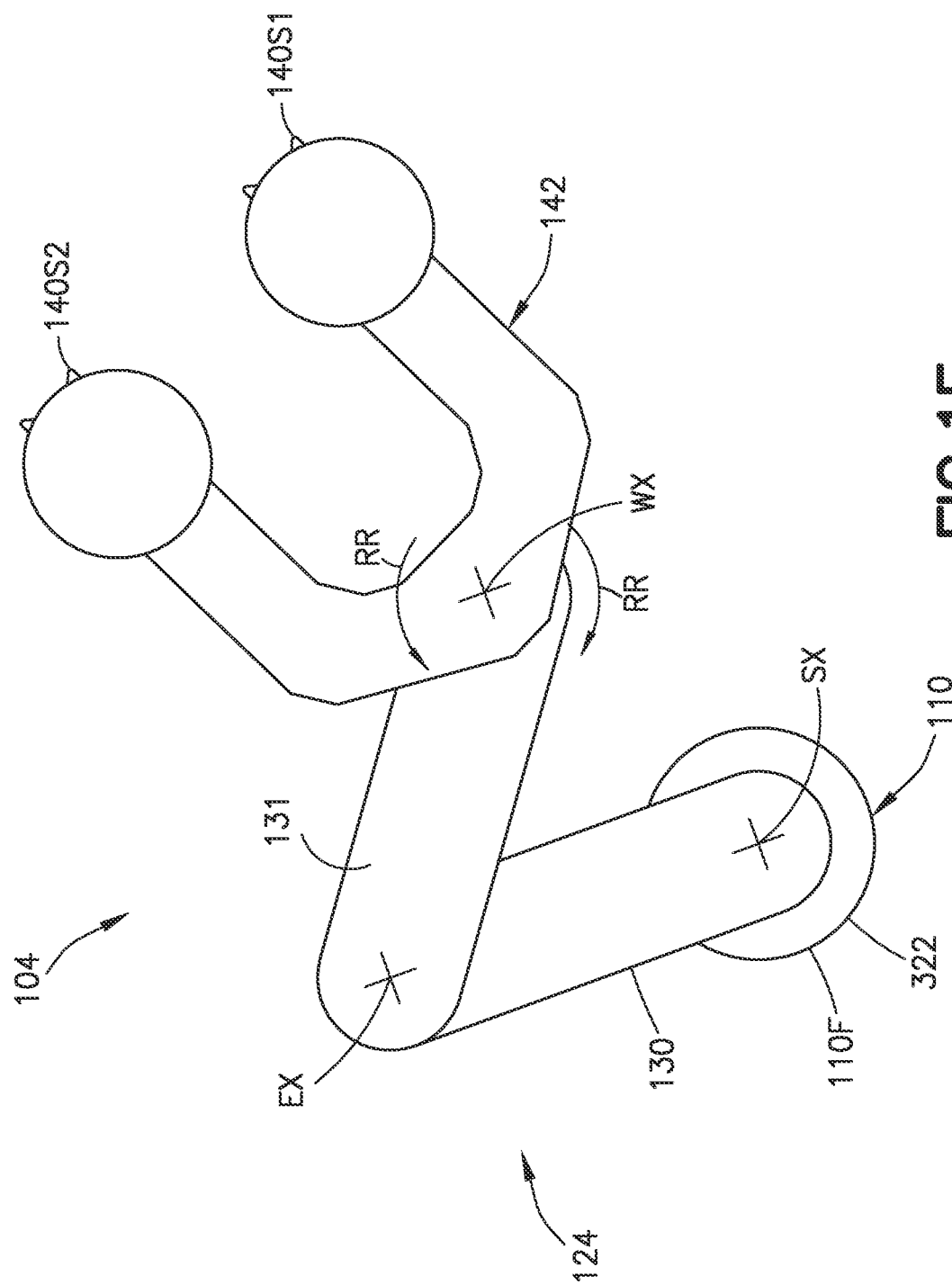

Referring to FIG. 1E, the substrate transport apparatus 104 includes a transport arm 124 substantially similar to transport arm 120 however, in this aspect the transport arm 120 includes at least one side-by-side pan end effector 142. In this example, the side-by-side pan end effector 142 includes two side-by-side (e.g., dual pan) substrate holding locations 140S1, 140S2 however, in other aspects there may be more than two side-by-side substrate holding locations. The side-by-side substrate holding locations, as noted above, are located substantially in the same plane. The side-by-side substrate holding locations 140S1, 140S1 provide for picking and placing of substrates substantially simultaneously to and from side-by-side substrate holding stations as will be described herein.

Referring to FIGS. 1A-2E, processing apparatus, such as for example semiconductor tool stations 200-203 are shown in accordance with aspects of the disclosed embodiment. Although semiconductor tool stations are shown in the drawings, the aspects of the disclosed embodiment described herein can be applied to any tool station or application employing robotic manipulators. In the examples shown, the tool stations 200, 202, 203 are shown as cluster tools, however the aspects of the disclosed embodiment may be applied to any suitable tool station such as, for example, a linear tool station such as that described in U.S. Pat. No. 8,398,355, entitled "Linearly Distributed Semiconductor Workpiece Processing Tool," issued Mar. 19, 2013, and U.S. Pat. No. 7,901,539, entitled "Apparatus and Methods for Transporting and Processing Substrates," issued Mar. 8, 2011 the disclosures of which are incorporated by reference herein in their entireties. The tool stations 200-203 generally include an atmospheric front end 211, a vacuum load lock 212, and a vacuum back end 213. In other aspects, the tool station may have any suitable configuration. The components of each of the front end 211, load lock 212, and back end 213 may be connected to a controller 299 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

Figure 2A:
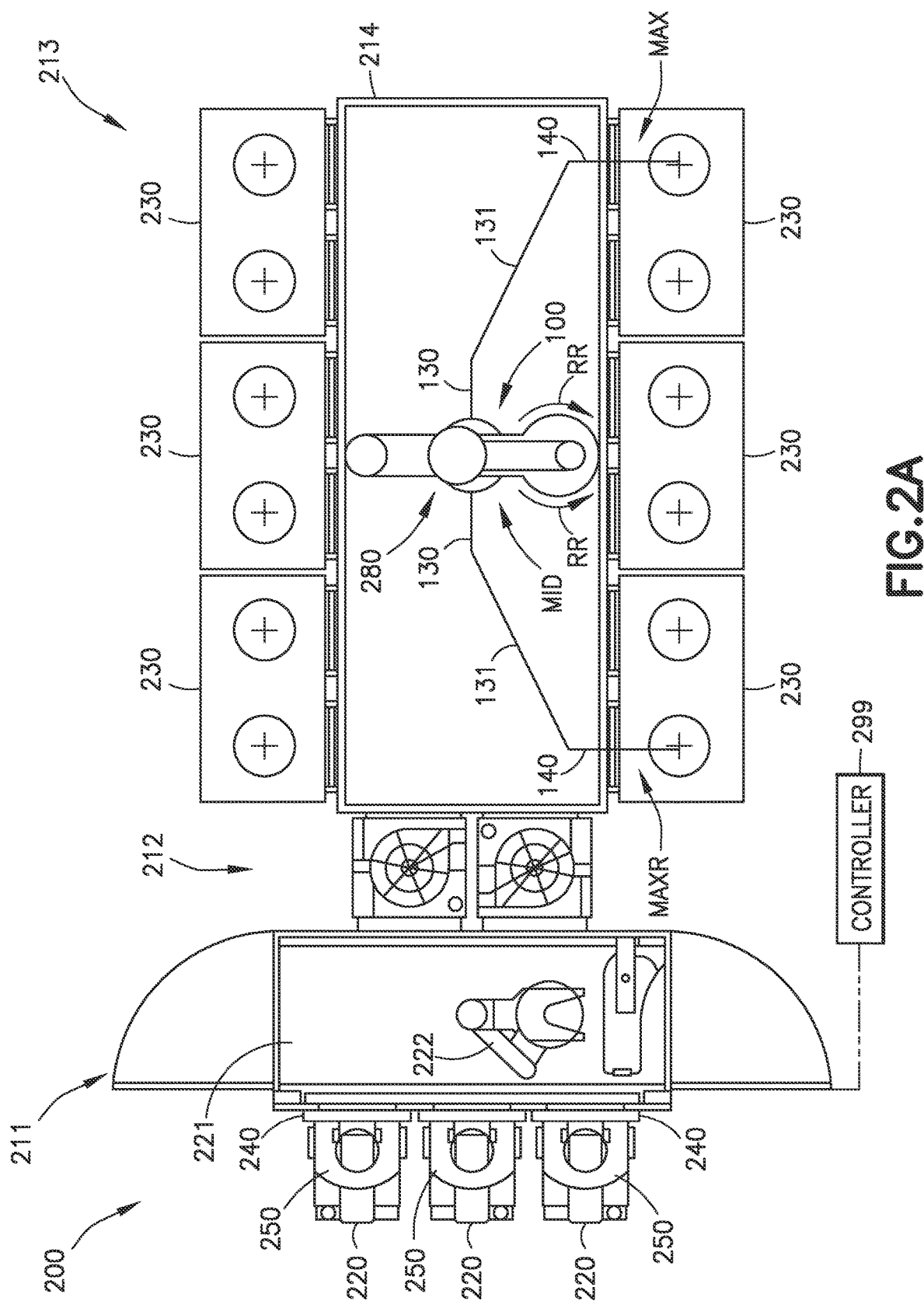
FIGS. 2A-2E illustrate exemplary substrate processing apparatus in accordance with aspects of the disclosed embodiment.

Referring to FIG. 2A, in one aspect, the front end 211 generally includes load port modules 220 and a mini-environment 221 such as for example an equipment front end module (EFEM). The load port modules 220 may be box opener/loader to tool standard (BOLTS) interfaces that conform to SEMI standards E15.1, E47.1, E62, E19.5 or E1.9 for 300 mm load ports, SEMI standards for 450 mm load ports, front opening or bottom opening boxes/pods and cassettes. In other aspects, the load port modules 220 may be configured as 200 mm, 300 mm, and/or 450 mm substrate or wafer interfaces or any other suitable substrate interfaces such as for example larger or smaller substrates or flat panels for flat panel displays. Although three load port modules are shown in FIG. 2A, in other aspects any suitable number of load port modules may be incorporated into the front end 211. The load port modules 220 may be configured to receive substrate carriers or cassettes 250 from an overhead transport system, automatic guided vehicles, person guided vehicles, rail guided vehicles or from any other suitable transport method. The load port modules 220 may interface with the mini-environment 221 through load ports 240. The load ports 240 may allow the passage of substrates between the substrate cassettes 250 and the mini-environment 221. The mini-environment 221 generally includes any suitable atmospheric transfer robot 222 which may incorporate one or more aspects of the disclosed embodiment described herein. In one aspect the robot 222 may be a track mounted robot such as that described in, for example, U.S. Pat. No. 6,002,840, the disclosure of which is incorporated by reference herein in its entirety. The mini-environment 221 may provide a controlled, clean zone for substrate transfer between multiple load port modules.

The vacuum load lock 212 may be located between and connected to the mini-environment 221 and the back end 213. It is noted that the term vacuum as used herein may denote a high vacuum such as 10-5 Torr or below in which the substrates are processed. The load lock 212 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 11010 (or mini-environment 221) may also include an aligner for aligning a fiducial of the substrate to a desired position for processing. In other aspects, the vacuum load lock may be located in any suitable location of the processing apparatus and have any suitable configuration.

The vacuum back end 213 generally includes a transport chamber 214, one or more tandem processing station(s) 230 (e.g., a processing station with at least two substrate holding stations disposed in a common housing) and any suitable vacuum transfer robot 280 which may include one or more aspects of the disclosed embodiment described herein. The transfer robot 280 may be located within the transport chamber 214 to transport substrates between the load lock 212 and the various processing stations 230. The processing stations 230 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 230 are connected to the transport chamber 214 to allow substrates to be passed from the transport chamber 214 to the processing stations 230 and vice versa. In this aspect, the processing stations 230 are each illustrated as having two side-by-side substrate holding stations, however in other aspects, such as illustrated in FIG. 2B, the processing stations 230A may have a single substrate holding station, where the processing stations 230A are arranged side-by-side.

Still referring to FIG. 2A, and as described above, the transport chamber 214 has a longitudinally extended rectangular configuration with three of the processing stations 230 arranged along each lateral side so as to form two rows of opposing processing stations 230 (in other aspects more or less than three processing stations may be disposed on each of the lateral sides). It is noted that substrate transport apparatus 100 is illustrated at least partially within the transport chamber 214 (e.g., a portion of a drive housing 322 may be located outside the sealed atmosphere of the transport chamber 214) of FIG. 2A for exemplary purposes only, noting that the transport chamber 214 may include any one of transport apparatus 100-104. As an example, FIG. 2E illustrates transport chamber 214 with transport apparatus 104 disposed at least partially therein.

Figure 2B:
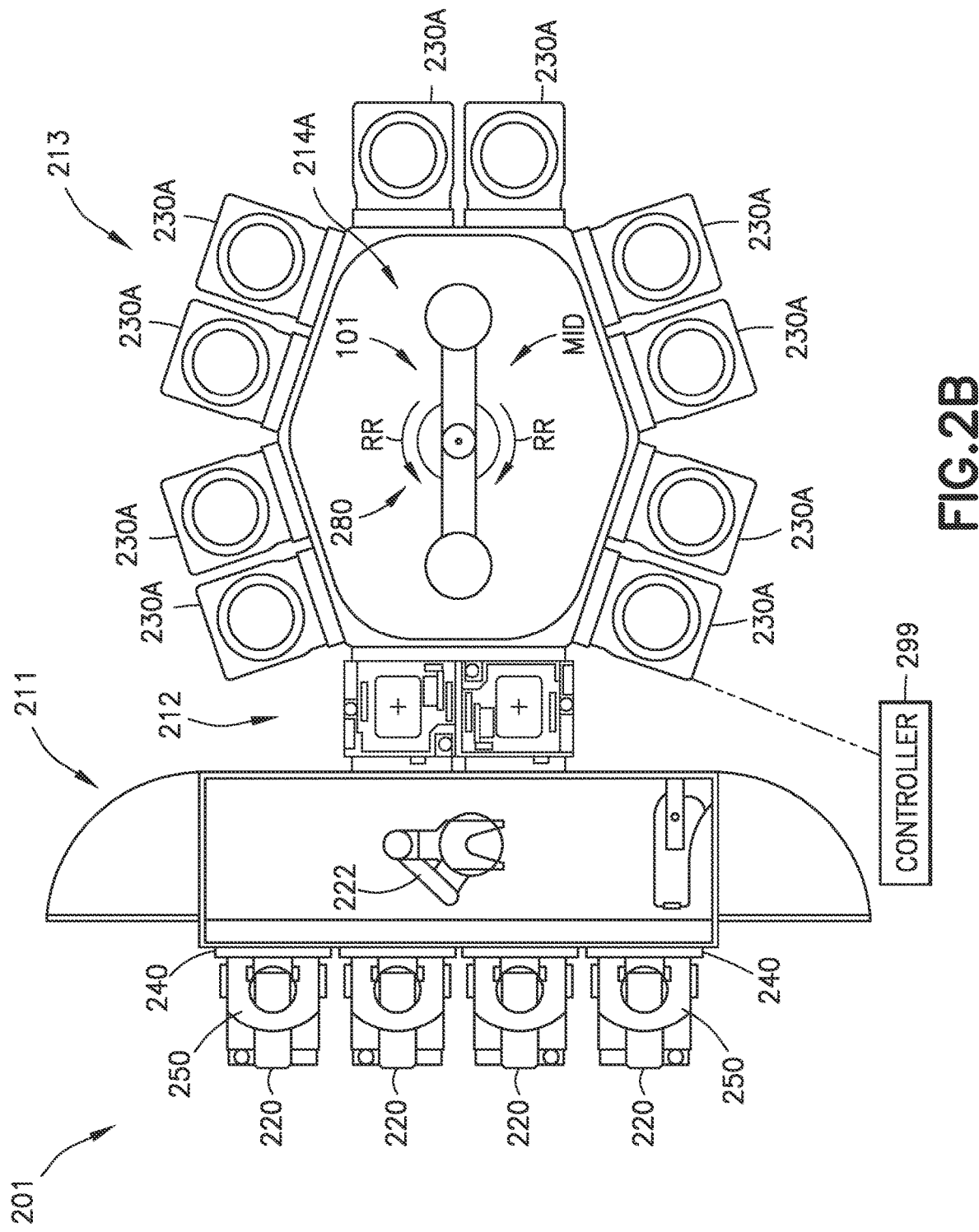

In other aspects, such as illustrated in FIG. 2B, the transport chamber 214A (which is substantially similar to transport chamber 214) has a multi-facetted six-sided configuration where each facet of the transport chamber has two substrate holding stations (inclusive of the load lock 212) coupled thereto. As noted above, and as illustrated in FIG. 2B, the processing stations 230 each have a single substrate holding station therein and are arranged in pairs on the different facets of the transport chamber 214. In other aspects, processing stations 230 (such as shown in FIG. 2A) having two substrate holding stations may be disposed on the different facets of the transport chamber 214 in FIG. 2B. It is noted that substrate transport apparatus 101 is illustrated at least partially within the transport chamber 214A of FIG. 2B for exemplary purposes only, noting that the transport chamber may include any one of transport apparatus 100-104.

Figure 2C:
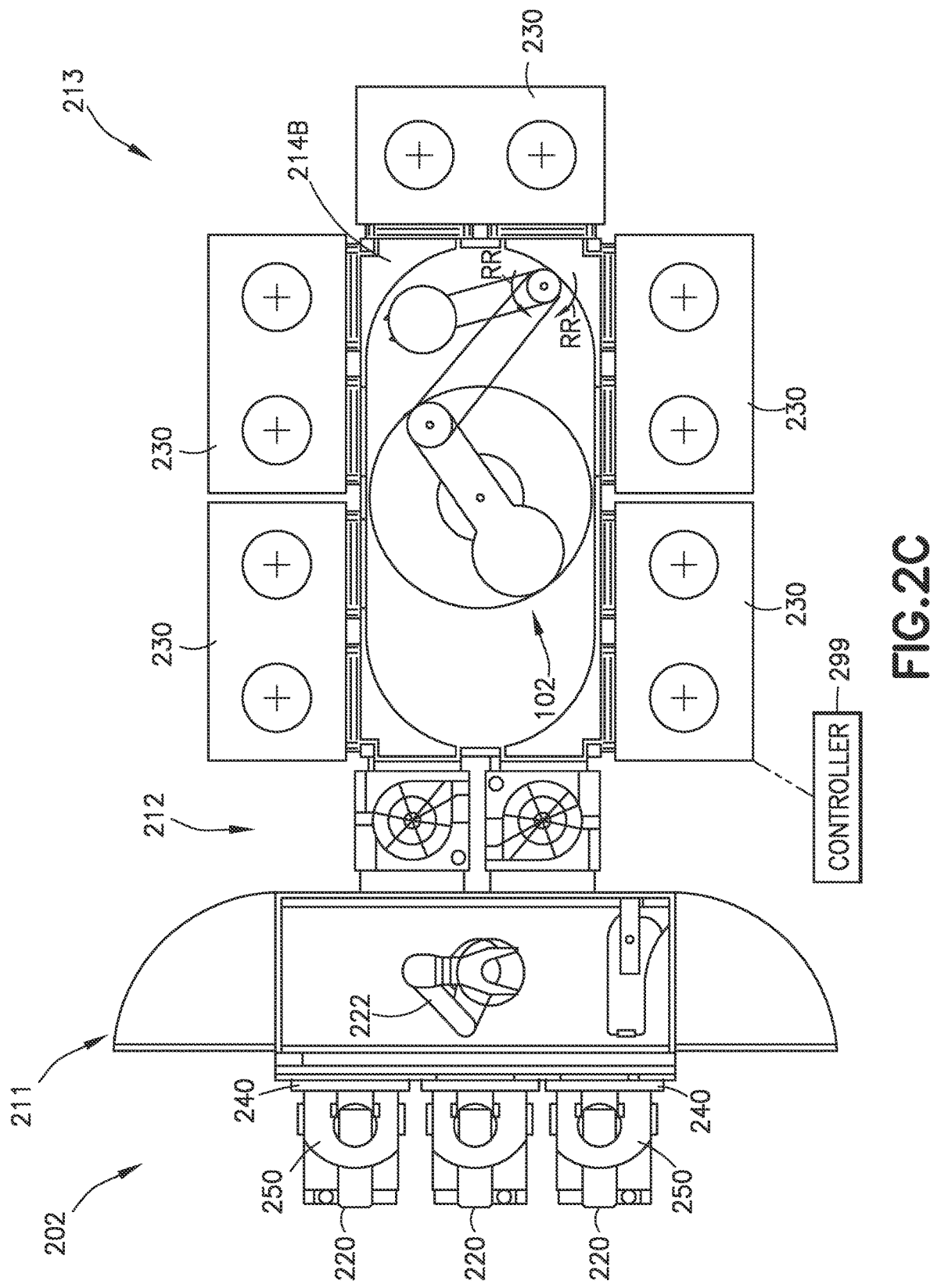

Referring to FIG. 2C a transport chamber 214B similar to transport chamber 214 in FIG. 2A is illustrated. However, transport chamber 214B includes a processing station 230 on longitudinal end of the transport chamber 214B opposite the load lock(s) 212. As may be realized, any one of the tandem single processing stations 230 may be replaced with two of the processing stations 230A of FIG. 2B. It is noted that substrate transport apparatus 102 is illustrated at least partially within the transport chamber 214B of FIG. 2C for exemplary purposes only, noting that the transport chamber 214B may include any one of transport apparatus 100-104.

Figure 2D:
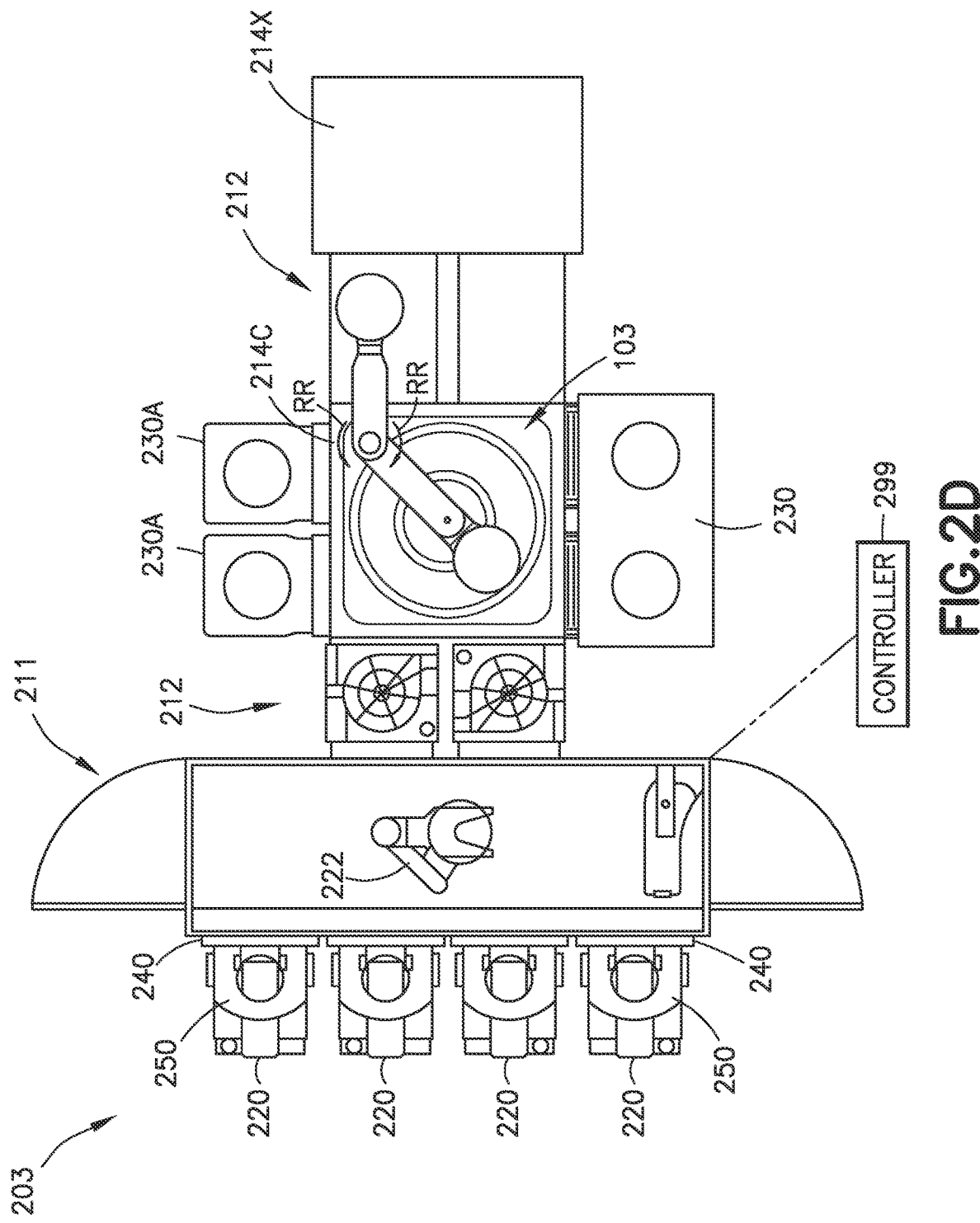
Figure 2E:
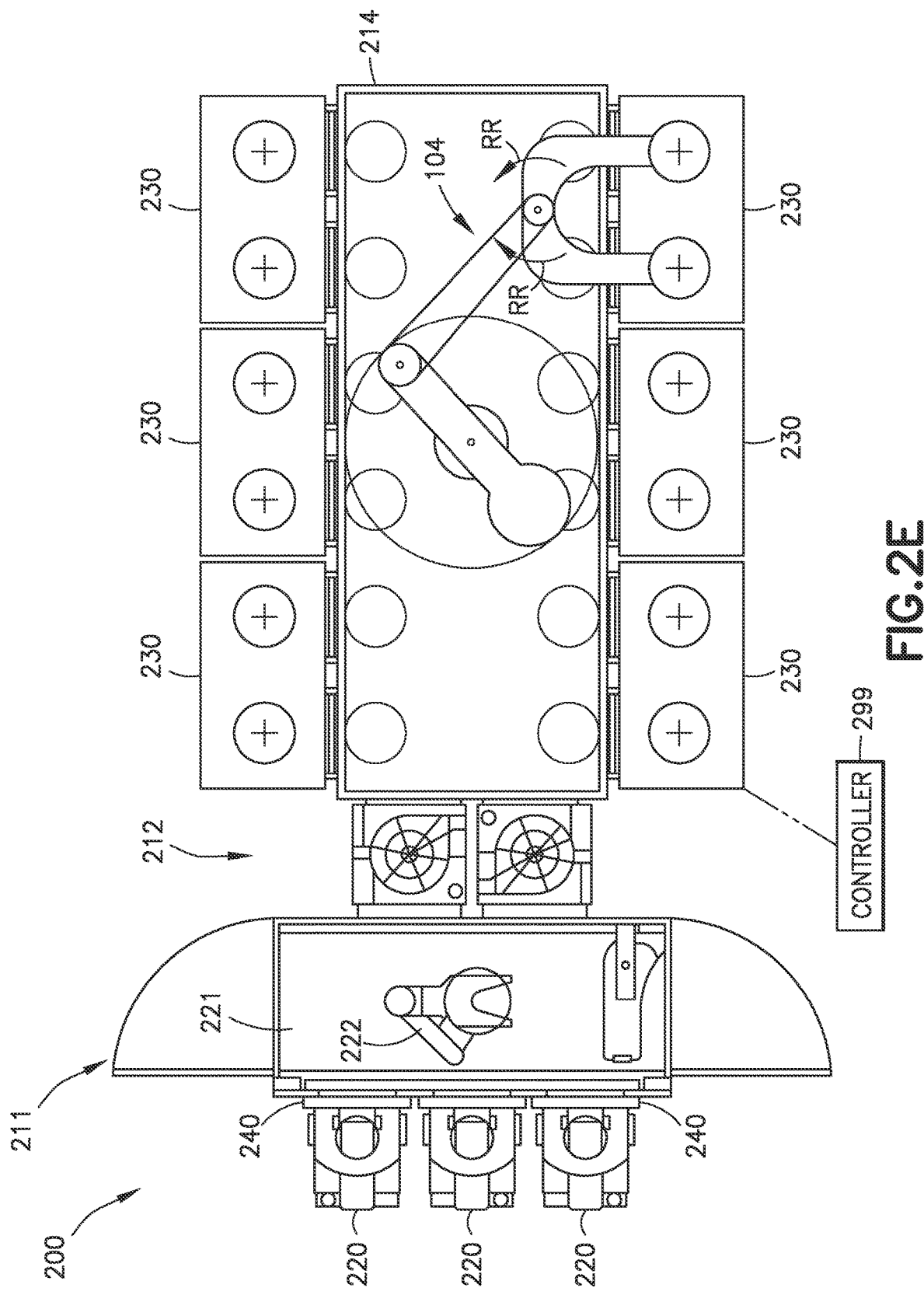

Referring to FIG. 2D a transport chamber 214C substantially similar to transport chamber 214 in FIG. 2A is illustrated, however, transport chamber 214C has a substantially square configuration where two substrate holding stations can be coupled to each of the four sides of the transport chamber 214C. In the example shown in FIG. 2D, both processing stations 230 and processing stations 230A are coupled to respective sides of the transport chamber 214C. Here, rather than coupled processing stations to the side of the transport chamber 214C opposite the load lock(s) 212, other load lock(s) 212A may be coupled to the transport chamber 214C so that the transport chamber 214C is communicably coupled to another transport chamber 214X that may be substantially similar to any one of transport chambers 214, 214A, 214B, 214C. In this manner, the substrate processing tool 203 may be linearly extended to include any suitable number of transport chambers and processing stations. It is noted that substrate transport apparatus 103 is illustrated at least partially within the transport chamber 214C of FIG. 2D for exemplary purposes only, noting that the transport chamber may include any one of transport apparatus 100-104.

Figure 3A:
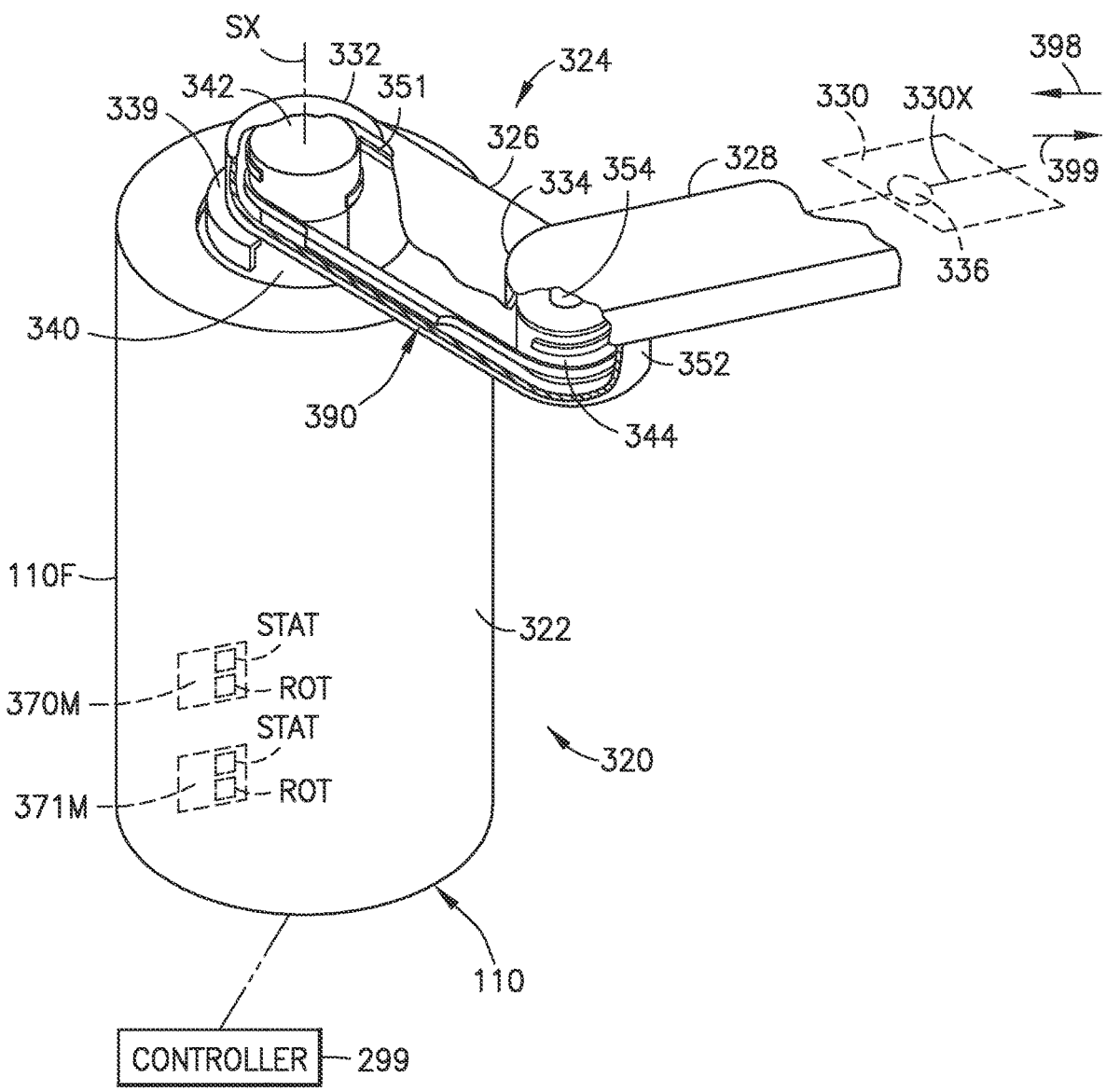
FIG. 3A is a schematic illustration of a portion of the substrate transport apparatus of FIGS. 1A-1E in accordance with aspects of the disclosed embodiment.
Figure 3B:
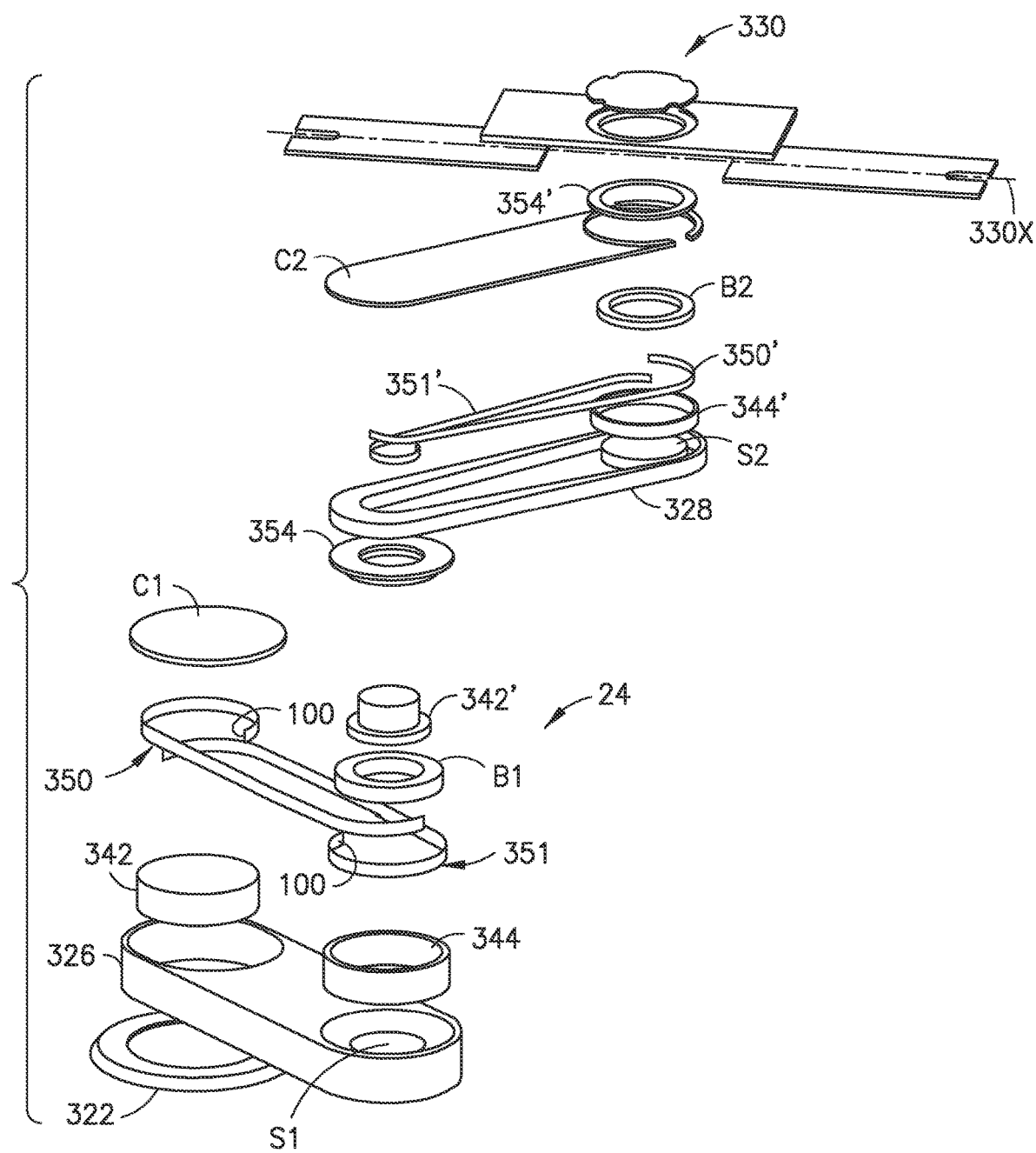
FIG. 3B is a schematic illustration of a portion of the substrate transport apparatus of FIGS. 1A-1E in accordance with aspects of the disclosed embodiment.

Referring to FIGS. 3A and 3B, a substrate transport apparatus 320 is illustrated. The substrate transport apparatus 320 is generally illustrative of each of the substrate transport apparatus 100-104 (and transport apparatus 222) described above. As may be realized, each of the robotic transport apparatus 100-104, 222 described above may include at least one arm link that is driven by at least one torque transmission band. For example, the transport arm 120-124 has a drive band transmission 390 with drive and idler pulleys 342, 344, having a predetermined reduction ratio, and at least one band 350, 351 connecting the drive and idler pulleys 342, 344 that extends and retracts the transport arm 120-124 moving the end effector 140, 140A, 140B, 141, 142 respectively through an end effector stroke of extension 399 or retraction 398. Each of the extension stroke 399 the retraction stroke 389 may be referred to as an arm motion stroke that extends or retracts the transport arm 120-124 and moves the end effector 140, 140A, 140B, 141, 142 through a corresponding end effector stroke (illustrated in, e.g., FIG. 2A). As will be described in greater detail below, the at least one band 350, 351 is wrapped around at least one of the pulleys 342, 344 (to which the at least one band 350, 351 is connected, i.e., a connected pulley(s)) so the at least one band 350, 351 is overwrapped relative to (or on) itself (see, e.g., FIGS. 4B, 4C, 7, 9B, 10B, 13, 16) so the transmission generates rotation RR of the end effector 140, 140A, 140B, 141, 142, relative to the at least one articulated arm link (e.g., the upper arm link 326 or forearm link 328), about the wrist axis WX that is beyond about +/−180° from an end effector midstroke rotation position MID (FIG. 2A) of the end effector to a maximum stroke rotation position MAX (FIG. 2A) of the end effector. In one aspect, the rotation RR of the end effector from the 140, 140A, 140B, 141, 142 between a maximum extension stroke (such as maximum stroke rotation position MAX—FIG. 2A) and a maximum retraction stroke MAXR (FIG. 2A) is at least about +/−300° (and in some aspects more than about +/−360°).

As illustrated in FIGS. 3A and 3B an exemplary torque transmission band configuration for use in the robotic transport apparatus such as those described herein is illustrated in accordance with aspects of the disclosed embodiment with respect to a robotic transport apparatus 320 that is representative of any one of the transport apparatus described herein. As can be seen in FIGS. 3A and 3B, the robotic transport apparatus 320 includes a transport arm 324 mounted to any suitable frame 110F, that in one aspect forms a drive housing 322, while in other aspects the drive housing 322 is coupled to the frame 110F in any suitable manner. In one aspect the transport arm 324 may be a SCARA arm and may include an upper arm 326 having proximate and distal ends, a forearm 328 having proximate and distal ends and at least one substrate support or end effector 330 configured to hold one or more substrates thereon. The proximate end of the upper arm 326 is rotatably connected to the base 322 at a shoulder joint 332. The proximate end of the forearm 328 is rotatably connected to the distal end of the upper arm 326 at an elbow joint 334. The one or more substrate supports 330 may be rotatably connected to the distal end of the forearm 328 at a wrist joint 336. In addition to the SCARA arm illustrated herein, other examples of arm configurations that may be employed with the aspects of the disclosed embodiment include, but are not limited to, the arm configurations described in U.S. patent application Ser. No. 12/117,415 entitled "Substrate Transport Apparatus with Multiple Movable Arms Utilizing a Mechanical Switch Mechanism" filed on May 8, 2008, and in International Patent Application Number PCT/US13/25513 entitled "Substrate Processing Apparatus" and filed on Feb. 11, 2013, as well as the "dual yaw" transfer arm described in U.S. provisional patent application No. 62/942,544 filed on Dec. 2, 2019 and titled "Substrate Processing Apparatus", the disclosures of which are incorporated by reference herein in their entireties, or any other suitable transport arm that uses belts and/or bands for transmitting torque from one pulley to another pulley for operation of the transport arm regardless of whether the belts and/or bands are located within the drive section (e.g. as with side by side motors driving a shaft arrangement) and/or within the arm links. Suitable examples of torque transmission bands to which the aspects of the disclosed embodiment may be applied include those described in U.S. patent application Ser. No. 14/469,260 filed on Aug. 26, 2014 and titled "Substrate Transport Apparatus", U.S. Pat. No. 5,778,730 issued on Jul. 14, 1998 and titled "Robotic Joint Using Metallic Bands", and U.S. Pat. No. 5,682,795 issued on Nov. 4, 1997 and titled "Robotic Joint Using Metal Bands", the disclosures of which are incorporated herein by reference in their entireties.

The drive housing 322 may contain one or more servos or motors 370M, 371M configured to drive a respective drive shaft. The transport drive housing 322 may be employed in any suitable atmospheric or vacuum robotic transport such as those described above. The drive section 110 may include a drive housing 322 having at least one drive shaft 339, 340 at least partially disposed therein. As may be realized the where there are two or more drive shafts the drive shafts may have any suitable arrangement such as a coaxial or side by side arrangement. Although two drive shafts 339, 340 are illustrated in FIG. 3A in other aspects the drive section 110 may include any suitable number of drive shafts. The drive shafts 339, 340 may be mechanically supported or magnetically suspended (e.g. substantially without contact) within the drive housing 322 in any suitable manner such as that described in U.S. Pat. No. 8,283,813 entitled "Robot Drive with Magnetic Spindle Bearings" issued on Oct. 9, 2012 and U.S. Pat. No. 8,008,884 entitled "Substrate Processing Apparatus with Motors Integral to Chamber Walls" issued on Aug. 30, 2011, the disclosures of which are incorporated by reference herein in their entireties. Each drive shaft 339, 340 of the drive section 110 may be driven by a respective motor 370M, 371M where each motor includes a stator STAT and a rotor ROT. It is noted that the drive motors described herein may be permanent magnet motors, variable reluctance motors (having at least one salient pole with corresponding coil units and at least one respective rotor having at least one salient pole of magnetic permeable material), or any other suitable drive motors. The stator(s) may be fixed at least partly within the drive housing 322 and the rotor(s) may be fixed in any suitable manner to a respective drive shaft 339, 340. In one aspect, the stator(s) STAT may be located in an "external" or "non-sealed" environment that is sealed from an atmosphere in which the transport arm(s) 324 operate (the atmosphere in which the transport arm(s) operate is referred to herein as a "sealed" environment which may be a vacuum or any other suitable environment) through the employment of any suitable isolation wall or barrier while the rotor(s) ROT is located within the sealed environment. It is noted that the term "isolation wall" as used herein may refer to a wall made of any suitable non-ferromagnetic material that may be disposed between the moving parts of the robot drive and/or sensors (associated with the drive) and the corresponding stationary parts of the robot drive and/or sensors. Here the first drive shaft 339 may be drivingly connected to one of the motors 370M, 371M for driving rotation of the upper arm 326 about the shoulder joint 332. The second drive shaft 340 (which in this aspect is concentric with the first drive shaft) may be drivingly connected to another one of the motors 370M, 371M for driving rotation of the forearm 328 about the elbow joint 334. It is noted that the motors 370M, 371M for driving each of the arm links (e.g. upper arm, forearm and/or end effector) may be connected in any suitable manner to any suitable controller, such as controller 11091 for controlling the substrate picking and substrate placing operations of the robotic transport apparatus 320.

As can be seen in FIGS. 3A and 3B, a first pulley 342 is connected to drive shaft 340 at, for example, the shoulder joint 332, so that as the drive shaft 340 rotates the first pulley 342 rotates with the drive shaft 340. A second pulley 344 may be rotatably mounted to, for example, shaft S1 (e.g. using any suitable bearings B1) at the elbow joint 334 and connected to the forearm 328 in any suitable manner, such as by shaft 354 (which may be fixed to the upper arm 326), so that as the second pulley 344 rotates the forearm 328 rotates with the second pulley 344. As may be realized, the first pulley and the second pulley may have any suitable diameters (e.g. drive ratio) relative to each other such that in one aspect the pulleys may have the same diameter or different diameters (e.g. the drive pulley may be smaller than the driven pulley or vice versa). As may also be realized, the first and second pulleys 342, 344 may respectively be drive and driven pulleys. The second pulley 342 may be coupled to the first pulley 342 in any suitable manner, such as by one or more torque transmission bands 350 (two torque transmission bands 350, 351 are illustrated in FIGS. 3A and 3B). The torque transmission bands may be constructed of any suitable material capable of transmitting torque from the first pulley 342 to the second pulley 344. In one aspect the torque transmission bands may be metallic bands constructed of any suitable metal.

As described above, the torque transmission bands 350, 351 form a dual opposing bands where at least one end of each torque transmission band is overwrapped relative to itself to, for example, effect greater joint angle rotation when compared to conventional transport arms such as those described above. FIG. 4A-4C illustrate an exemplary band and pulley configuration with respect to the drive or first pulley 342 and the driven or second pulley 344 of FIG. 3A however, it is noted that band and pulley arrangement of illustrated in FIGS. 4A-4C may be representative of any band and pulley arrangement of the transport apparatus described herein. As can be seen in FIG. 4A, each of the pulleys 442, 444 have a substantially circular configuration however, in other aspects, as will be described in greater detail below, the pulleys may have a cammed circumferential profile. As may also be realized, the pulleys 442, 444 are illustrated as having substantially a 1:1 drive ratio however, in other aspects any suitable drive ratio may be provided as noted herein. Each pulley 442, 444 may comprise a pulley pair and include a top pulley portion 442T, 444T and a bottom pulley portion 442B, 444B. In some aspects, the top pulley portion 442T, 444T is separate and distinct from a respective bottom pulley portion 442B, 444B where the top pulley portion 442T is stacked above bottom pulley portion 442B to form pulley 442, and the top pulley portion 444T is stacked above bottom pulley portion 444B to form pulley 444. Having separate and distinct top and bottom pulley portions may ease the winding of the opposing bands around a respective pulley portion compared to winding both of the respective opposing bands around a single monolithic pulley. As may be realized, the stacked top pulley portion 442T, 444T and respective bottom pulley portion 442B, 444B may be coupled to each other so that both the top pulley portion 442T, 444T and the respective bottom pulley portion 442B, 444B rotate as a unit with each other and act a singular monolithic pulley about a respective axis of rotation. The stacked top pulley portion 442T, 444T and respective bottom pulley portion 442B, 444B may also decrease manufacturing costs, such as with non-circular pulleys, compared to, for example, manufacturing costs of a dual level single monolithic pulley having substantially opposite cam profiles on each level of the pulley.

Still referring to FIGS. 4A-4C, the torque transmission bands 350, 351 may not form continuous circular belt around the pulleys 342, 344. Rather, one end of the torque transmission band 350 may be at least partially wrapped around (e.g. in a clockwise direction) and affixed to the first pulley 342 while the other end of the torque transmission band 350 may be at least partially wrapped round (e.g. in a counter-clockwise direction) and affixed to the second pulley 344. The ends of the torque transmission band 350 may be affixed to a respective pulley 342, 344 in any suitable manner such as with pins or any other suitable removable or non-removable chemical or mechanical fastener as will be described in greater detail herein. The second torque transmission band 351, substantially similar to torque transmission band 350, may be affixed at its ends to the pulleys 342, 342 in a manner substantially similar to that described above with respect to torque transmission band 350, however the direction in which the torque transmission band 351 is wrapped around the pulleys 342, 344 may be reversed (e.g. one end of the torque transmission band 351 is wrapped in a counter-clockwise direction around pulley 342 and the other end of the torque transmission band 351 is wrapped around the pulley 344 in a clockwise direction). This dual torque transmission band configuration places both torque transmission bands 350, 351 in constant tension so that neither torque transmission band goes slack.

As noted above, at least one end of each torque transmission band 350, 351 is overwrapped relative to itself so the transmission generates rotation of the end effector (or other articulated arm link driven in rotation by the band/pulley transmission), relative to another articulated arm link, about the respective joint pivot axis that is more than about 180° from an end effector (or other articulated arm link) mid-stroke rotation position MID (FIG. 2A) of the end effector (or other articulated arm link) to a maximum stroke rotation position MAX (FIG. 2A) of the end effector (or other articulated arm link). The band, such as band 351 being overwrapped on a pulley, such as pulley 342, is illustrated in FIGS. 4B and 4C with the band pitch exaggerated for clarity of the overwrapping. As can be seen in FIGS. 4B and 4C, in some aspects of the disclosed embodiment the at least one band 350, 351 is overwrapped so that the band wrap spirals over itself on the respective pulley. To facilitate the overwrapping of the band 351 (or any other band described herein) to a respective pulley, the coupling between the band 351 and the pulley 342 may be moved from an exterior peripheral band seating surface PSS (FIG. 4C) of the pulley 342 to an interior of pulley where, as can be seen in FIG. 4C and end 351E of the band 351 enters the interior of the pulley 342 through a band passage BP (as will be described in greater detail herein).

Referring again to FIGS. 3A and 3B, as may be realized the substrate support 330 may be slaved, e.g. using any suitable transmission such as the torque transmission band and pulley transmissions described herein, so that a longitudinal axis 330X of the substrate support 330 remains aligned with an axis of extension and retraction of the robotic arm 324. For example, referring to FIG. 3B a first pulley 342' may be fixed to the shaft S1 and extend at least partially into the forearm 328. A second pulley 344' may be rotatably mounted at the wrist joint 336 such as on shaft S2 (which may be fixed to the forearm 328) using any suitable bearings B2. The second pulley 344' may be connected to the end effector 330 in any suitable manner, such as with shaft 354' so that as the second pulley 344' rotates the end effector 330 rotates with the second pulley 344'. Torque transmission bands 350', 351', substantially similar to torque transmission bands 350, 351, may couple the first pulley 342' to the second pulley 344' such that relative movement between the forearm 328 and upper arm 326 causes rotation of the second pulley 344' which in turn rotates the end effector 330 relative to the upper arm and forearm so that the longitudinal axis 330X of the end effector remains aligned with the axis of extension and retraction. In other aspects a third motor and drive shaft may be added to the robotic transport 320 for driving the rotation of the substrate support 330 about the wrist joint 336 in a manner substantially similar to that described herein with respect to the forearm.

As may be realized, referring again to FIG. 3A, while the substrate holder 330 is illustrated as a double sided end effector (e.g. an end effector capable of holding one or more substrates on opposite sides of the end effector axis of rotation or wrist joint), in other aspects the substrate holders of the transport arms described herein may have any suitable configuration such as, for example, a single sided end effector, a batch end effector (e.g. capable of holding more than one substrate in a stack or side by side) or a combination thereof. As may also be realized, the upper arm 326 and forearm 328 links of the transport arm 324 may have any suitable covers C1, C2 for sealing or otherwise isolating the interior of the arm links from the environment in which the transport arm operates so that any particles generated by the bands and pulleys may not be transferred outside the arm links.

Figure 3C:
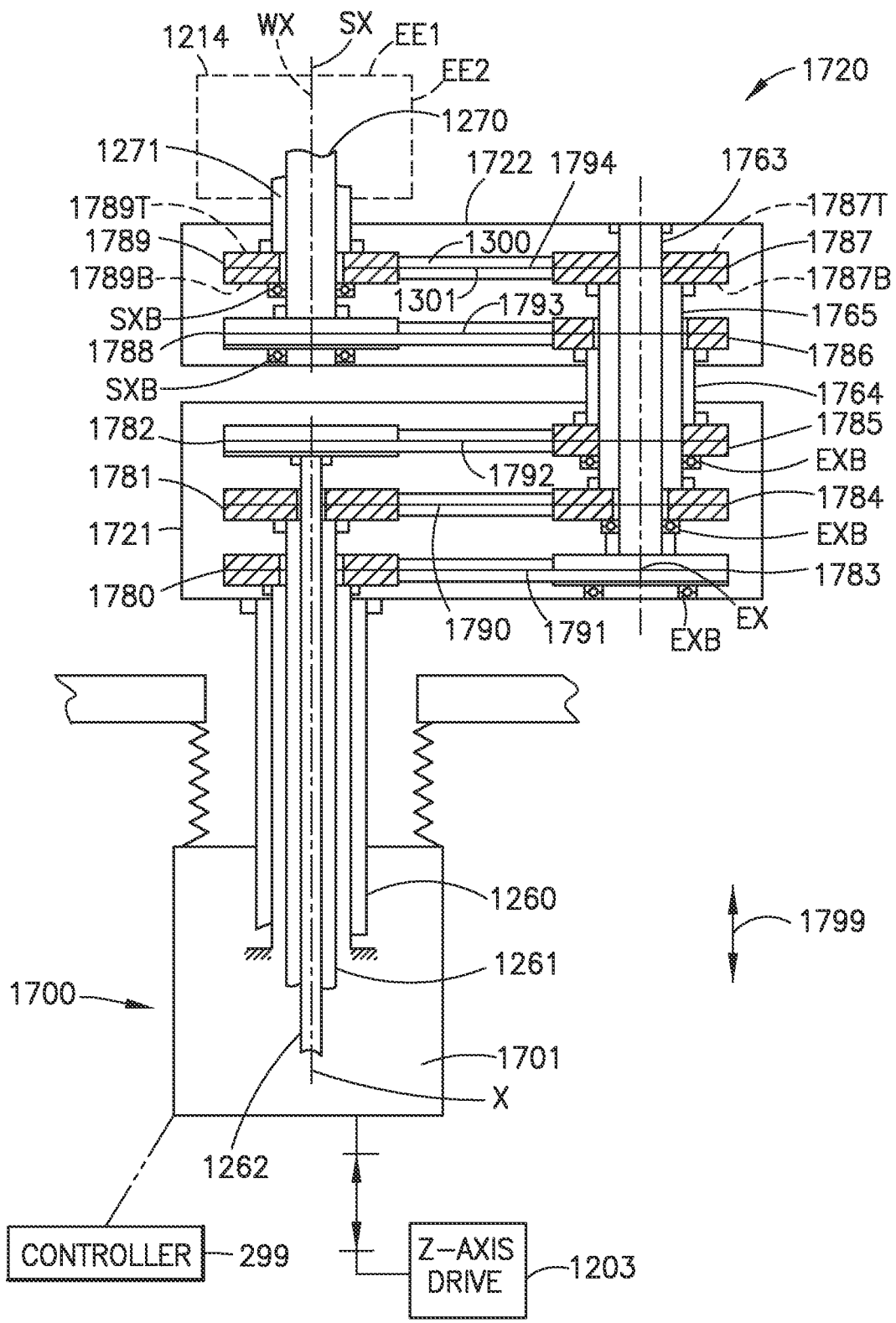
FIG. 3C is a schematic illustration of a portion of the substrate transport apparatus of FIGS. 1A-1E in accordance with aspects of the disclosed embodiment.

Referring now to FIG. 3C, as may be realized any suitable arm link of the robotic transport apparatus described herein may be slaved and driven by a torque transmission band such as those described herein. For example, a robotic transport apparatus illustrated in FIG. 3C, which again may be illustrative of and represent any one of the transport apparatus described herein) includes an arm 1720 having a first or upper arm link 1721 and a second or forearm link 1722 rotatably mounted to the first arm link 1721. The arm links may be driven by any suitable drive section 1700, which may be substantially similar to drive section 110 described above. In this aspect the drive section 1700 includes a coaxial drive shaft arrangement having an inner drive shaft 1262, a middle drive shaft 1261 and an outer drive shaft 1260 each driven by respective drive motors (not shown but each motor may be substantially similar to that described above with respect to FIGS. 3A and 3B). The outer drive shaft 1260 may be coupled to the first arm link 1721 about a drive axis of rotation X (which may be coaxial with the shoulder axis SX) so that as the outer drive shaft 1260 rotates the first arm link 1721 rotates with it. The second arm link 1722 may be slaved to, for example, a housing 1701 of the drive section 1700 (or any other suitable location) so that a shoulder axis SX of the second arm link 1722 is constrained to travel along a substantially linear path as the base arm 1720 is extended and retracted (e.g. a single drive motor causes the extension and retraction of the arm 1720). For example, a first pulley 1780 may be mounted substantially concentrically with the drive axis of rotation X and grounded to, for example, the housing 1701 of the drive section 1700 (or any other suitable portion of the transport apparatus) in any suitable manner so that the first pulley 1780 is rotationally stationary relative to the first arm link 1721. In other aspects the first pulley 1780 may be rotationally fixed in any suitable manner. A slaved or second pulley 1783 may be rotatably mounted at an elbow axis EX of the arm 1720 in any suitable manner such as by any suitable bearings EXB. The second pulley 1783 may be coupled to the second arm link 1722 by, for example, shaft 1763 so that as the second pulley 1783 rotates the second arm link 1722 rotates with it. The pulleys 1780, 1783 may be coupled to each other in any suitable manner such as by a torque transmission band 1791 such as described herein. In one aspect the pulleys 1780, 1783 may be coupled to each other with at least two torque transmission bands terminated on either ends of the pulleys and then tensioned against each other to substantially eliminate slack and backlash as described above. In other aspects any suitable transmission member may be used to couple the pulleys 780, 783.

In this aspect a coaxial spindle (drive shaft arrangement) having outer shaft 1271 and inner shaft 1270 may be located at the shoulder axis SX of the second arm link 1722. The outer shaft 1271 may be driven by, for example, the middle drive shaft 1261 in any suitable manner. For example, a pulley 1781 may be coupled to the middle drive shaft 1261 so that as the drive shaft 1261 rotates the pulley 1781 rotates with it. An idler pulley 1784 may be disposed within the first arm link 1721 for rotation about elbow axis EX. The idler pulley 1784 may be coupled to shaft 1765 so that as the idler pulley 1784 rotates the shaft 1765 rotates with it. The shaft 1765 and pulley 1784 may be supported in any suitable manner such as with any suitable bearings EXB. The idler pulley 1784 may be coupled to pulley 1781 in any suitable manner such as through any suitable transmission 1790 substantially similar to those described herein. A second idler pulley 1787 may also be coupled to the shaft 1765 within the second arm link 1722 so that the pulleys 1784 and 1787 rotate in unison. A shoulder pulley 1789 may be coupled to the shaft 1271 so that the shaft 1271 and shoulder pulley 1789 rotate in unison. The second idler pulley 1787 may be coupled to the shoulder pulley 1789 in any suitable manner, such as through any suitable transmission 1794 substantially similar to those described herein (e.g., where the idler pulley 1787 may be referred to as a drive pulley with respect to shoulder pulley 1789, and the shoulder pulley 1789 may be referred to as an idler pulley with respect to pulley 1787). In one aspect, the at least one band of the transmission 1794 is overwrapped relative to itself around the pulley 1789.

The inner shaft 1270 of the coaxial spindle may be driven by, for example, the inner drive shaft 1262 in any suitable manner. For example, a pulley 1782 may be coupled to the inner drive shaft 1262 so that as the drive shaft 1262 rotates the pulley 1782 rotates with it. An idler pulley 1785 may be disposed within the first arm link 1721 for rotation about elbow axis EX. The idler pulley 1785 may be coupled to shaft 1764 so that as the idler pulley 1785 rotates the shaft 1764 rotates with it. The shaft 1764 and pulley 1785 may be supported in any suitable manner such as with any suitable bearings EXB. The idler pulley 1785 may be coupled to pulley 1782 in any suitable manner such as through any suitable transmission 1792 substantially similar to those described herein. A second idler pulley 1786 may also be coupled to the shaft 1764 within the second arm link 1722 so that the pulleys 1785 and 1786 rotate in unison. A shoulder pulley 1788 may be coupled to the inner shaft 1270 so that the shaft 1270 and shoulder pulley 1788 rotate in unison. The second idler pulley 1786 may be coupled to the shoulder pulley 1788 in any suitable manner, such as through any suitable transmission 1793 substantially similar to those described herein (e.g., where the idler pulley 1786 may be referred to as a drive pulley with respect to shoulder pulley 1788, and the shoulder pulley 1788 may be referred to as an idler pulley with respect to pulley 1786). In one aspect, the at least one band of the transmission 1793 is overwrapped relative to itself around the pulley 1788.

It is noted that one or more of the pulleys 1780-1789 may be substantially similar to those described herein. For example, in some aspects one or more of the pulleys 1780-1789 may have a circular shape or a non-circular shape. In some aspects one or more of the pulleys 1780-1789 may have a top pulley portion and a bottom pulley portion that are coupled together to form a stacked or paired pulley. As may be realized the bands of the transmissions 1790-1794 may be wrapped around one or more of the respective coupled pulleys so as to be overwrapped relative to itself in the manner described herein.

As may be realized, in one aspect, any suitable end effectors(s) EE1, EE2 (such as those described herein) may be mounted to the shafts 1270, 1270 in any suitable manner so that pulley 1788, 1789 rotation rotates the end effector(s) EE1, EE2 about the joint pivot axis (e.g., wrist axis WX). Here, each of the end effectors is separately connected to a respective pulley 1788, 1789 for independent rotation about the joint pivot axis (e.g., the wrist axis WX) with respect to each other.

Figure 3D:
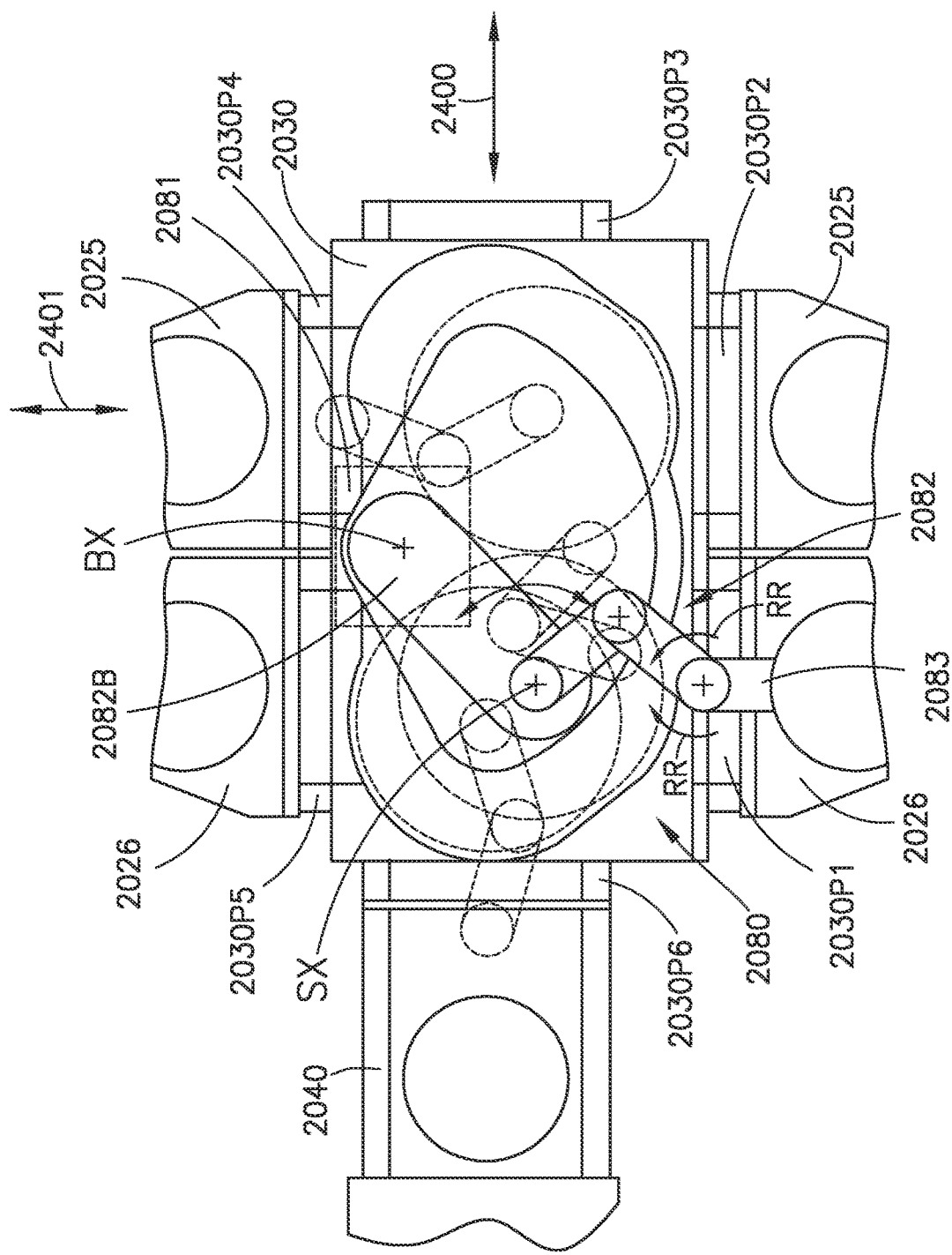
FIG. 3D is a schematic illustration of a portion of a substrate processing apparatus in accordance with aspects of the disclosed embodiment.

In another aspect any suitable transfer arm 1214 (such as those described herein, e.g. having any suitable number of arm links and end effectors) may be mounted to the shafts 1270, 1270 such that the arm 1720 is configured as a "boom" or "base" type arm for transporting the transfer arm 1214 through, for example, an elongated transport chamber as described in International Patent Application Number PCT/US13/25513 entitled "Substrate Processing Apparatus" and filed on Feb. 11, 2013 the disclosure of which was previously incorporated herein by reference in its entirety. For example, referring to FIG. 3D an automation or transfer module 2030 is illustrated in accordance with an aspect of the disclosed embodiment where substrates are transferred between processing tool modules 2025, 2026, 2040 through the automation module 2030 with a single touching of the substrate. The process tool modules may be coupled to the automation module 2030 in any suitable manner (e.g. side by side, stacked one above the other and/or any other suitable arrangement) such as through ports 2030P1-2030P6 of the automation module 2030. The automation module 2030 includes transfer robot 2080. In one aspect the transfer robot 2080 may include a drive section 2081 which may be substantially similar to those described above. A boom or base arm 2082B may be rotatably mounted to the drive section 2081 and one or more multilink arms 2082 having one or more respective substrate holders 2083 may be rotatably mounted to the base arm 2082B at a shoulder axis SX. The drive section 2081 may be configured to rotate the arm(s) 2082 and end effector(s) 2083 about the shoulder axis SX as a unit so that the arm(s) 2082 can transfer substrates in the direction of arrow 2400 (e.g. along an a longitudinal axis of the automation module 2030 and/or vacuum tunnel) as well as in the direction of arrow 2401 for transferring substrates to both lateral sides of the automation module 2030. As may be realized, the base arm 2082B can be rotated about axis BX for transporting the one or more multilink arms 2082 and their end effectors in the direction 2400 along a length of the automation module 2030.

Referring again to FIG. 3C, any one or more of the transport apparatus described herein may include any suitable Z axis drive 1203. The Z axis drive 1203 may be configured to move the transfer arm in a direction 1799 substantially perpendicular to an axis of extension/retraction of the transport arm.

Referring again to FIGS. 4A-4C, the aspects of the disclosed embodiment provide for each band to wrap around at least one of the pulleys, to which the band is connected, more than one turn. An example of band 351 wrapped around pulley 342 more than one turn so that the band 351 is overwrapped relative to itself is illustrated schematically in FIGS. 4B and 4C, noting that the other bands described herein may wrap around a respective pulley in a substantially similar manner to that described with respect to FIGS. 4A-4C. As also noted above, while the pulleys 342, 344 (inclusive of the top and bottom portions 342T, 342B, 344T, 344B when the pulley is a two piece pulley) are illustrated as having a substantially circular configuration, in other aspects, the pulleys may have a cammed circumferential profile (e.g., a variable diameter forming a non-circular pulley) that is based on a rotation angle of the pulley such that the motion output (e.g., release/unwrapping of the band from around the pulley) and motion input (e.g., intake/wrapping of the band around the pulley) is smooth (e.g., so as to substantially minimize induced vibrations caused by band movement over stepped pulley surfaces that may be formed by band wrap around the pulley). In one aspect the cammed circumferential profile of the pulleys may form a compensator (as will be described in greater detail herein) that maintains a steady state or substantially constant tension in the opposing bands and a steady state or substantially constant drive ratio (e.g., with about less than 1% variability) between the pulleys. Where one or more of the pulleys, such as for example pulleys 342, 344 (inclusive of the top and bottom portions 342T, 342B, 344T, 344B when the pulley is a two piece pulley), is a non-circular pulley, the drive ratio between the pulleys 342, 344 may be a variable drive ratio. If desired, any variability in the drive ratio may be resolved by the controller 299 where the variable drive ratio may be modeled and compensated for (e.g. resolved) by the controller 299 (e.g., the controller forms or otherwise includes a drive ratio resolver). For example, non-circular pulleys or sprockets are described in U.S. Pat. No. 4,865,577 issued on Sep. 12, 1989 titled "Noncircular Drive", the disclosure or which is incorporated by reference herein in its entirety. Those skilled in the art of robotic handling equipment would understand how to model the variable drive ratio and generate corresponding motion control of the transport arms described herein, based on U.S. Pat. No. 4,865,577 and what is known in by those skilled in the art with respect to robot motion controls, such that further discussion of the modelling and motion control generation is omitted from this description. As may be realized any of the pulleys described herein that are coupled to a common band may have a variable drive ration as described herein, while in other aspects any of the pulleys that are coupled to a common band may have a substantially constant drive ratio.

Referring also to FIG. 4D, in some aspects, the exterior peripheral band seating surface PSS of the pulley (such as pulley 342) and the band (such as band 351) may be curved (e.g., a concave curvature is illustrated in FIG. 4D however, in other aspects the curvature may be convex). This curvature in the exterior peripheral band seating surface PSS and the band may facilitate self-tracking/alignment of the band relative to the pulley so as to substantially prevent axial slippage of the band in the axial direction 477 of the pulley.

Referring to FIGS. 4A, 4C, 5A, 5B, 6, and 7 one exemplary coupling of a band to a pulley will be described in accordance with an aspect of the disclosed embodiment. It is noted that connection between band 351 and top pulley portion 342T will be described for exemplary purposes only and that the connection described herein may be employed with any of the pulleys/pulley portions and bands described herein. In some aspects, such as where the pulleys are non-circular, it is also noted that each bottom pulley portion may be substantially similar to but opposite in hand to the respective top pulley portion as will be described herein to account for a change in a length of the opposing band wraps around the pulleys. As can be seen in FIGS. 4A, 4C, 5A, and 7, the top pulley portion 342T includes band passage BP that extends from exterior peripheral band seating surface PSS to an aperture 510 on an interior (e.g., located within the peripheral circumferential bounds) of the top pulley portion 342T. The band passage BP is formed in the top pulley portion 342T so as to have an interior wall BPW1 (e.g., a side of the band passage BP closest to a center of the pulley) and an exterior wall BPW2 (e.g., a side of the band passage BP closest to the exterior peripheral band seating surface PSS). The band passage BP opens up to the exterior peripheral band seating surface PSS so that the interior wall BPW1 is substantially tangential to the exterior peripheral band seating surface PSS so as to provide a smooth transition of the band 351 from the exterior peripheral band seating surface PSS into the band passage BP. The band passage BP is extends to the aperture 510 along an arcuate path where the distance between the band passage BP and the exterior peripheral band seating surface PSS increases along the arcuate path towards the aperture 510.

Figure 5A:
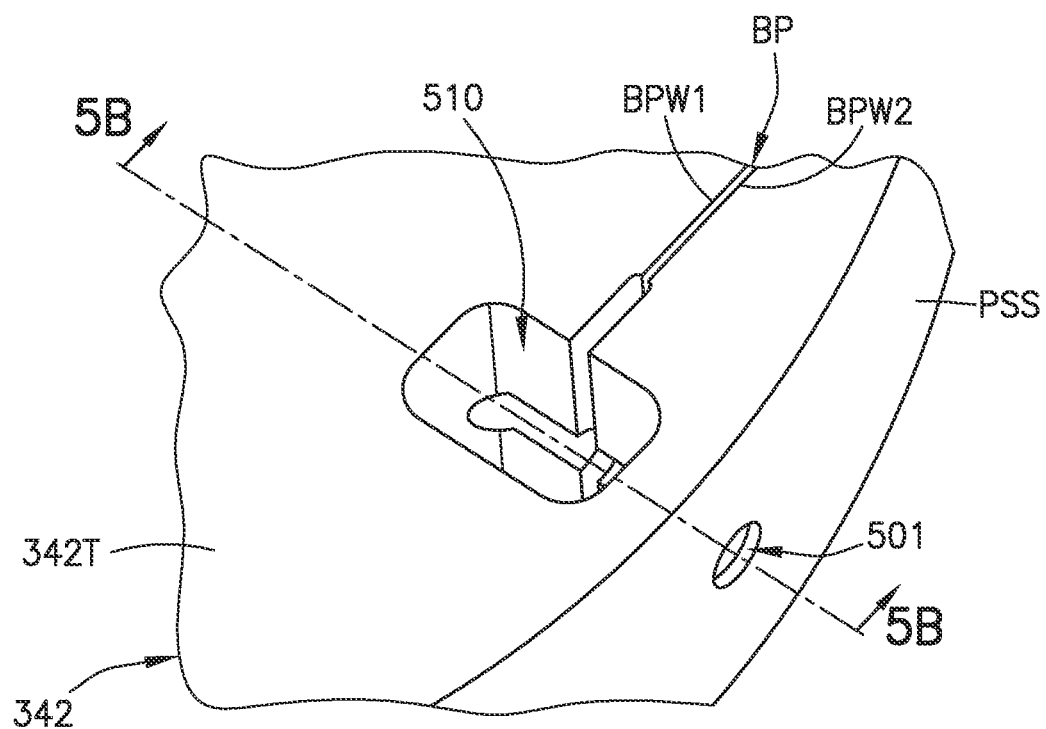
FIG. 5A illustrate a portion of an exemplary transmission of the substrate transport apparatus of FIGS. 1A-1E in accordance with aspects of the disclosed embodiment.
Figure 5B:
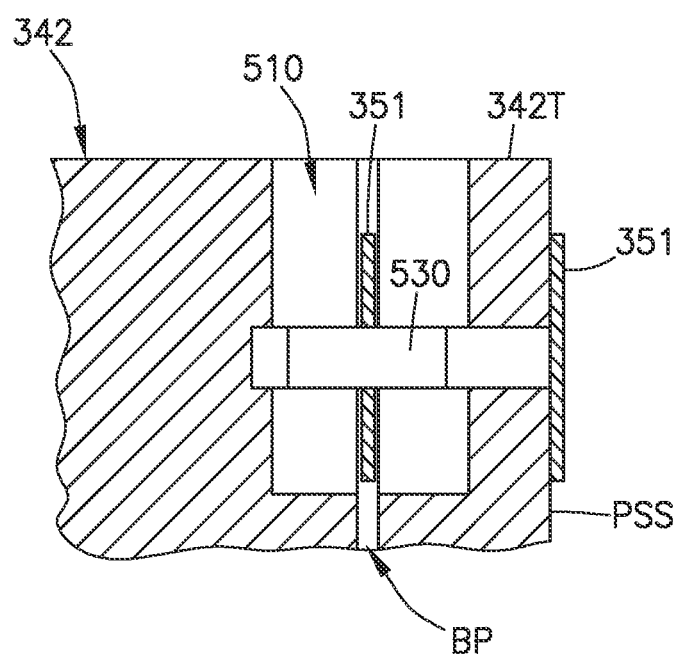
FIG. 5B illustrates a sectional view of the portion of the exemplary transmission of FIG. 5A in accordance with aspects of the disclosed embodiment.
Figure 6:
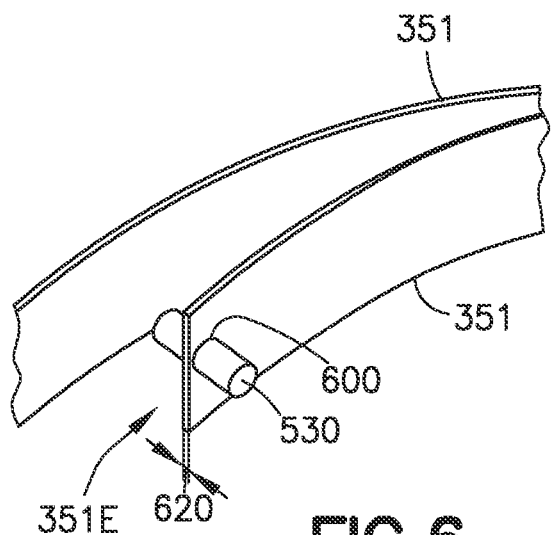
FIG. 6 illustrates a portion of an exemplary transmission of the substrate transport apparatus of FIGS. 1A-1E in accordance with aspects of the disclosed embodiment.

As can be seen in FIG. 5A, the band passage BP opens up into the aperture 510 so that the end 351E1 of the band 351 extends at least partially into the aperture 510. The end 351E of the band 351 includes a retainer aperture 600. The pulley 542 includes a cross-aperture 501, configured to receive a retainer member 530 (FIGS. 5B, 6 and 7), that extends in a direction transverse to and crosses at least a portion of one or more of the band passage BP and the aperture 510 so as to extend through the retainer aperture 600 of the band 351 (see FIGS. 5B, 6, and 7. When the band end 351E is at least partially inserted into the aperture 510 and the retainer member 530 extends through both the cross-aperture 501 and the retainer aperture 600, the band 351 is substantially prevented from being pulled from the band passage as the retainer member 530 anchors the end 351E of the band 351 to the top pulley portion 342T. The retainer member 530 may be held in place at least by tension forces exerted on the retainer member 530 by the band 351, such as when the band 351 is tensioned against opposing band 350 as described herein. The retainer member 530 may be any suitable retainer such as a pin, clip, bolt, etc.

Figure 7:
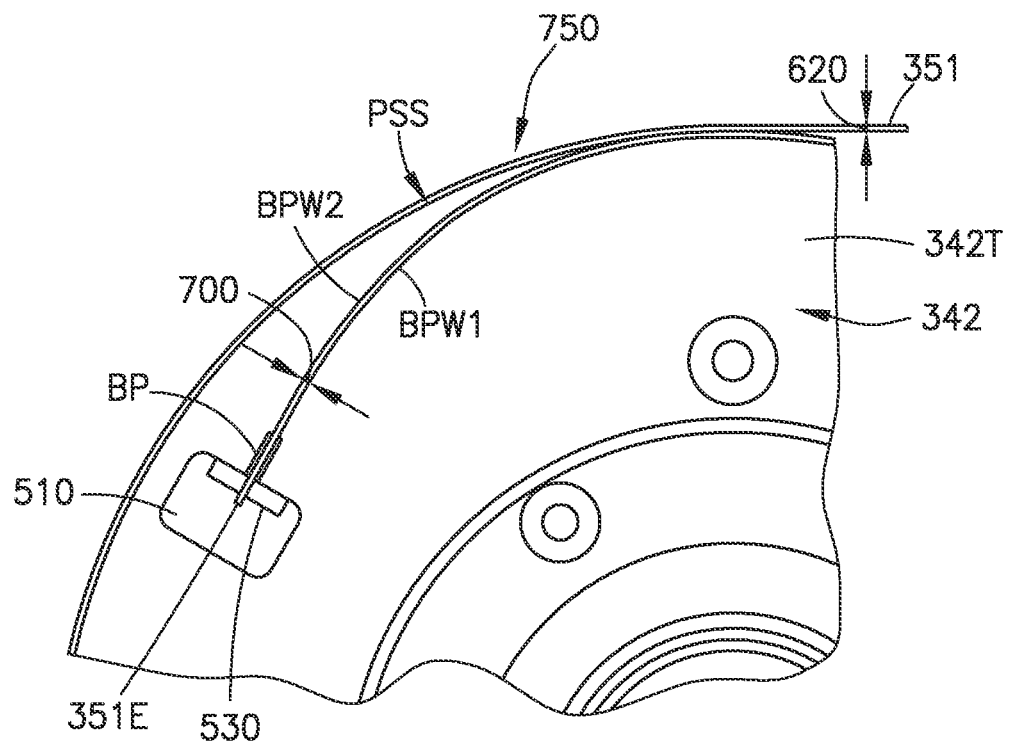
FIG. 7 illustrates a portion of an exemplary transmission of the substrate transport apparatus of FIGS. 1A-1E in accordance with aspects of the disclosed embodiment.

As can be seen in FIG. 7, the band passage BP has a width 700 between the interior and exterior walls BPW1, BPW2 that is slightly larger than a width 620 (see also FIG. 6) of the band 351 so that there is substantially no step formed between band wrap layers at the exit 750 of the band passage BP where the band 351 transitions from being seated on the exterior peripheral band seating surface PSS of the pulley 342 to being seated on itself (i.e., the band wrap laps over itself where, the lapped (inner) band wrap has the outer (radially with respect to pulley axis) band wrap seated on the inner band wrap). This substantially step-less transition at the exit 750 of the band passage BP supports the band 351 and substantially maintains a level of vibration that may be produced by the winding and unwinding of the band 351 from the top pulley portion 342T at a substantially constant level as will be described herein. In this aspect, the band passage BP and/or aperture 510 may be formed in any suitable manner, such as by electrical discharge machining (EDM). In some aspects, the aperture 510 may be omitted. It is noted that the exterior peripheral band seating surface PSS may be formed by grinding, milling, etc. so as to have any suitable circular or non-circular profile.

Figure 8A:
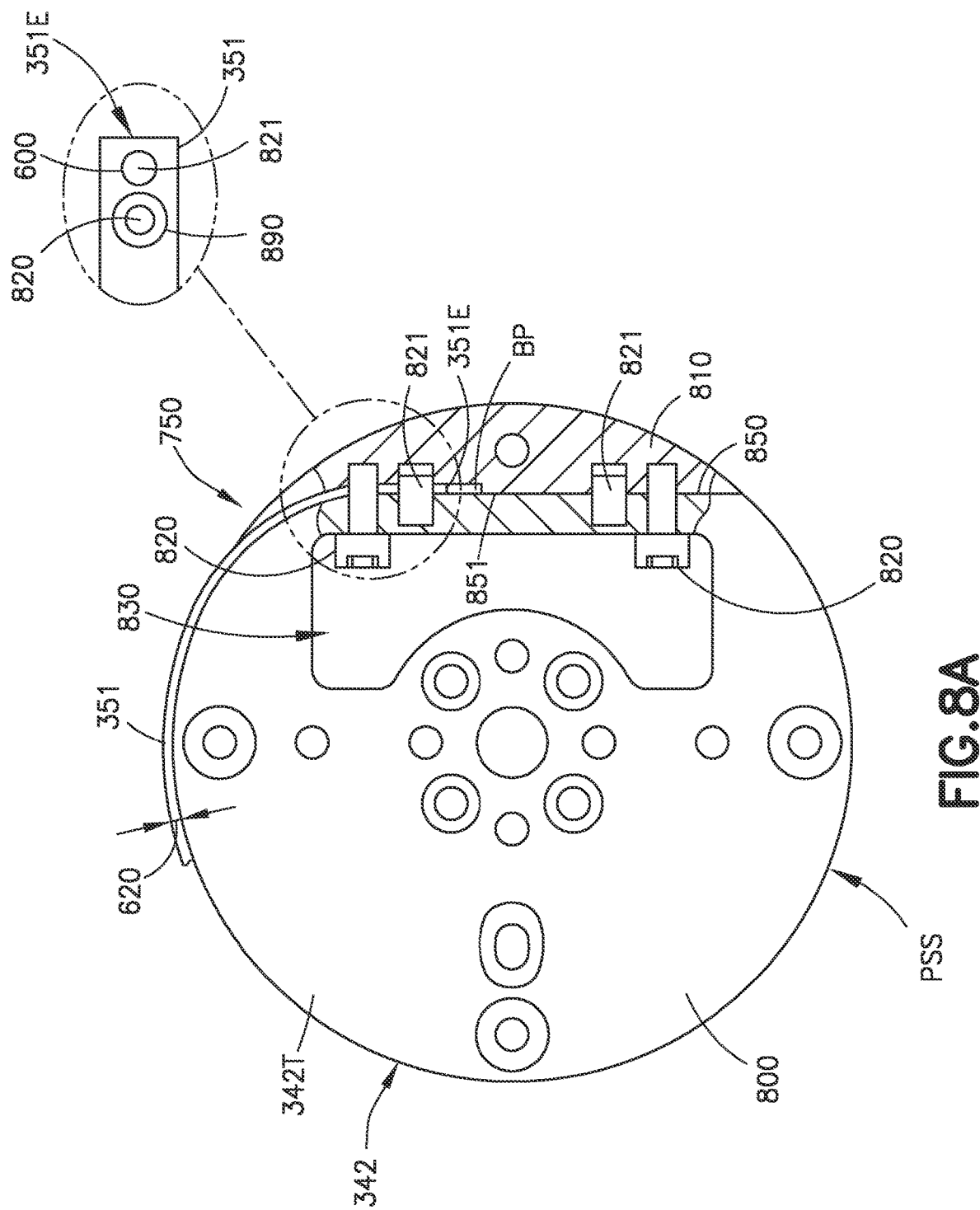
FIG. 8A-8C illustrate a portion of an exemplary transmission of the substrate transport apparatus of FIGS. 1A-1E in accordance with aspects of the disclosed embodiment.
Figure 8B:
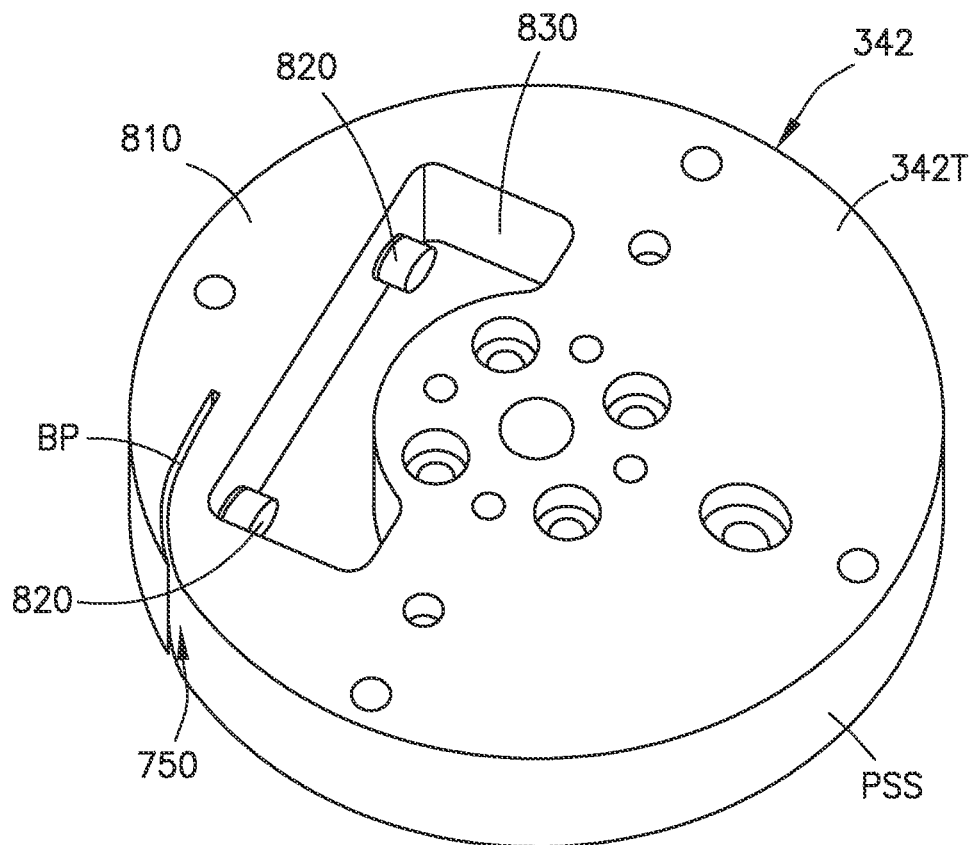
Figure 8C:
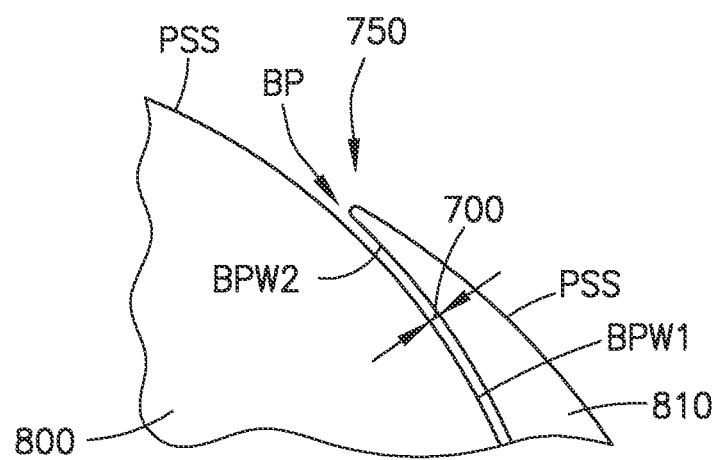

Referring to FIGS. 8A, 8B, and 8C, another exemplary coupling of a band to a pulley will be described in accordance with an aspect of the disclosed embodiment. It is noted that connection between band 351 and top pulley portion 342T will be described for exemplary purposes only and that the connection described herein may be employed with any of the pulleys/pulley portions and bands described herein. In some aspects, such as where the pulleys are non-circular, it is also noted that each bottom pulley portion may be substantially similar to but opposite in hand to the respective top pulley portion as will be described herein to account for a change in a length of the opposing band wraps around the pulleys. In this aspect, the top pulley portion 342T includes a body 800 and a clamp portion 810 that is coupled to the body 800 in any suitable manner so as to form the exterior peripheral band seating surface PSS. In one aspect, the body 800 includes a clamp coupling surface 850 and the clamp portion 810 includes a mating body coupling surface 851 that is in substantial contact with the clamp coupling surface 850 when the body 800 and clamp portion 810 are coupled to each other. For example, the clamp portion 810 is coupled to the body 800 using any suitable fasteners 820 (e.g., bolts, screws, etc.) and alignment features 821 (e.g., pins, grooves, etc.) so that the clamp portion 810 may be decoupled from and coupled to the body 800 in a repeatable manner (e.g., in substantially the same spatial relationship each time the clamp portion 810 is coupled to the body 800). The body 800 may include an aperture 830 through which the fasteners 820 may be accessed so that the exterior peripheral band seating surface PSS remains free of fastener holes/protrusions.

In this aspect, a band passage BP is formed between the body 800 and clamp portion 810 and extends at least partially along one or more of the clamp coupling surface 850 and the mating body coupling surface 851. In the example shown in FIG. 8A, the band passage BP is formed in the mating body coupling surface 851 however, in other aspects the band passage may be formed in the clamp coupling surface 850 or formed in both the clamp coupling surface 850 and the mating body coupling surface 851. In this aspect, end 351E of the band 351 may include a fastener clearance aperture 890 and the retainer aperture 600. In this aspect, one or more of the alignment features 821 passes through the retainer aperture 600 to anchor the end 351E of the band 351 to the top pulley portion 342T, while the fastener 820 substantially does not contact the fastener clearance aperture 890. In other aspects, the band 351 may be anchored to the top pulley portion 342T by compression (e.g., friction) between the clamp portion 810 and the body 800. In other aspects, the band 351 may be anchored to the top pulley portion 342T in any suitable manner.

In a manner similar to that described above, the band passage BP has a width 700 between the interior and exterior walls BPW1, BPW2 (the interior wall BPW1 being formed by the body 800 and the exterior wall BPW2 being formed by the clamp portion 810) that is slightly larger than or substantially equal to a width 620 (see also FIG. 6) of the band 351 so that there is substantially no step formed between band wrap layers at the exit 750 of the band passage BP where the band 351 transitions from being seated on the exterior peripheral band seating surface PSS of the pulley 342 to being seated on itself (e.g., in a manner similar to that shown in FIG. 7). This substantially step-less transition at the exit 750 of the band passage BP supports the band 351 and substantially maintains a level of vibration that may be produced by the winding and unwinding of the band 351 from the top pulley portion 342T at a substantially constant level as will be described herein. In this aspect, the band passage BP and the exterior peripheral band seating surface PSS may be formed in any suitable manner with, for example, the clamp portion 810 coupled to the body 800. In one aspect, the band passage BP, aperture 830, and/or exterior peripheral band seating surface PSS may be formed by electrical discharge machining. In other aspects, the exterior peripheral band seating surface PSS may be formed by grinding, milling, etc. so as to have any suitable circular or non-circular profile.

Figure 9A:
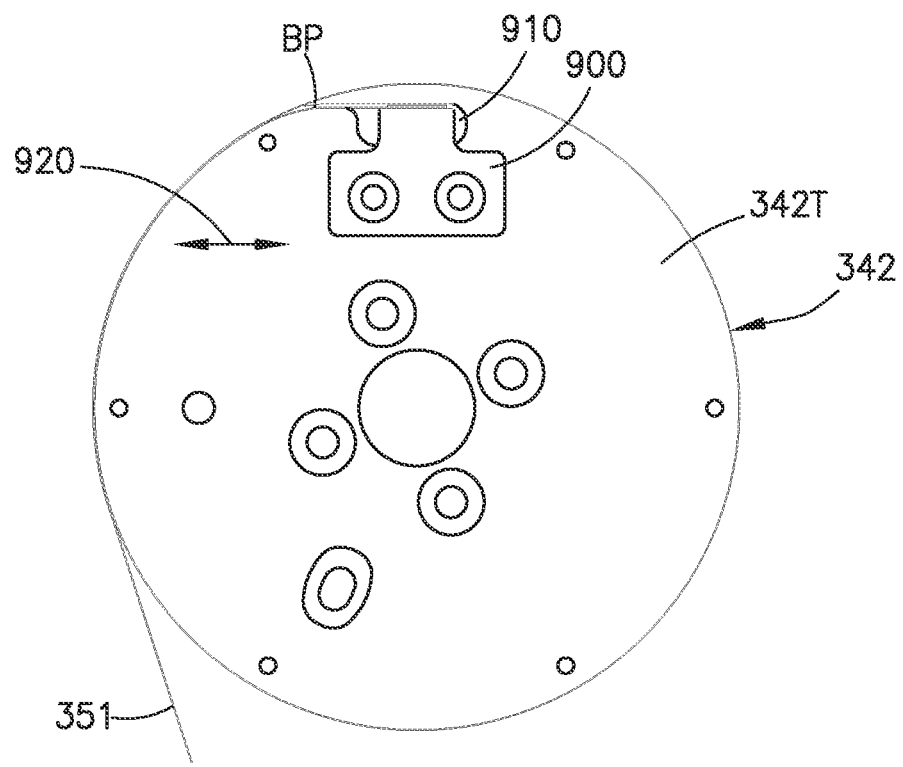
FIGS. 9A and 9B illustrate a portion of an exemplary transmission of the substrate transport apparatus of FIGS. 1A-1E in accordance with aspects of the disclosed embodiment.
Figure 9B:
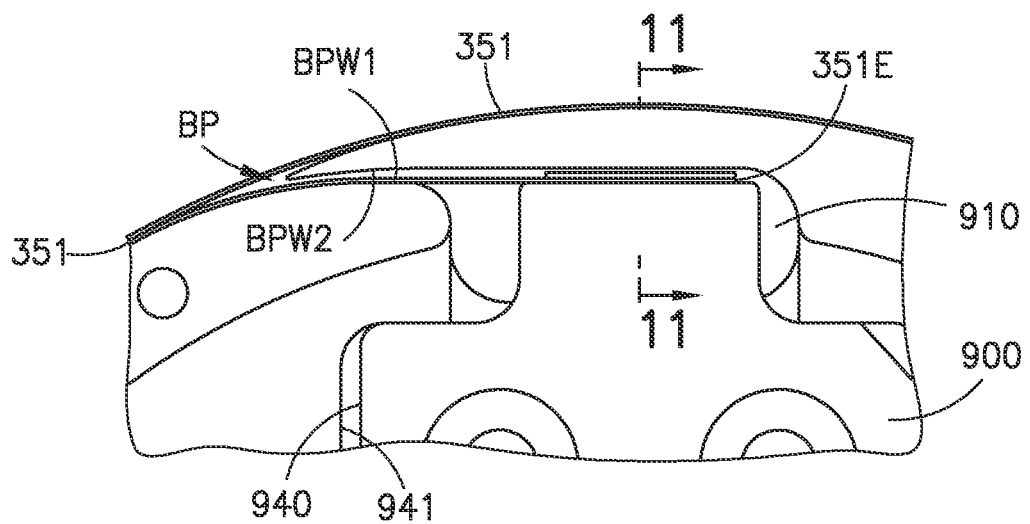
Figure 11:
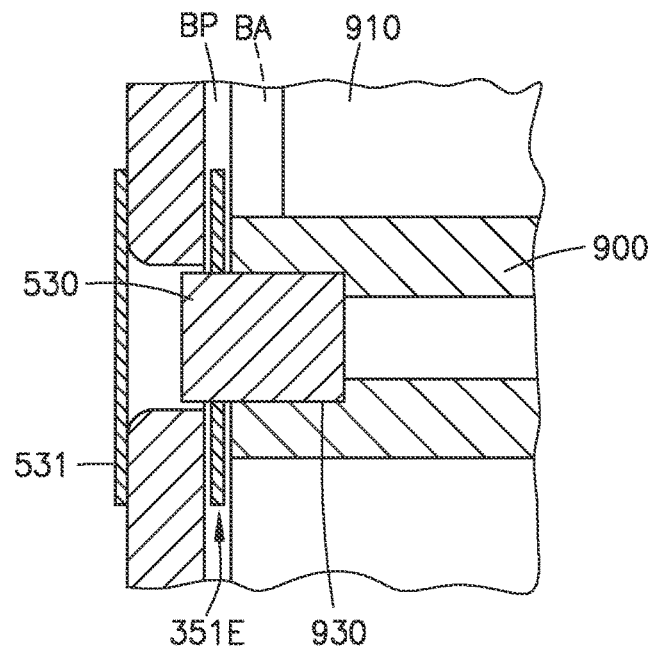
FIG. 11 illustrates a sectional view of the portion of the exemplary transmission of FIGS. 9A, 9B, 10A, and 10B in accordance with aspects of the disclosed embodiment.

Referring to FIGS. 9A, 9B, and 11, another exemplary coupling of a band to a pulley will be described in accordance with an aspect of the disclosed embodiment. It is noted that connection between band 351 and top pulley portion 342T will be described for exemplary purposes only and that the connection described herein may be employed with any of the pulleys/pulley portions and bands described herein. In some aspects, such as where the pulleys are non-circular, it is also noted that each bottom pulley portion may be substantially similar to but opposite in hand to the respective top pulley portion as will be described herein to account for a change in a length of the opposing band wraps around the pulleys. In this aspect the pulley 342 (and the top pulley portion 342T) may be substantially similar to that described above with respect to FIGS. 4A-7 however, in this aspect the pulley includes a band tensioner 900 on the interior of the top pulley portion 342T (the bottom pulley portion 342B includes a band tensioner in a similar manner) that is movable in direction 920 along the band passage BP. In this aspect, the band tensioner 900 is at least partially disposed within the aperture 910 into which the band passage BP opens. Here, the retainer member 530 (that extends through the retainer aperture 600 in the end 351E of the band 351) extends into a recess 930 in the band tensioner 900 so as to move in direction 920 with the band tensioner 900. As may be realized, because the retainer member 530 extends through the end 351E of the band 351, the end 351E of the band 351 also moves in direction 920 with the belt tensioner 900 so as to tighten or loosen the tension in the band 351.

Figure 12A:
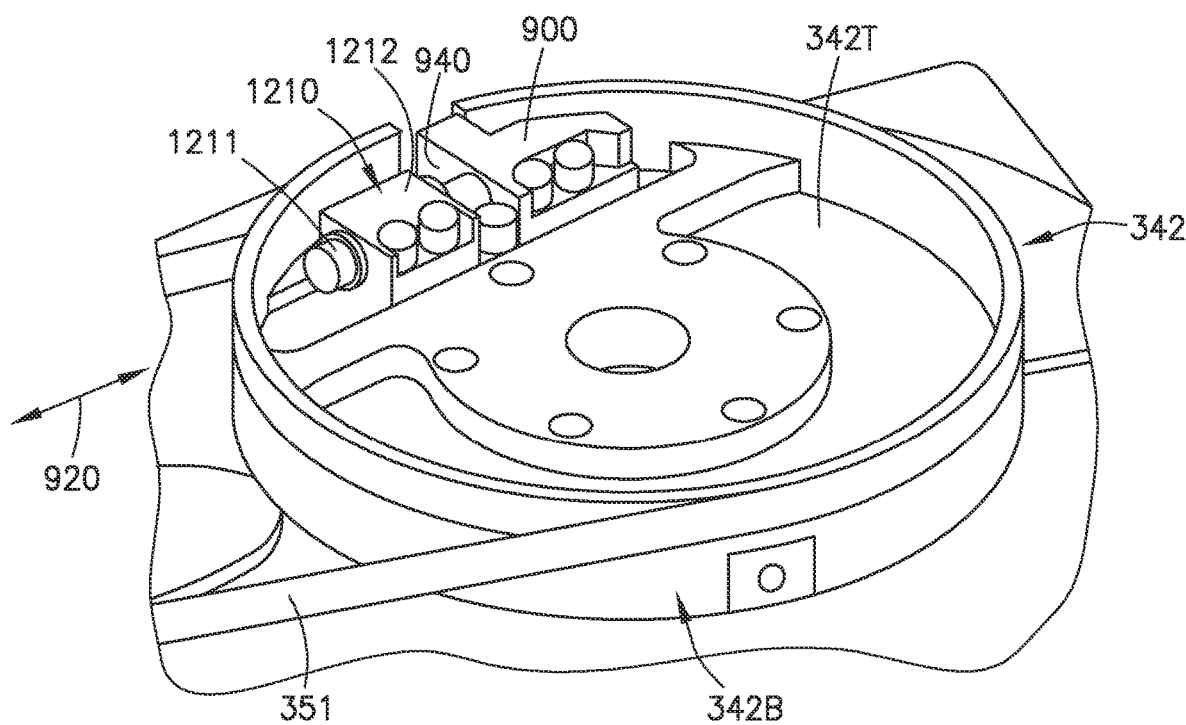
FIG. 12A illustrates a portion of an exemplary transmission of the substrate transport apparatus of FIGS. 1A-1E in accordance with aspects of the disclosed embodiment.
Figure 12B:
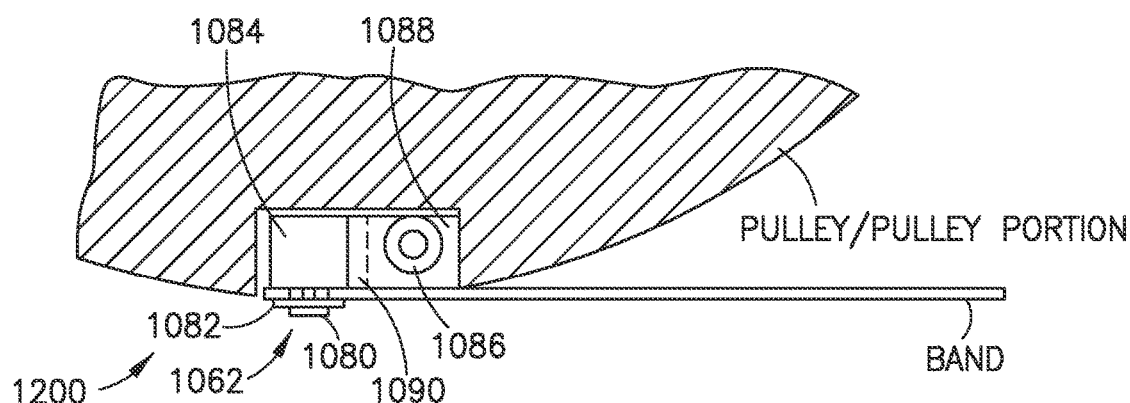
FIGS. 12B and 12C illustrate a portion of an exemplary transmission of the substrate transport apparatus of FIGS. 1A-1E in accordance with aspects of the disclosed embodiment.
Figure 12C:
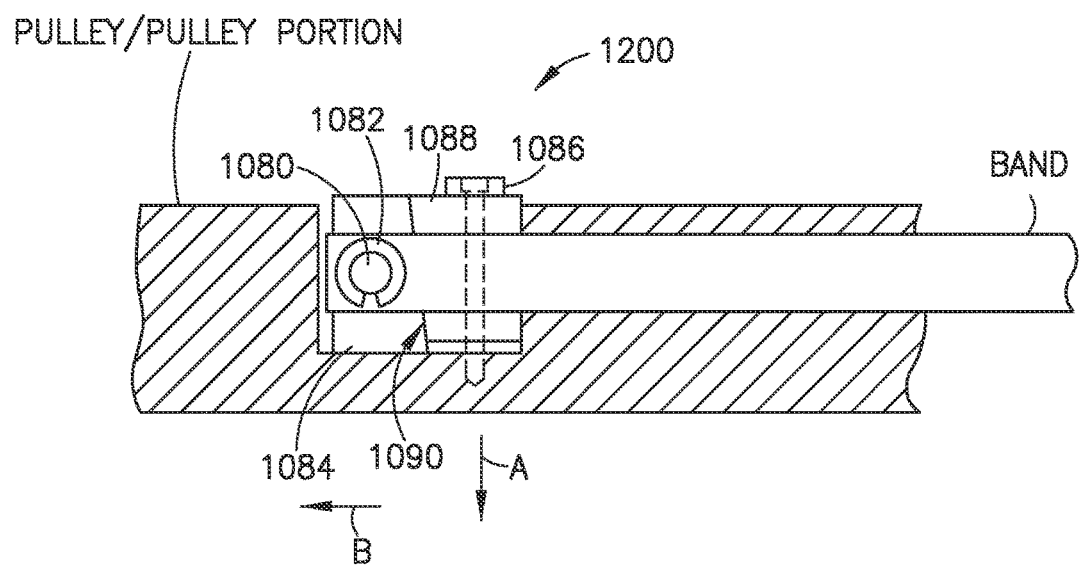

The band tensioner 900 may be moved in direction 920 in any suitable manner. For example, a wedge or other suitable spacer (substantially similar to wedge 1086 in FIGS. 12B and 12C) may be driven between a side 940 of the band tensioner 900 and an opposing wall 941 of the aperture 910 to move the band tensioner 900 in direction 920 and increase the tension in the band 351. In other aspects, the band tensioner 900 may be coupled with a jack screw mechanism 1210 (see FIG. 12A—noting the bottom pulley portion may include a similar jack screw mechanism). Here the jack screw mechanism 1210 includes a base 1212 that is fixed (so as to not move relative to) the top pulley portion 342T. The base 1212 includes a threaded aperture into which a jack screw 1211 is inserted. The jack screw may be fixed to the band tensioner 900 (such as with clips, etc. that allow rotation of the jack screw relative to the band tensioner 900 while restricting axial movement between the jack screw and the band tensioner) so as to pull (or in other aspects be tightened against side 940 of the band tensioner 900 so as to push) the band tensioner 900 and the end 351E of the band 350 in direction 920 to increase the tension in the band 351.

Figure 10A:
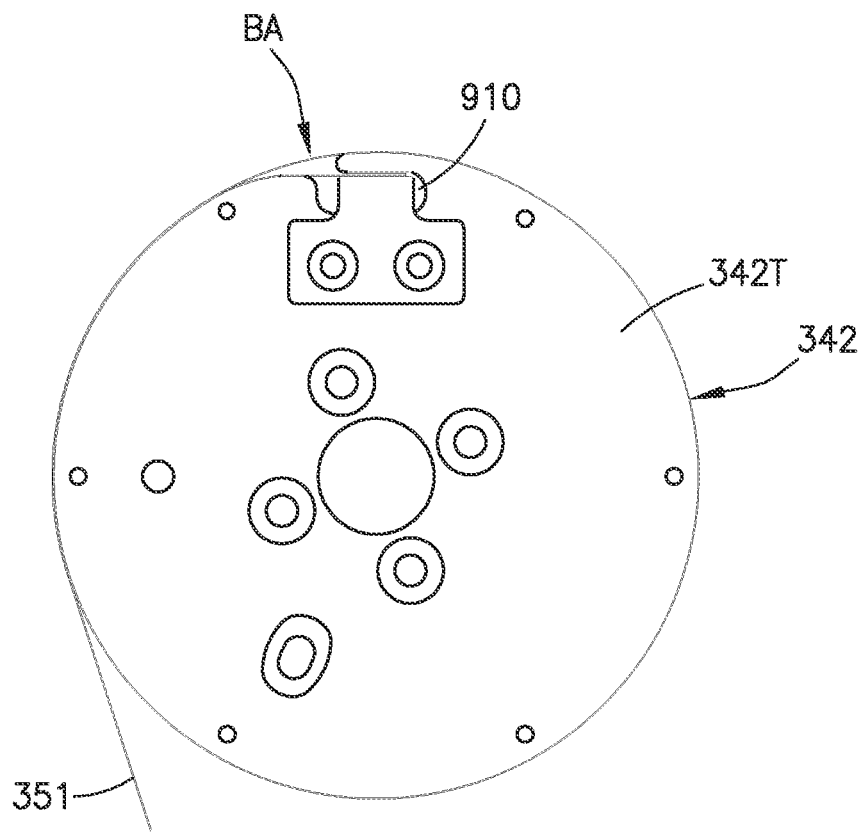
FIGS. 10A and 10B illustrate a portion of an exemplary transmission of the substrate transport apparatus of FIGS. 1A-1E in accordance with aspects of the disclosed embodiment.
Figure 10B:
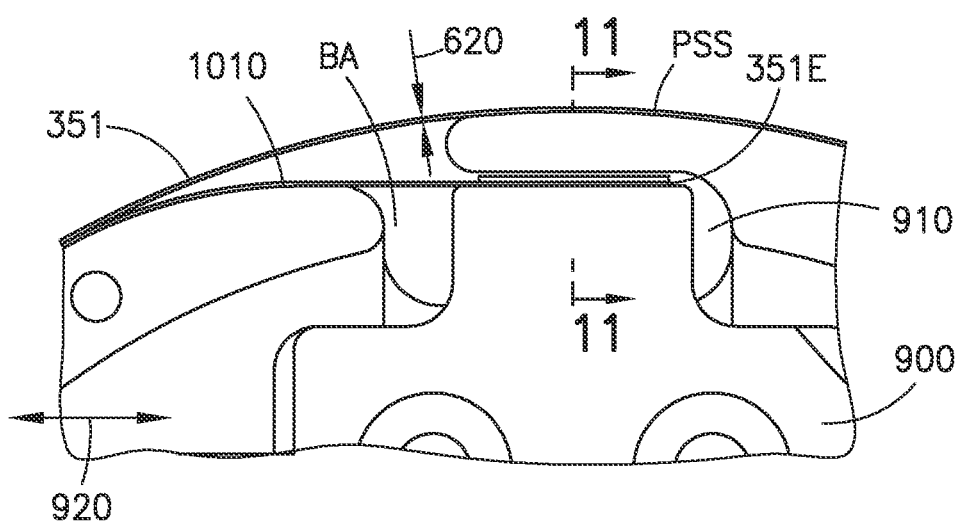

Referring to FIGS. 10A, 10B, and 11, another exemplary coupling of a band to a pulley will be described in accordance with an aspect of the disclosed embodiment. It is noted that connection between band 351 and top pulley portion 342T will be described for exemplary purposes only and that the connection described herein may be employed with any of the pulleys/pulley portions and bands described herein. In some aspects, such as where the pulleys are non-circular, it is also noted that each bottom pulley portion may be substantially similar to but opposite in hand to the respective top pulley portion as will be described herein to account for a change in a length of the opposing band wraps around the pulleys. In this aspect the pulley 342 (and the top pulley portion 342T) may be substantially similar to that described above with respect to FIGS. 4A-7 however, in this aspect the top pulley portion 342T includes a band entry aperture BA rather than band passage BP. The band entry aperture BA may be formed by conventional machining processes such as by casting, forging, milling, etc. as compared to electrical discharge machining (although electrical discharge machining may be used to form entry aperture BA). As can be seen in FIGS. 10A and 10B the entry aperture is substantially larger than the width 620 of the band 351. The entry aperture BA may be formed with a band coupling support surface 1010 that tangentially departs the exterior peripheral band seating surface PSS so as to form a smooth (e.g., tangential) transition between the exterior peripheral band seating surface PSS and the band coupling support surface 1010. In this aspect, the top pulley portion 342T includes the band tensioner 900 on the interior of the top pulley portion 342T (the bottom pulley portion 342B includes a band tensioner in a similar manner). The band tensioner 900 is substantially similar to that described above and may be moved in direction 920 in manners similar to those described above so that the end 351E of the band 351 moves in direction 920 within the aperture 910 to increase or decrease the tension in the band 351 as described above. In one aspect, such as where the band does not overwrap itself on the pulley (such as on the non-circular or cammed drive pulleys described herein or with the aspects illustrated in FIGS. 16-18A described below), the band tensioner may be incorporated into a band anchor point 1200 as shown (or similar to what is shown) in FIGS. 12B and 12C. In this aspect, each band anchor point 1200 includes a base 1084 to which a pin 1062 is mounted. The end of the respective band include a hole (e.g., retainer aperture 600) through which a spoke 1080 of the pin 1062 projects. A retaining spring clip 1082, or other suitable retainer, is attached to the spoke 1080 to secure the band to the spoke 1080 (it is noted that the retaining spring clip configuration may also be employed with respect to the retainer 530 described above, where the clip in installed on the retainer 530 through the aperture 510, 910 between the band and a wall of the aperture 510, 910). The spoke 1080 projects from the base 1084 to provide an attachment location for the band. In other aspects, the spoke 1080 could project directly from a circumferential edge or side of the pulley/pulley portion. In one aspect the hole in the band segment is slightly larger than the spoke 1080 and the retaining clip 1082 does not hold the band tightly so that the band is free to pivot around the spoke 1080. In one aspect, the base 1084 is an adjustable base that provides for location adjustment of the pin 1062 to thereby adjust the tension of the band. For example, a screw 1086 passes into a threshold opening in the pulley/pulley portion and holds a tightening wedge 1088 adjacent the pulley/pulley portion. One face of the tightening wedge 1088 engages a diagonal face 1090 of the base 1084. To increase the tension in the band, screw 1086 is tightened, pushing tightening wedge 1088 down in the direction of arrow A. This pushes wedge 1088 against diagonal surface 1090, thereby forcing base 1084 to slide in the direction of arrow B. Conversely, to decrease the tension in the band, screw 1086 is loosened. In other aspects, the band may be coupled to the pulley/pulley portion and the other pulleys of the transport arms described herein in any suitable manner. Suitable examples of band anchor points may be found in U.S. Pat. No. 5,778,730 issued on Jul. 14, 1998, the disclosure of which is incorporated herein by reference in its entirety.

Referring to FIGS. 3C, 13A, 13B, 14, and 15, in one aspect, the disclosed embodiment includes a set of spiral shaped pulley transmission pairs whose profiles (e.g., driven and drive sides) can be uniquely determined such that changes in drive ratio and band tension are minimized as a result of the multi-wrapping effect of the overwrapped bands. The input transmission design variables include (but are not limited to) band thickness, nominal drive ratio, pulley to pulley distances, and band bending radius. For example, a torque transmission (such as for example transmission 1794, and which may be substantially similar any of the torque transmissions described above), includes dual opposing bands 1300, 1301 (substantially similar to those described above) that have a winding geometry on at least one of the pulleys 1787, 1789 that, with a predetermined reduction ratio, provides rotation of the end effector EE1, EE2 (which may be similar to end effectors 140, 140A, 140B, 141, 142 described above) about the joint pivot axis or wrist axis WX (relative to the articulated arm link 1722) of more than about 360° end effector rotation from end to end of the end effector stroke (such between positions MAXR and MAX in FIG. 2A). It is noted that while transmission 1794 and pulleys 1787, 1789 are used for exemplary purposes, any of the other transmissions and respective pulleys described herein may be similarly configured to transmission 1794 and pulleys 1787, 1789.

The winding geometry of the dual opposing bands 1300, 1301 effects asymmetric winding and unwinding rates of respective opposing bands 1030, 1301 for common rotation of at least one of the pulleys 1787, 1789 connected to the bands (in this example both pulleys 1787, 1789 exhibit asymmetric winding and unwinding rates). To compensate for the asymmetric winding and unwinding of the bands, another pulley 1787, 1789 of the at least one of the pulleys 1787, 1789 connected to each other by the opposing bands 1300, 1301 is configured with a compensator arranged to compensate for the asymmetric winding and unwinding of the respective opposing bands 1300, 1301 so as to maintain substantially constant tension on each band 1300, 1301 of the opposing bands 1300, 1301 throughout the end effector stroke. As will be described herein, the compensator has a geometry that generates, for a common rotation of the another pulley 1787, 1789, asymmetric unwinding rates and winding rates of the respective opposing bands 1300, 1301 on the another pulley 1787, 1789 commensurate with asymmetric winding rates and unwinding rates of the respective opposing bands 1300, 1301 on the at least one of the pulleys 1787, 1789.

In this aspect, the pulley 1787 includes a top pulley portion 1787T and a bottom pulley portion 1787B which may be substantially similar to pulley portions 342T, 342B described above. Each of the top pulley portion 1787T and bottom pulley portion 1787B have a non-circular pulley profile with a cammed lobe 1370, 1371 for each of the respective opposing bands 1300, 1301, where the respective cam lobes 1370, 1371 of the respective non-circular profiles form a compensator for the asymmetric winding rates and unwinding rates of the pulley 1789. The respective cam lobes 1370, 1371 of the respective non-circular pulley profiles are disposed on the pulley periphery out of phase (e.g., the start/end of the cam lobe 1371 of the top pulley portion 1787T is at a different rotational angle relative to the start/stop of the cam lobe 1370 of the bottom pulley portion 1787B relative to, for example, the axis EX) by a degree (see FIGS. 13A and 13B) that defines the compensator geometry. Here, each of the cam lobes 1370, 1371 includes a respective cammed exterior peripheral band seating surface PSS1T, PSS1B as will be described in greater detail below.

Similarly, the pulley 1789 includes a top pulley portion 1789T and a bottom pulley portion 1789B which may be substantially similar to pulley portions 342T, 342B described above. In this aspect, each of the top pulley portion 1789T and bottom pulley portion 1789B have a non-circular pulley profile with a cammed lobe 1372, 1373 for each of the respective opposing bands 1300, 1301, where the respective cam lobes 1372, 1373 of the respective non-circular profiles form a compensator for the asymmetric winding rates and unwinding rates of the pulley 1787. The respective cam lobes 1372, 1373 of the respective non-circular pulley profiles are disposed on the pulley periphery out of phase (e.g., the start/end of the cam lobe 1372 of the top pulley portion 1789T is at a different rotational angle relative to the start/stop of the cam lobe 1373 of the bottom pulley portion 1789B relative to, for example, the axis EX) by a degree (see FIGS. 13A and 13B) that defines the compensator geometry. Here, each of the cam lobes 1372, 1373 includes a respective cammed exterior peripheral band seating surface PSS2T, PSS2B as will also be described in greater detail below.

The cammed exterior peripheral band seating surfaces PSS1T, PSS1B, PSS2B, PSS2B at least in part define the winding geometry of the dual opposing bands 1300, 1301 about their respective pulley. In one aspect, the winding geometry provides beyond substantially 180° end effector EE1, EE2 rotation RR from midstroke (e.g., such as position MID in FIG. 2A) to either end of the end effector stroke (e.g., such as positions MAX, MAXR in FIG. 2A for a rotation RR of at least 360°), and in some aspects the rotation RR is more than about +/−300° or more than about +/−360° from midstroke. In one aspect, the cammed exterior peripheral band seating surfaces PSS1T, PSS1B, PSS2B, PSS2B may be formed integrally with the respective pulley (such as when the pulley is cast, forged, machined, etc.). In other aspects, the cammed exterior peripheral band seating surfaces PSS1T, PSS1B, PSS2B, PSS2B may be formed on the respective pulley such as with a "sacrificial band wrap" on at least the driven side of the transmission. The sacrificial band wrap may provide reduced band tension variability, reduced wear, and/or reduced particle generation.

In this example, the pulley 1789 may be referred to as an idler or driven pulley (to which an end effector EE1 or EE2 is connected) and pulley 1787 may be referred to as a drive pulley. As noted above, the idler pulley 1789 is a non-circular pulley. The idler pulley 1789 has a band seating surface (e.g., the respective cammed exterior peripheral band seating surfaces PSS2T, PSS2B of the top and bottom pulley portions 1789T, 1789B) with a non-circular radial periphery (see FIGS. 13A and 13B) on which at least one band 1300, 1301 seats as the band 1300, 1301 is wound and dispensed from the idler pulley 1789. The drive pulley 1787 is also a non-circular pulley that has a band seating surface (e.g., the respective cammed exterior peripheral band seating surfaces PSS1T, PSS1B of the top and bottom pulley portions 1787T, 1787B) with a non-circular radial periphery (see FIGS. 13A and 13B) on which at least one band 1300, 1301 seats as the band 1300, 1301 is wound and dispensed from the drive pulley 1787. While in the example provided the idler and drive pulleys are both non-circular, in other aspects, the idler pulley may be circular and the drive pulley may be non-circular or vice versa. The pulley profiles (e.g., (e.g., the respective cammed exterior peripheral band seating surfaces PSS1T, PSS1B, PSS2T, PSS2B of the respective top and bottom pulley portions 1787T, 1787B, 1789T, 1789B) of the idler pulley 1789 and the drive pulley 1787 engage respective opposing bands 1300, 1301 winding and unwinding so as to maintain a substantially constant reduction ratio between the idler pulley 1789 and the drive pulley 1787 in each rotation direction throughout the end effector extension and retraction strokes.

Figure 13A:
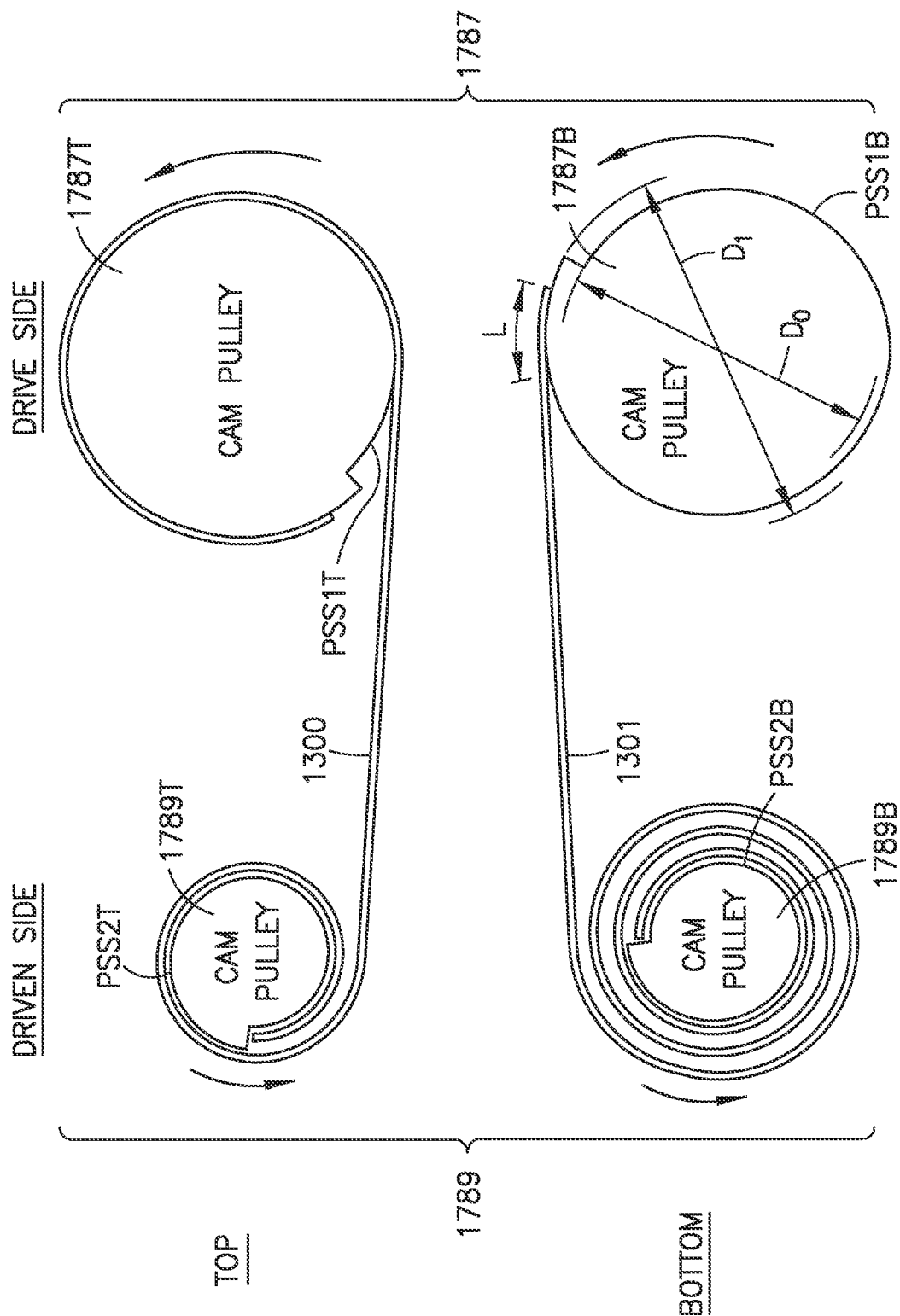
FIGS. 13A and 13B schematically illustrate opposing band wraps of top and bottom pulley portions of an exemplary transmission of the substrate transport apparatus of FIGS. 1A-1E in accordance with aspects of the disclosed embodiment.

As can be seen in FIGS. 3C, 13A, the top pulley portion 1787T and bottom pulley portion 1787B of pulley 1787 are stacked one above the other and are coupled to each other so as to rotate in unison about axis EX. The profiles of the cammed exterior peripheral band seating surfaces PSS1T, PSS1B of the top and bottom pulley portions 1787T, 1787B are arranged relative to one another so as to compensate for a different in the rate at which the top and bottom bands 1300, 1301 are dispensed or taken up by the respective top and bottom pulley portions 1787T, 1787B. Similarly, the top pulley portion 1789T and bottom pulley portion 1789B of pulley 1789 are stacked one above the other and are coupled to each other so as to rotate in unison about axis WX.

Figure 13B:
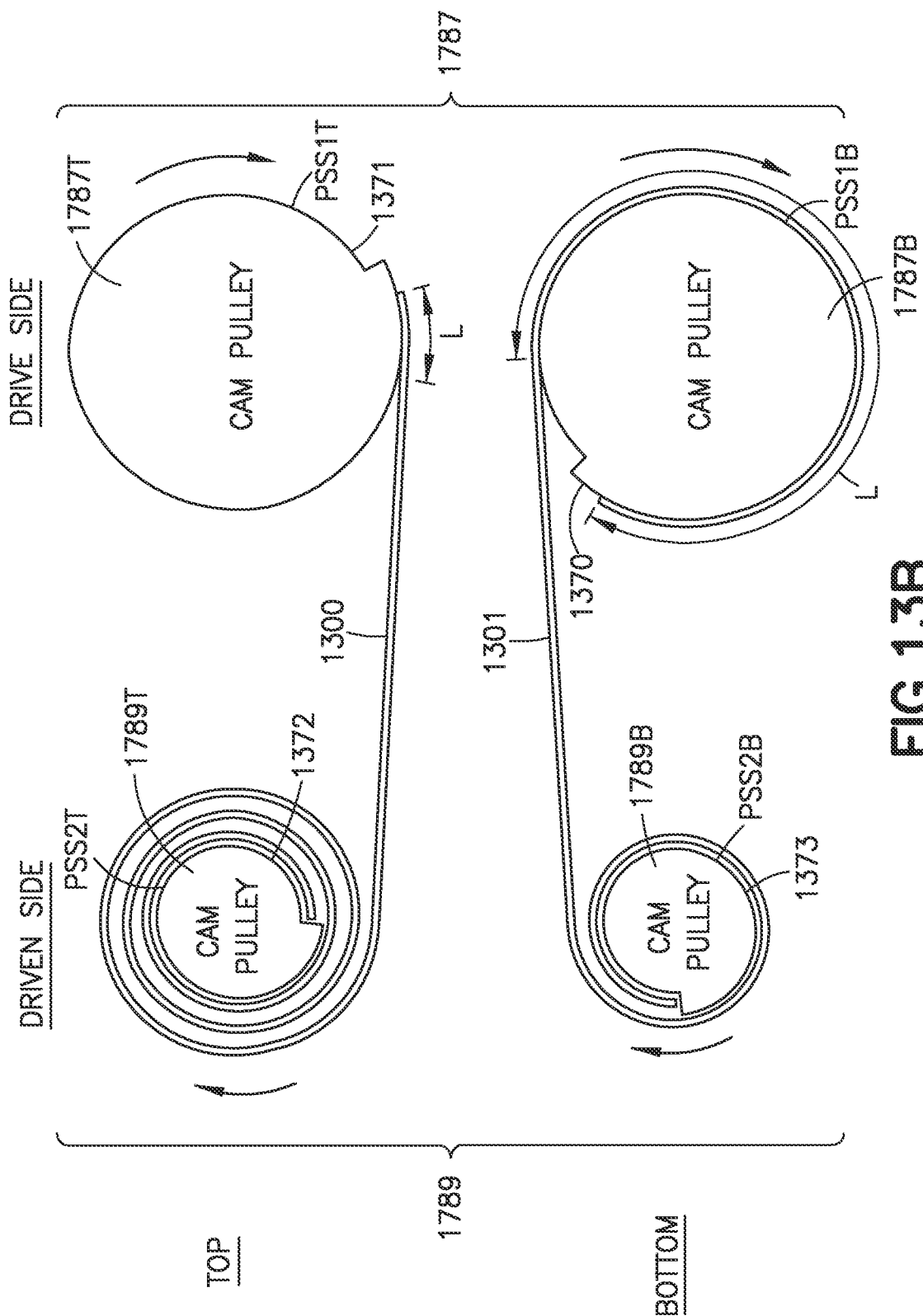

The profiles of the cammed exterior peripheral band seating surfaces PSS2T, PSS2B of the top and bottom pulley portions 1789T, 1789B are arranged relative to one another so as to compensate for a different in the rate at which the top and bottom bands 1300, 1301 are dispensed or taken up by the respective top and bottom pulley portions 1789T, 1789B. For example, the stacked pulley portions 1787T, 1787B may be arranged relative to each other so that the cammed exterior peripheral band seating surfaces PSS1T, PSS1B are opposite in hand. For example, when pulley portion 1787T dispenses/unwinds (or takes up/winds) band 1030 from the smaller radius portion of the cammed exterior peripheral band seating surfaces PSS1T, the pulley portion 1787B dispenses/unwinds (or takes up/winds) band 1301 from the larger radius portion of the cammed exterior peripheral band seating surfaces PSS1B as shown in FIGS. 13A and 13B. Similarly, the stacked pulley portions 1788T, 1789B may be arranged relative to each other so that the cammed exterior peripheral band seating surfaces PSS2T, PSS2B are opposite in hand. For example, when pulley portion 1789T dispenses/unwinds (or takes up/winds) band 1030 from the smaller radius portion of the cammed exterior peripheral band seating surfaces PSS2T, the pulley portion 1789B dispenses/unwinds (or takes up/winds) band 1301 from the larger radius portion of the cammed exterior peripheral band seating surfaces PSS2B as shown in FIGS. 13A and 13B. It is noted that in FIG. 13A band 1300 is illustrated as being wound around pulley portion 1787T and unwound from pulley portion 1789T while band 1301 is wound around pulley portion 1789B and unwound from pulley portion 1787B; and that in FIG. 13A band 1300 is illustrated as being unwound from pulley portion 1787T and wound around pulley portion 1789T while band 1301 is unwound from pulley portion 1789B and wound around pulley portion 1787B).

The profile of the cammed exterior peripheral band seating surfaces PSS1T, PSS1B, PSS2T, PSS2B may be determined using the following equation so as to determine a respective length of the top and bottom bands wrapped around a respective one of the top and bottom pulley portions 1787T, 1787B, 1789T, 1789B, $$L(\varphi_0, \varphi_1) = \frac{h}{2\pi}\left(\frac{\varphi_1}{2}\sqrt{\varphi_1^2 + 1} + \frac{1}{2}\ln\left(\varphi_1 + \sqrt{\varphi_1^2 + 1}\right) - \frac{\varphi_0}{2}\sqrt{\varphi_0^2 + 1} - \frac{1}{2}\ln\left(\varphi_0 + \sqrt{\varphi_0^2 + 1}\right)\right) \text{ where,} \quad [1]$$

$$\varphi_0 = \frac{\pi D_0}{h} \text{ and} \quad [2]$$

$$\varphi_1 = \frac{\pi D_1}{h} \quad [3]$$

Figure 14:
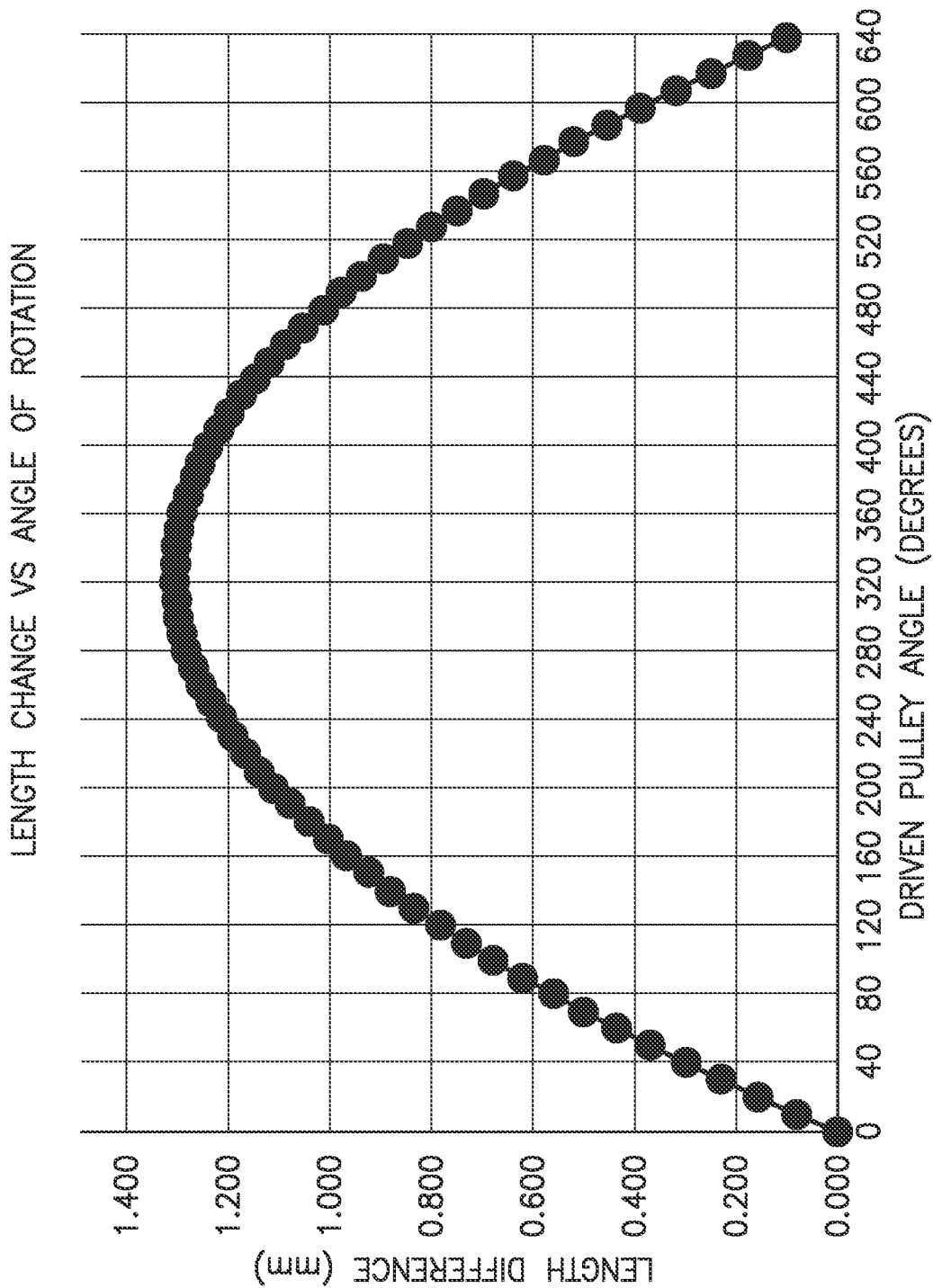
FIG. 14 illustrates an exemplary graph for a given non-circular pulley which illustrates a difference in length of a bands wrapped around the non-circular pulley for a given rotational angle of the non-circular pulley in accordance with aspects of the disclosed embodiment.

In equations [1]-[3] above, L is the length of band wrapped around a respective pulley portion, $D_0$ is the smallest diameter of the cammed exterior peripheral band seating surfaces PSS1, $D_1$ is the largest diameter of the cammed exterior peripheral band seating surfaces PSS1, $\varphi_0$ is the angle (from a predetermined reference position) at which the cam profile begins, $\varphi_1$ is the angle (from the predetermined reference position) at which the cam profile ends, and h is the thickness of the band. It is noted that FIG. 14 illustrates an exemplary graph for a given non-circular pulley (such as pulley 1787) which illustrates the difference in length of one of the bands 1300, 1301 of the opposing bands wrapped around the non-circular pulley for a given rotational angle of the non-circular pulley. As noted above, this difference in length is "absorbed" or compensated for during winding and unwinding of the band 1300, 1301 from the non-circular pulley (such as pulley 1787) by the compensator of the other pulley (such as pulley 1789) coupled to the opposing bands as illustrated in FIGS. 13A and 13B.

Figure 15:
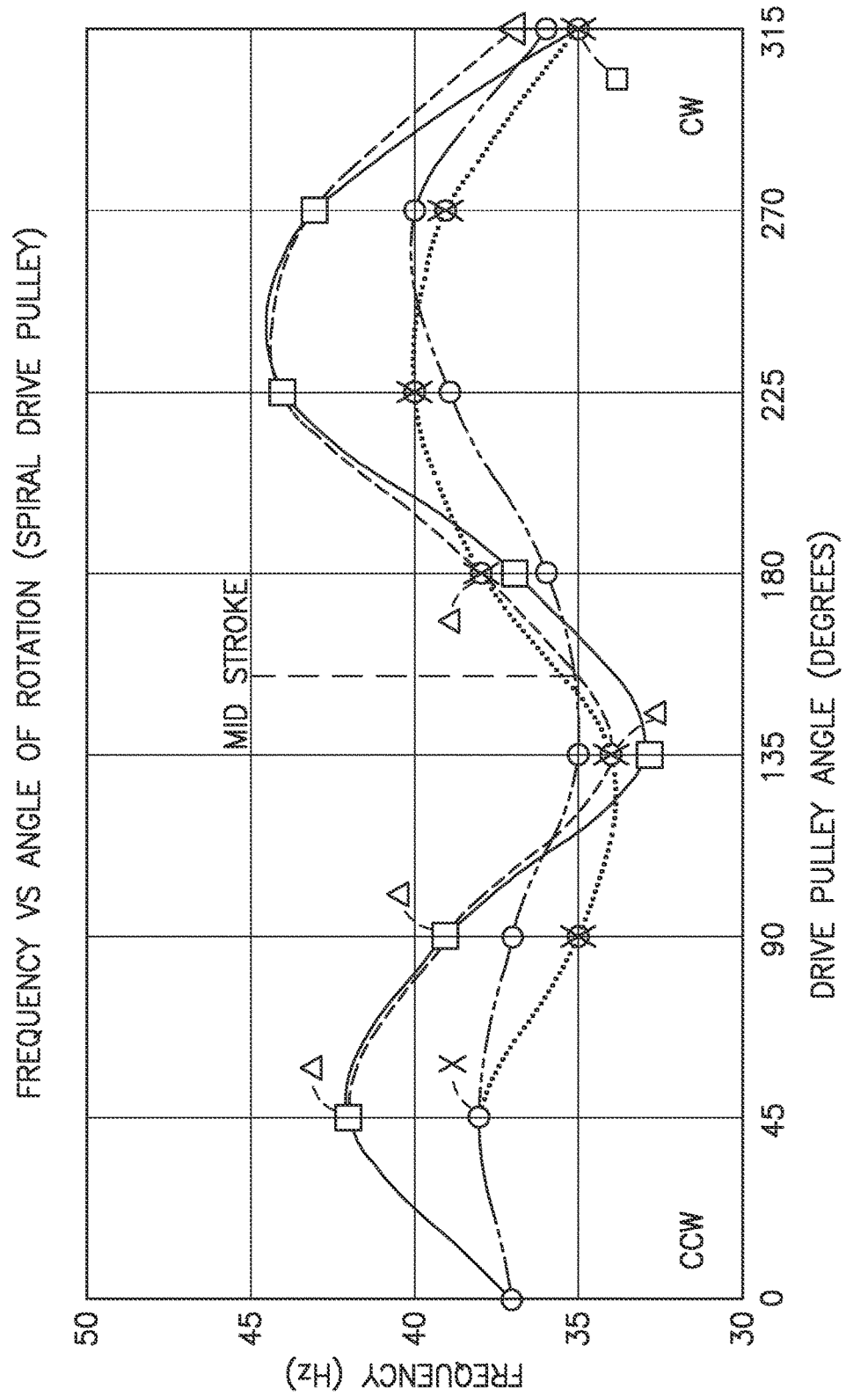
FIG. 15 illustrates an exemplary graph of a vibrational frequency in a transmission of the transport apparatus of FIGS. 1A-1E relative to a drive pulley angle in accordance with aspects of the disclosed embodiment.

Referring also to FIG. 15, a graph illustrating a vibrational frequency in the transmission (such as the transmission illustrated in FIGS. 13A and 13B) relative to the drive pulley 1787 angle. The graph illustrates vibrational frequencies (e.g., corresponding to band tension) at the drive pulley (such as pulley 1787) in both clockwise (CW) and counter-clockwise (CCW) rotation directions and identifies the mid-stroke of the rotation (which may coincide with the mid-stroke of the end effector stroke). In FIG. 15 the graph illustrates plots for a round pulley with a band anchor as shown in FIGS. 10A and 10B (e.g., the band anchor being machined with conventional manufacturing techniques) (i.e., identified as "round machined" on the graph); a round pulley with a band anchor as shown in FIGS. 9A and 9B (e.g., the band anchor being formed by EDM) (i.e., identified as "round EDM" on the graph); a non-circular pulley with a band anchor as shown in FIGS. 10A and 10B (e.g., the band anchor being machined with conventional manufacturing techniques) (i.e., identified as "spiral machined" on the graph); and a non-circular pulley with a band anchor as shown in FIGS. 9A and 9B (e.g., the band anchor being formed by EDM) (i.e., identified as "spiral EDM" on the graph). In this example, the tension on the bands is set to about 39 Hz at the midstroke. As can be seen in FIG. 15, the tension is substantially stable at the drive pulley throughout the stroke. It is also noted that a non-circular drive pulley and non-circular idle pulley pair provides the most stable band tension compared to other pulley combinations (e.g., round drive pulley with round idler puller, non-circular drive pulley with round idler pulley, or round drive pulley with non-circular idler pulley).

Figure 16:
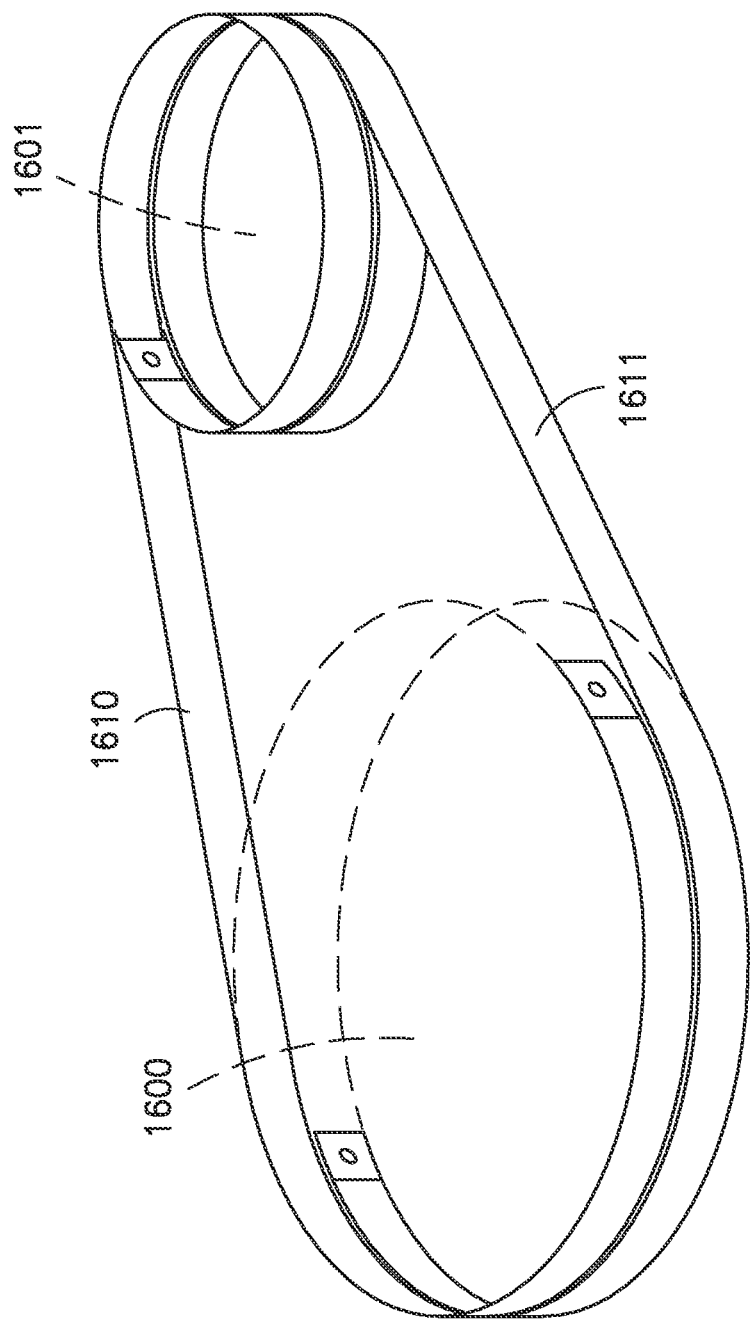
FIG. 16 is a schematic illustration of an exemplary band configuration of a transmission of the transport apparatus of FIGS. 1A-1E in accordance with aspects of the disclosed embodiment.

Referring to FIG. 16, an exemplary transmission is illustrated that includes a drive pulley 1600 and an idler/driven pulley 1601 that may be substantially similar to any of the drive and idler pulley pairs described herein. The drive pulley 1600 and idler pulley 1601 are connected to each other by opposing bands 1610, 1610 that are substantially similar to the opposing bands described herein. For exemplary purposes only the drive ratio between the drive pulley 1600 and the idler pulley 1601 is about 2:1 however any suitable drive ratio may be employed. The pulley and band configuration illustrated in FIG. 16 provides for at least +/−about 320° rotation of the idler pulley 1601 while the drive pulley 1600 rotates without overwrapping (e.g., lapping of) the bands 1610, 1611. Here, about +/−320° rotation of the idler pulley 1601 is provided based on a nominal (nominal being with respect to a slightly variable drive ratio of non-circular pulleys) drive ratio of about 2:1. However, it is noted that this aspects of the disclosed embodiment may be extended to different drive ratios depending on a desired angular stroke of the idler pulley, while substantially avoiding band wrap on the drive pulley 1600.

Figure 17A:
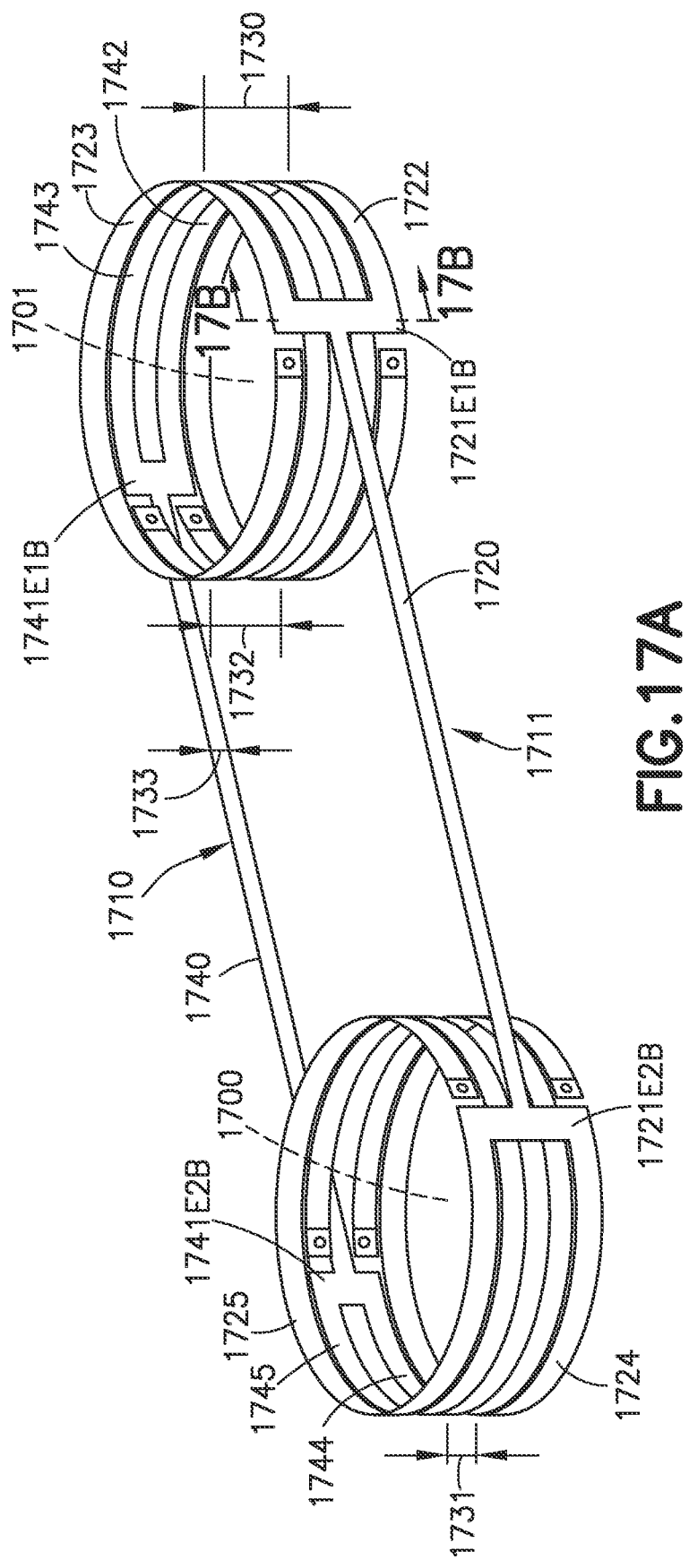
FIG. 17A is a schematic illustration of an exemplary band configuration of a transmission of the transport apparatus of FIGS. 1A-1E in accordance with aspects of the disclosed embodiment.
Figure 17B:
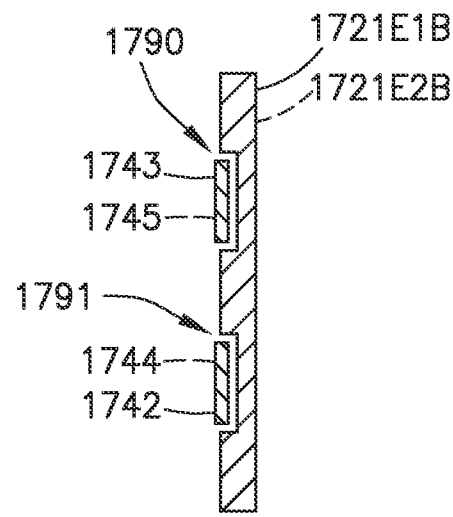
FIG. 17B is a section view as noted.

Referring to FIGS. 17A and 17B in one aspect of the disclosed embodiment the bands 1710, 1711 are configured to wrap multiple turns around the respective pulleys 1700, 1701 without band overlap (i.e., the band seating on itself) along the pulley circumference. In this example, the pulley 1700, 1701 may be circular pulleys but in other aspects the pulleys may be substantially similar to any of the pulleys described above. The opposing bands 1710, 1711 are also substantially similar to those described above however, in this example the terminal ends of the bands 1710, 1711 have a tine configuration to provide for wrapping multiple turns of the bands 1710, 1711 around the pulleys 1700, 1700 without overlapping of the bands. This aspect of the disclosed embodiment may provide for a substantially constant drive ratio between pulleys 1700, 1701.

For example, band 1711 includes a central band section 1720. A first band spanner section 1721E1B is formed integrally with (or coupled in any suitable manner to) a first end of the central band section 1720. Band tines 1722, 1723 are integrally formed with (or coupled in any suitable manner to) the first band spanner section 1721E1B and extend from the first band spanner section 1721E1B in a direction opposite to the central band section 1720, where each of the band tines 1722, 1723 are coupled to the pulley 1701 in a manner similar to that described herein. A second band spanner section 1721E2B is formed integrally with (or coupled in any suitable manner to) a second end of the central band section 1720 (i.e., opposite the first band spanner section 1721E1B). Band tines 1724, 1725 are integrally formed with (or coupled in any suitable manner to) the second band spanner section 1721E2B and extend from the second band spanner section 1721E2B in a direction opposite to the central band section 1720, where each of the band tines 1724, 1725 are coupled to the pulley 1700 in a manner similar to that described herein.

Similarly band 1710 includes a central band section 1740. A first band spanner section 1741E1B is formed integrally with (or coupled in any suitable manner to) a first end of the central band section 1740. Band tines 1742, 1743 are integrally formed with (or coupled in any suitable manner to) the first band spanner section 1741E1B and extend from the first band spanner section 1741E1B in a direction opposite to the central band section 1740, where each of the band tines 1742, 1743 are coupled to the pulley 1701 in a manner similar to that described herein. A second band spanner section 1741E2B is formed integrally with (or coupled in any suitable manner to) a second end of the central band section 1740 (i.e., opposite the first band spanner section 1741E1B). Band tines 1744, 1745 are integrally formed with (or coupled in any suitable manner to) the second band spanner section 1741E2B and extend from the second band spanner section 1741E2B in a direction opposite to the central band section 1740, where each of the band tines 1744, 1745 are coupled to the pulley 1700 in a manner similar to that described herein.

Tine 1742 and tine 1743 of band 1710 are separated from each other by a distance 1731 along an axial height of the pulley 1701 that is greater than a height 1733 of the central band section 1740 so as to form a combined band end height 1732 relative to the axial height of the pulley 1701. The distance 1731 between the tines 1742, 1743 provides for wrapping of the central band section 1740 as well as the central band section 1720 of band 1711 around the pulley 1701 without overlapping of the central band sections 1740, 1720 on the tines 1742, 1743. Similarly, tine 1744 and tine 1745 of band 1710 are separated from each other by the distance 1731 along an axial height of the pulley 1700 that is greater than the height 1733 of the central band section 1740 so as to form the combined band end height 1732 relative to the axial height of the pulley 1700. The distance 1731 between the tines 1744, 1745 provides for wrapping of the central band section 1740 of band 1710 as well as the central band section 1720 of band 1711 around the pulley 1700 without overlapping of the central band sections 1740, 1720 on the tines 1744, 1745.

Tine 1722 and tine 1723 of band 1711 are separated from each other along an axial length of the pulley 1701 by a distance 1730 that is larger than the combined height 1732 of the tines 1742, 1743 (e.g., larger than the height of each tine and the space 1731 between the tines 1742, 1743). The separation of the tines 1722, 1723 by the distance 1730 provides for wrapping of the tines 1742, 1743 of band 1710 around the pulley 1701 as wells as the wrapping of the central band sections 1720, 1740 of the bands 1710, 1711 around the pulley 1701. To avoid lapping of the first band spanner section 1721E1B (from which the tines 1722, 1723 extend) on the band 1710, the first band spanner section 1721E1B includes channels 1790, 1791 through which tines 1742, 1743 pass. The channels 1790, 1791 are shaped and sized so that walls of the channels 1790, 1791 substantially to do not contact a respective one of the tines 1742, 1743 so as to substantially prevent lapping of the band 1711 on the band 1710.

Tine 1724 and tine 1725 of band 1711 are also separated from each other along an axial length of the pulley 1700 by the distance 1730 that is larger than the combined height 1732 of the tines 1744, 1745 (e.g., larger than the height of each tine and the space 1731 between the tines 1744, 1745). The separation of the tines 1724, 1725 by the distance 1730 provides for wrapping of the tines 1744, 1745 of band 1710 around the pulley 1700 as wells as the wrapping of the central band sections 1720, 1740 of the bands 1710, 1711 around the pulley 1700. To avoid lapping of the second band spanner section 1721E2B (from which the tines 1724, 1725 extend) on the band 1710, the second band spanner section 1721E2B also includes channels 1790, 1791 through which tines 1744, 1745 pass. The channels 1790, 1791 are shaped and sized so that walls of the channels 1790, 1791 substantially to do not contact a respective one of the tines 1744, 1745 so as to substantially prevent lapping of the band 1711 on the band 1710.

Figure 18A:
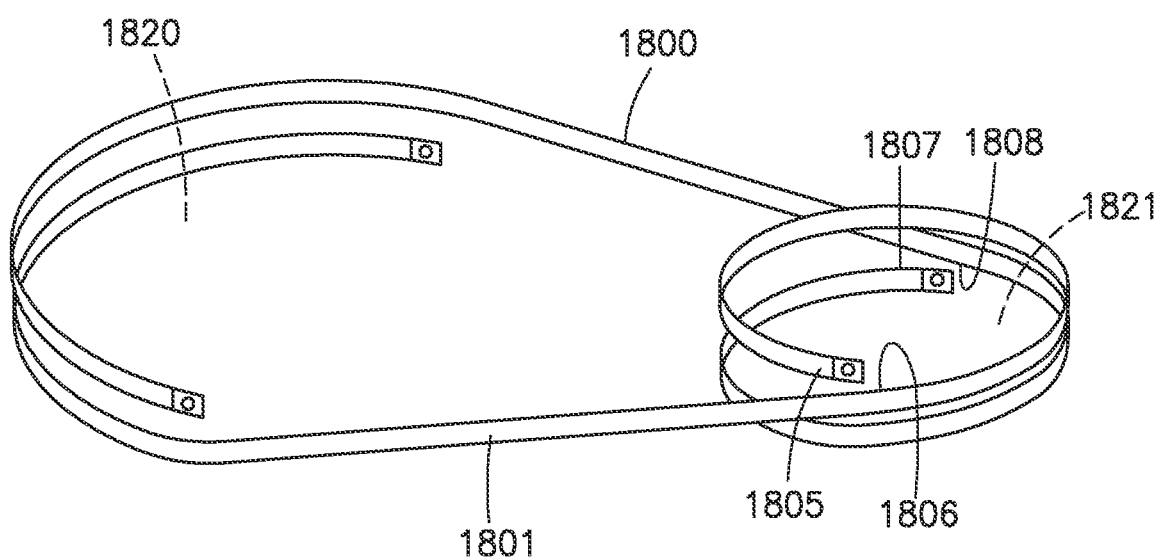
FIG. 18A is a schematic illustration of an exemplary band configuration of a transmission of the transport apparatus of FIGS. 1A-1E in accordance with aspects of the disclosed embodiment.
Figure 18B:
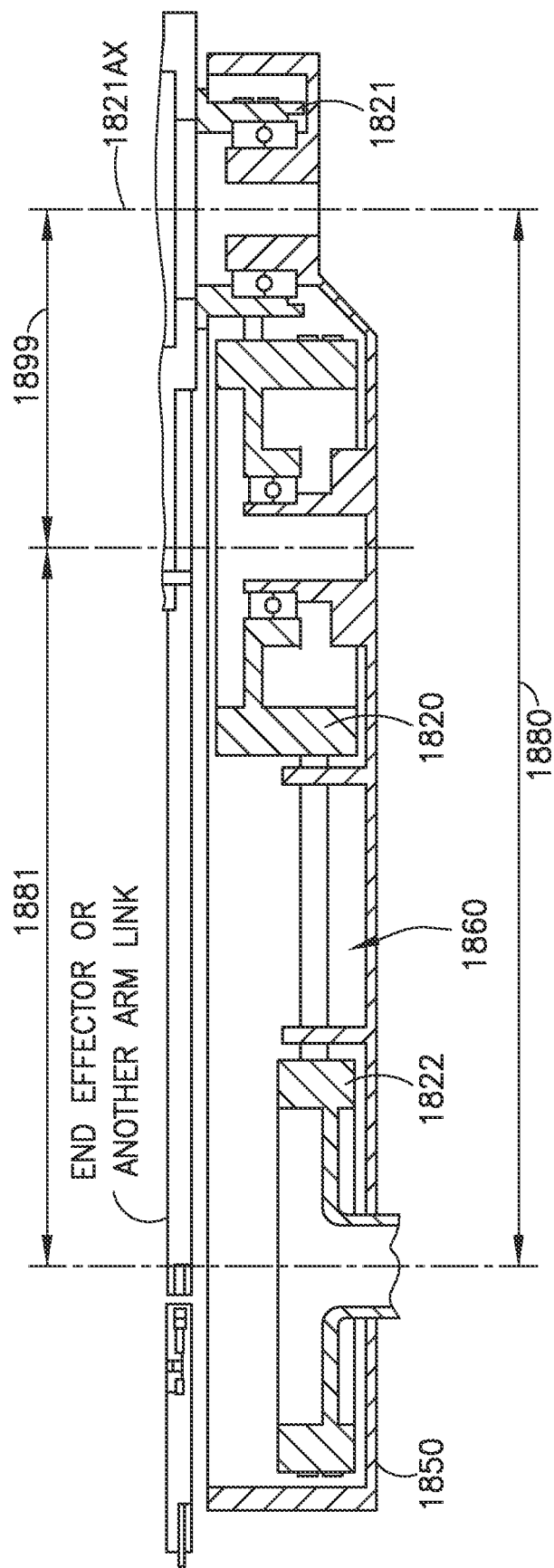
FIG. 18B is a schematic illustration of an arm link of the transport apparatus of FIGS. 1A-1E including the exemplary band configuration of the transmission of FIG. 18A in accordance with aspects of the disclosed embodiment.

Referring to FIGS. 18A and 18B an opposing band and pulley configuration is illustrated in accordance with aspects of the disclosed embodiment. In this aspect the bands 1800, 1801 are wound around pulleys 1820, 1821 such that both pulleys 1820, 1821 accommodate multiple turns of the bands 1800, 1801 substantially without lapping of the bands 1800, 1801 on themselves or each other. This aspect of the disclosed embodiment may also provide for a substantially constant drive ratio between the pulleys 1820, 1821. Here the axial length of at least one of the pulleys 1820, 1821 is dependent on the pulley to pulley distance 1899. For example, the band 1800 is overwrapped on at least pulley 1821 so that the band wrap spirals alongside itself with the band 1800 being wrapped having coil edges 1805, 1806 juxtaposed along a pulley axis 1821AX (which may coincide with the wrist axis WX or any other suitable axis of the transport arms described herein). Similarly, the band 1801 is overwrapped on at least pulley 1821 so that the band wrap spirals alongside itself with the band 1801 being wrapped having coil edges 1807, 1808 juxtaposed along the pulley axis 1821AX. The bands 1800, 1801 may be wrapped around pulley 1820 (which may be referred to as a drive pulley) such that the bands 1800, 1801 do note overlap on themselves throughout the angular stroke of the pulley 1820. In other aspects, the bands 1800, 1801 may be wrapped around pulley 1820 in a manner similar to that with respect to pulley 1821.

As can be seen in FIG. 18B, this aspect of the disclosed embodiment may be scaled for different arm link 1850 lengths by providing another transmission 1860 within the arm link 1850 that drives the pulley 1820. The other transmission 1860 may be substantially similar to any of the transmissions described above or the other transmission 1860 may be substantially similar to a conventional single turn band pulley transmission (where the bands are wrapped around respective pulleys by a single turn or less without band overwrap/lapping). Here the distance 1881 between pulley 1822 of the other transmission 1860 and the pulley 1820 may be increased or decreased depending on an overall length of the arm link 1850 while keeping the distance 1899 between pulleys 1820, 1821 the same.

Figure 19A:
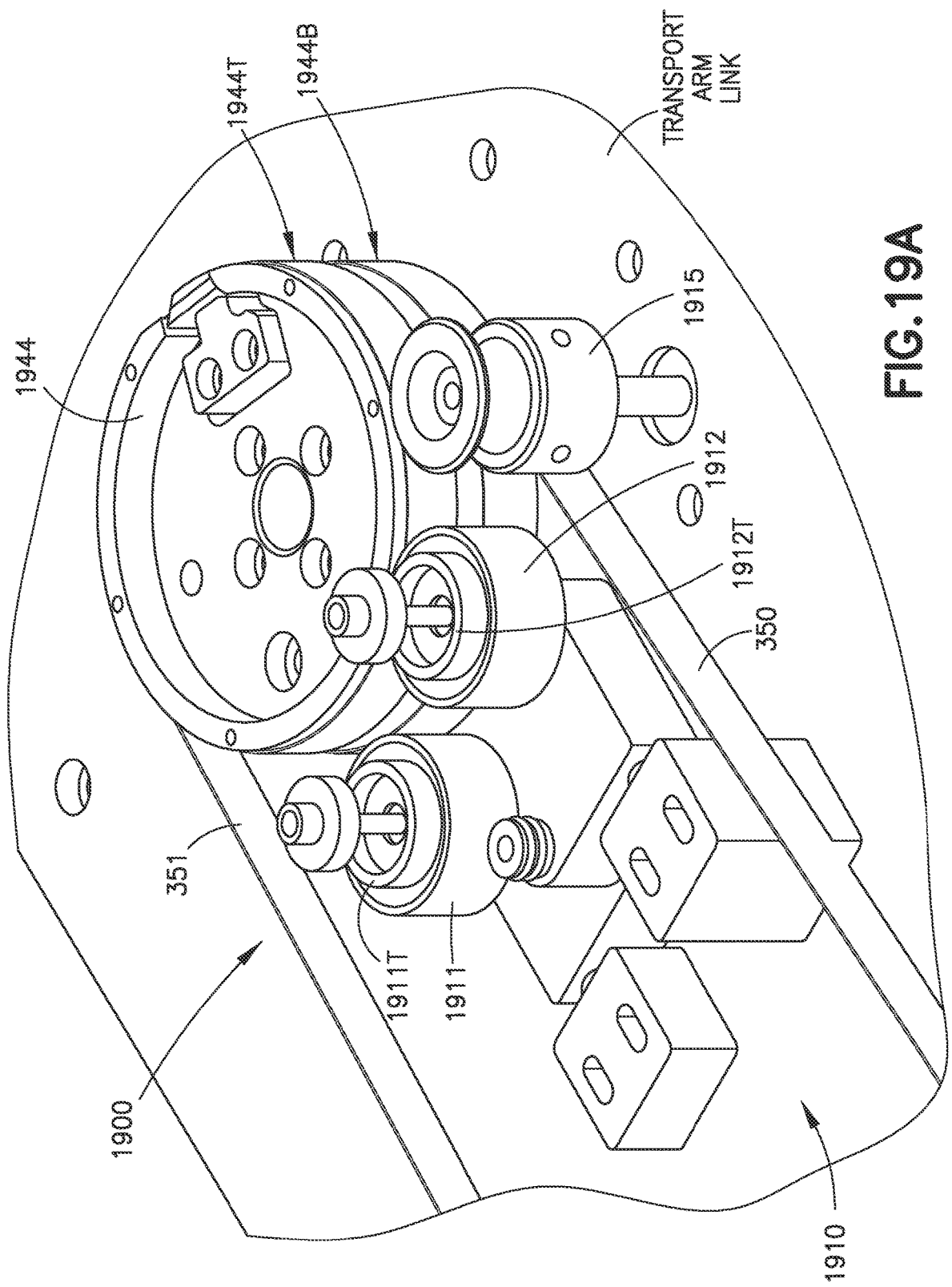

Referring to FIGS. 19A and 19B, an exemplary band installation fixture 1900 is illustrated. The band installation fixture 1900 maybe provided or otherwise installed (FIG. 20, Block 2000) within an arm link adjacent at least one of the respective pulleys to wrap the bands around the respective pulleys so that the bands are wrapped multiple times around the at least one of the respective pulleys. The band installation fixture 1900 includes a band tensioner 1910 on which a pair of guide wheels 1911, 1912 are pivotally mounted. The guide wheels 1911, 1912 are biased by the band tensioner 1910 (e.g., in any suitable manner) against a pulley 1944 (which may be substantially similar to any of the pulleys described herein. The guide wheels 1911, 1912 are disposed at different heights corresponding to a height of the band being wrapped. For example, guide wheel 1911 is disposed at a height for wrapping band 350 around the bottom pulley portion 1944B while guide pulley 1912 is disposed at a height for wrapping the band 351 around the top pulley portion 1944T. In one aspect, a height of the guide wheels 1911, 1912 may be adjustable for wrapping bands around two or more stacked pulleys (such as shown in FIG. 3C). Each of the guide wheels 1911, 1912 includes a tension member 1911T, 1912T which may be adjustable friction brakes that increase and/or decrease a force required to rotate a respective guide wheel 1911, 1912, where the guide wheel is configured to frictionally engage a respective band 350, 351 substantially without slippage between the guide wheel and band. The band installation fixture 1900 also includes at least one band height gauge 1915 that aligns the band at a respective height on the pulley 1944 (in FIGS. 19A and 19B band height gauge 1915 is shown in a position for installing band 351, however to install band 350 another band height gauge may be provided or band height gage 1915 may be moved to the opposite side of the pulley 1944 to location 1916 for installation of the band 350). The band height gauge 1915 may include grooves or other alignment features that effect height alignment of the band with the pulley.

Figure 20:
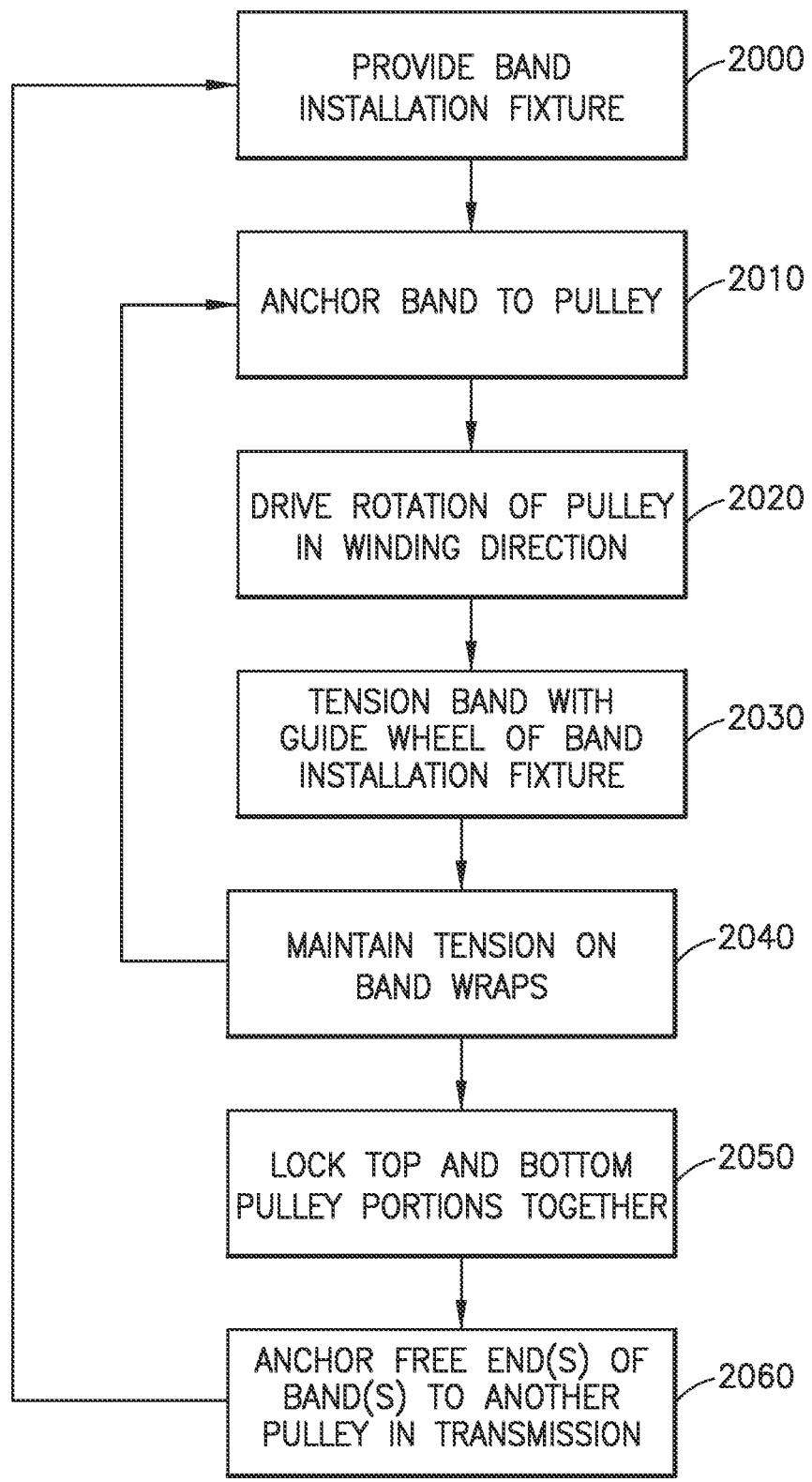
FIG. 20 is an exemplary method in accordance with aspects of the disclosed embodiment.

To install, for example, band 351 on top pulley portion 1944T the band 351 may be anchored to the top pulley portion 1944T (FIG. 20, Block 2010) in the manner described above at band anchor 1966 (which may be substantially similar to any of the band anchors described herein). The band anchor 1966 may be located adjacent the guide wheel 1911. The band 351 extends from the band anchor 1966 between the top pulley portion 1944T and the guide wheel 1911 and is aligned at a predetermined height by the band height gauge 1915. The top pulley portion 1944T may be driven or rotated in a winding direction (such as direction 1999) about axis AX (which may be any one of the pulley axes described herein) in any suitable manner (FIG. 20, Block 2020), such as with any suitable drive motor or by hand using, for example, a knob 1940 coupled to the top pulley portion 1944T. As the top pulley portion 1944T is rotated in winding direction 1999 the guide wheel 1911 provides moving resistance on the band 351 to tension the band against the pulley 1944 (FIG. 20, Block 2030). After a desired number of band wraps are provided on the top pulley portion 1944T, the guide wheel 1911 maintains tension of the band wraps on the top pulley portion 1944T (FIG. 20, Block 2040).

To install, for example, band 350 on bottom pulley portion 1944B the band 350 may be anchored to the bottom pulley portion 1944B (FIG. 20, Block 2010) in the manner described above at any suitable band anchor in a manner substantially similar to that described above with respect to band anchor 1966. The band anchor of the bottom pulley portion 1944B may be located adjacent the guide wheel 1912. The band 350 extends from the band anchor between the bottom pulley portion 1944B and the guide wheel 1912 and is aligned at a predetermined height by the band height gauge 1915. The bottom pulley portion 1944B may be driven or rotated in a winding direction (such as direction 1998) about axis AX (which may be any one of the pulley axes described herein) in any suitable manner (FIG. 20, Block 2020), such as with any suitable drive motor or by hand using, for example, a knob (similar to knob 1940) coupled to the bottom pulley portion 1944B. As the bottom pulley portion 1944B is rotated in winding direction 1998 the guide wheel 1912 provides moving resistance on the band 350 to tension the band against the bottom pulley portion 1944B (FIG. 20, Block 2030). After a desired number of band wraps are provided on the bottom pulley portion 1944B, the guide wheel 1912 maintains tension of the band wraps on the bottom pulley portion 1944B (FIG. 20, Block 2040).

As may be realized, where pulley portions are stacked one above the other as shown in FIG. 19A, the bottom pulley portion 1944B may be wrapped prior to the top pulley portion 1944T so that the bottom pulley portion may be driven in rotation by, for example, knob 1940. Here the top and bottom pulley portions are independently rotatable about the axis AX to facilitate winding the bands 350, 351 in opposing winding directions 1998, 1999. After the bands 350, 351 are wrapped around the respective top and bottom pulley portions 1944T, 1944B, and with tension being maintained on the band wraps by the respective guide wheel 1911, 1912, the top pulley portion 1944T and the bottom pulley portion 1944B may be locked together in any suitable manner (FIG. 20, Block 2050) so that the top pulley portion 1944T and the bottom pulley portion 1944B rotate as a unit about the axis AX.

The free ends of the bands 350, 351, with tension on the band wraps being maintained by the guide wheels 1911, 1912, may be anchored to another pulley in the transmission (FIG. 20, Block 2060) in any suitable manner so that the bands 350, 351 are tensioned against one another as described above. Where the bands 350, 351 are to be wrapped multiple turns around the another pulley in an opposing wrap, the bands 350, 351 may be wrapped in a manner substantially similar to that described above with respect to pulley 1944 while the tension in the band wraps is maintained by the band installation fixture 1910 of pulley 1944 during the opposing wrap.

In accordance with an aspect of the disclosed embodiment an exemplary method will be described with respect to FIGS. 1A-2E and 21. In accordance with the method a substrate transport apparatus 100, 101, 102, 103, 104 is provided (FIG. 21, Block 2100). The end effector 140, 140A, 140B, 141, 142 is moved (FIG. 21, Block 2110) respectively through an end effector stroke of extension 399 or retraction 389 with a drive band transmission (as described above) with drive and idler pulleys, having a predetermined reduction ratio, and at least one band connecting the drive and idler pulleys (as described above) that extends and retracts the articulated arm 120-124, wherein the at least one band is wrapped around at least one of the drive pulley and idler pulley so the at least one band is overwrapped relative to itself so the transmission with the predetermined reduction ratio rotates the end effector, relative to the at least one articulated arm link, about the joint pivot axis beyond substantially 180° from an end effector midstroke rotation position of the end effector to a maximum stroke rotation position of the end effector (e.g., rotation RR is at least about 360°), while in other aspects the rotation of the end effector from midstroke may be more than about +/−300° or more than about +/−360°.

In accordance with an aspect of the disclosed embodiment an exemplary method will be described with respect to FIGS. 1A-2E and 22. In accordance with the method a substrate transport apparatus 100, 101, 102, 103, 104 is provided (FIG. 22, Block 2200). The end effector 140, 140A, 140B, 141, 142 is moved through a corresponding end effector stroke (FIG. 22, Block 2210), where the articulated arm 120-124 has a drive band transmission, with drive and idler pulleys, with a predetermined reduction ratio and dual opposing bands connecting the pulleys (as described above), that extends and retracts the articulated arm 120-124 through an arm motion stroke extending or retracting the articulated arm 120-124, and wherein the dual opposing bands (as described above) have a winding geometry on at least one of the pulleys (as described above) that, with the predetermined reduction ratio, provides rotation of the end effector 140, 140A, 140B, 141, 142 about the joint pivot axis (e.g., wrist axis WX) of more than about 360° end effector rotation from end to end of the end effector stroke.

In accordance with one or more aspects of the disclosed embodiment a substrate transport apparatus comprises:
a frame;
a drive section connected to the frame; and
an articulated arm having at least one articulated arm link operably connected to the drive section so that the articulated arm rotates, about a pivot axis, relative to the frame and extends and retracts relative to the pivot axis;
wherein the articulated arm has an end effector pivotally mounted to the at least one articulated arm link forming a joint between the end effector and the at least one articulated arm link with an arm joint pivot axis disposed so that the end effector rotates relative to the at least one articulated arm link about the arm joint pivot axis, and wherein the articulated arm has a drive band transmission with drive and idler pulleys, having a predetermined reduction ratio, and at least one band connecting the drive and idler pulleys that extends and retracts the articulated arm moving the end effector respectively through an end effector stroke of extension or retraction; and
wherein the at least one band is wrapped around at least one of the drive pulley and idler pulley so the at least one band is overwrapped relative to itself so the transmission with the predetermined reduction ratio rotates the end effector, relative to the at least one articulated arm link, about the joint pivot axis beyond substantially 180° from end effector midstroke rotation position to a maximum stroke rotation position of the end effector stroke.

In accordance with one or more aspects of the disclosed embodiment the rotation of the end effector is beyond about 360° from end to end of the end effector stroke °.

In accordance with one or more aspects of the disclosed embodiment the at least one band is overwrapped relative to itself.

In accordance with one or more aspects of the disclosed embodiment the at least one band is overwrapped so that the band wrap spirals over itself on the pulley.

In accordance with one or more aspects of the disclosed embodiment the at least one band is overwrapped so that the band wrap laps over itself.

In accordance with one or more aspects of the disclosed embodiment the at least one band is overwrapped so that the band wrap spirals alongside itself with the band being wrapped having coil edges juxtaposed along a pulley axis.

In accordance with one or more aspects of the disclosed embodiment the idler pulley is coupled to the end effector so that idler pulley rotation rotates the end effector about the joint pivot axis.

In accordance with one or more aspects of the disclosed embodiment the at least one band is overwrapped relative to itself around the idler pulley.

In accordance with one or more aspects of the disclosed embodiment the idler pulley is non-circular pulley.

In accordance with one or more aspects of the disclosed embodiment the idler pulley has a band seating surface with a non-circular radial periphery on which the at least one band seats as the band is wound and dispensed from the idler pulley.

In accordance with one or more aspects of the disclosed embodiment the drive pulley is a non-circular pulley.

In accordance with one or more aspects of the disclosed embodiment the idler pulley and the drive pulley have pulley profiles that engage respective opposing bands winding and unwinding so as to maintain a substantially constant reduction ratio between the idler pulley and the drive pulley in each rotation direction throughout the end effector stroke of extension or retraction.

In accordance with one or more aspects of the disclosed embodiment the end effector has a substrate holding station thereon.

In accordance with one or more aspects of the disclosed embodiment the end effector has more than one substrate holding stations, at least two of the more than one substrate holding stations being on opposite ends of the end effector.

In accordance with one or more aspects of the disclosed embodiment the end effector has more than one end effectors, each separately connected to a respective idler pulley for independent rotation about the joint pivot axis with respect to each other.

In accordance with one or more aspects of the disclosed embodiment a substrate transport apparatus comprises:
a frame;
a drive section connected to the frame; and
an articulated arm having at least one articulated arm link operably connected to the drive section so that the articulated arm rotates, about a pivot axis, relative to the frame and extends and retracts relative to the pivot axis;
wherein the articulated arm has an end effector pivotally mounted to the at least one articulated arm link forming a joint between the end effector and the at least one articulated arm link with an arm joint pivot axis disposed so that the end effector rotates relative to the at least one articulated arm link about the arm joint pivot axis, and wherein the articulated arm has a drive band transmission, with drive and idler pulleys with a predetermined reduction ratio and dual opposing bands connecting the pulleys, that extends and retracts the articulated arm through an arm motion stroke extending or retracting the articulated arm and moving the end effector through a corresponding end effector stroke; and
wherein the dual opposing bands have a winding geometry on at least one of the pulleys that, with the predetermined reduction ratio, provides rotation of the end effector about the joint pivot axis of more than about 360° end effector rotation from end to end of the end effector stroke.

In accordance with one or more aspects of the disclosed embodiment the winding geometry provides beyond substantially 180° end effector rotation from midstroke to either end of the end effector stroke.

In accordance with one or more aspects of the disclosed embodiment the winding geometry effects asymmetric winding and unwinding rates of respective opposing bands for common rotation of the at least one of the pulleys.

In accordance with one or more aspects of the disclosed embodiment another pulley of the at least one of the pulleys connected to each other by the opposing bands is configured with a compensator arranged to compensate for the asymmetric winding and unwinding of the respective opposing bands so as to maintain substantially constant tension on each band of the opposing bands throughout the end effector stroke.

In accordance with one or more aspects of the disclosed embodiment the compensator has a geometry that generates, for a common rotation of the another pulley, asymmetric unwinding rates and winding rates of the respective opposing bands on the another pulley commensurate with asymmetric winding rates and unwinding rates of the respective opposing bands on the at least one of the pulleys.

In accordance with one or more aspects of the disclosed embodiment the another pulley has respective non-circular pulley profile with a cam lobe for each of the respective opposing bands, the respective cam lobes of the respective non-circular profiles form the compensator.

In accordance with one or more aspects of the disclosed embodiment the respective cam lobes of the respective non-circular pulley profiles are disposed on the pulley periphery out of phase by a degree that defines the compensator geometry.

In accordance with one or more aspects of the disclosed embodiment the at least one of the pulleys is the idler pulley, and the another pulley is the drive pulley.

In accordance with one or more aspects of the disclosed embodiment the idler pulley and the drive pulley have pulley profiles that engage the respective opposing bands winding and unwinding so as to maintain a substantially constant reduction ratio between the idler pulley and the drive pulley in each rotation direction throughout the end effector stroke.

In accordance with one or more aspects of the disclosed embodiment the idler pulley has a band seating surface with a non-circular radial periphery on which the at least one band seats as the band is wound and dispensed from the idler pulley.

In accordance with one or more aspects of the disclosed embodiment the drive pulley is a non-circular pulley.

In accordance with one or more aspects of the disclosed embodiment each of the opposing bands is overwrapped relative to itself.

In accordance with one or more aspects of the disclosed embodiment each of the opposing bands is overwrapped so that the band wrap spirals over itself on the pulley.

In accordance with one or more aspects of the disclosed embodiment each of the opposing bands is overwrapped so that the band wrap laps over itself.

In accordance with one or more aspects of the disclosed embodiment each of the opposing bands is overwrapped so that the band wrap spirals alongside itself with the band being wrapped having coil edges juxtaposed along a pulley axis.

In accordance with one or more aspects of the disclosed embodiment the at least one of the pulleys is an idler pulley coupled to the end effector so that idler pulley rotation rotates the end effector about the joint pivot axis.

In accordance with one or more aspects of the disclosed embodiment each of the opposing bands is overwrapped relative to itself around the idler pulley.

In accordance with one or more aspects of the disclosed embodiment a method comprises:
providing a substrate transport apparatus, where the substrate transport apparatus includes
a frame;
a drive section connected to the frame;
an articulated arm having at least one articulated arm link operably connected to the drive section so that the articulated arm rotates, about a pivot axis, relative to the frame and extends and retracts relative to the pivot axis; and
an end effector pivotally mounted to the at least one articulated arm link forming a joint between the end effector and the at least one articulated arm link with an arm joint pivot axis disposed so that the end effector rotates relative to the at least one articulated arm link about the arm joint pivot axis;
moving the end effector respectively through an end effector stroke of extension or retraction with a drive band transmission with drive and idler pulleys, having a predetermined reduction ratio, and at least one band connecting the drive and idler pulleys that extends and retracts the articulated arm; and
wherein the at least one band is wrapped around at least one of the drive pulley and idler pulley so the at least one band is overwrapped relative to itself so the transmission with the predetermined reduction ratio rotates the end effector, relative to the at least one articulated arm link, about the joint pivot axis beyond substantially 180° from an end effector midstroke rotation position to a maximum stroke rotation position of the end effector stroke.

In accordance with one or more aspects of the disclosed embodiment the rotation of the end effector is beyond about 360° from end to end of the end effector stroke.

In accordance with one or more aspects of the disclosed embodiment the at least one band is overwrapped relative to itself.

In accordance with one or more aspects of the disclosed embodiment the at least one band is overwrapped so that the band wrap spirals over itself on the pulley.

In accordance with one or more aspects of the disclosed embodiment the at least one band is overwrapped so that the band wrap laps over itself.

In accordance with one or more aspects of the disclosed embodiment the at least one band is overwrapped so that the band wrap spirals alongside itself with the band being wrapped having coil edges juxtaposed along a pulley axis.

In accordance with one or more aspects of the disclosed embodiment the idler pulley is coupled to the end effector so that idler pulley rotation rotates the end effector about the joint pivot axis.

In accordance with one or more aspects of the disclosed embodiment the at least one band is overwrapped relative to itself around the idler pulley.

In accordance with one or more aspects of the disclosed embodiment the idler pulley is non-circular pulley.

In accordance with one or more aspects of the disclosed embodiment the idler pulley has a band seating surface with a non-circular radial periphery on which the at least one band seats as the band is wound and dispensed from the idler pulley.

In accordance with one or more aspects of the disclosed embodiment the drive pulley is a non-circular pulley.

In accordance with one or more aspects of the disclosed embodiment the idler pulley and the drive pulley have pulley profiles that engage respective opposing bands winding and unwinding so as to maintain a substantially constant reduction ratio between the idler pulley and the drive pulley in each rotation direction throughout the end effector stroke of extension or retraction.

In accordance with one or more aspects of the disclosed embodiment the end effector has a substrate holding station thereon.

In accordance with one or more aspects of the disclosed embodiment the end effector has more than one substrate holding stations, at least two of the more than one substrate holding stations being on opposite ends of the end effector.

In accordance with one or more aspects of the disclosed embodiment the end effector has more than one end effectors, each separately connected to a respective idler pulley for independent rotation about the joint pivot axis with respect to each other.

In accordance with one or more aspects of the disclosed embodiment a method comprises:

providing a substrate transport apparatus, where the substrate transport apparatus includes a frame;

a drive section connected to the frame;

an articulated arm having at least one articulated arm link operably connected to the drive section so that the articulated arm rotates, about a pivot axis, relative to the frame and extends and retracts relative to the pivot axis; and an end effector pivotally mounted to the at least one articulated arm link forming a joint between the end effector and the at least one articulated arm link with an arm joint pivot axis disposed so that the end effector rotates relative to the at least one articulated arm link about the arm joint pivot axis; and moving the end effector through a corresponding end effector stroke, where the articulated arm has a drive band transmission, with drive and idler pulleys with a predetermined reduction ratio and dual opposing bands connecting the pulleys, that extends and retracts the articulated arm through an arm motion stroke extending or retracting the articulated arm;

wherein the dual opposing bands have a winding geometry on at least one of the pulleys that, with the predetermined reduction ratio, provides rotation of the end effector about the joint pivot axis of more than about 360° end effector rotation from end to end of the end effector stroke.

In accordance with one or more aspects of the disclosed embodiment the winding geometry provides beyond substantially 180° end effector rotation from midstroke to either end of the end effector stroke.

In accordance with one or more aspects of the disclosed embodiment the winding geometry effects asymmetric winding and unwinding rates of respective opposing bands for common rotation of the at least one of the pulleys.

In accordance with one or more aspects of the disclosed embodiment the method further comprises compensating for, with a compensator or another pulley, the asymmetric winding and unwinding of the respective opposing bands so as to maintain substantially constant tension on each band of the opposing bands throughout the end effector stroke.

In accordance with one or more aspects of the disclosed embodiment the method further comprises generating, with a geometry of the compensator, for a common rotation of the another pulley, asymmetric unwinding rates and winding rates of the respective opposing bands on the another pulley commensurate with asymmetric winding rates and unwinding rates of the respective opposing bands on the at least one of the pulleys.

In accordance with one or more aspects of the disclosed embodiment the another pulley has respective non-circular pulley profile with a cam lobe for each of the respective opposing bands, the respective cam lobes of the respective non-circular profiles form the compensator.

In accordance with one or more aspects of the disclosed embodiment the respective cam lobes of the respective non-circular pulley profiles are disposed on the pulley periphery out of phase by a degree that defines the compensator geometry.

In accordance with one or more aspects of the disclosed embodiment he at least one of the pulleys is the idler pulley, and the another pulley is the drive pulley.

In accordance with one or more aspects of the disclosed embodiment the idler pulley and the drive pulley have pulley profiles that engage the respective opposing bands winding and unwinding so as to maintain a substantially constant reduction ratio between the idler pulley and the drive pulley in each rotation direction throughout the end effector stroke.

In accordance with one or more aspects of the disclosed embodiment the idler pulley has a band seating surface with a non-circular radial periphery on which the at least one band seats as the band is wound and dispensed from the idler pulley.

In accordance with one or more aspects of the disclosed embodiment the drive pulley is a non-circular pulley.

In accordance with one or more aspects of the disclosed embodiment each of the opposing bands is overwrapped relative to itself.

In accordance with one or more aspects of the disclosed embodiment each of the opposing bands is overwrapped so that the band wrap spirals over itself on the pulley.

In accordance with one or more aspects of the disclosed embodiment each of the opposing bands is overwrapped so that the band wrap laps over itself.

In accordance with one or more aspects of the disclosed embodiment each of the opposing bands is overwrapped so that the band wrap spirals alongside itself with the band being wrapped having coil edges juxtaposed along a pulley axis.

In accordance with one or more aspects of the disclosed embodiment the at least one of the pulleys is an idler pulley coupled to the end effector so that idler pulley rotation rotates the end effector about the joint pivot axis.

In accordance with one or more aspects of the disclosed embodiment each of the opposing bands is overwrapped relative to itself around the idler pulley.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the disclosed embodiment.

What is claimed is:

1. A substrate transport apparatus comprising:

a frame;

a drive section connected to the frame; and an articulated arm having at least one articulated arm link operably connected to the drive section so that the articulated arm rotates, about a pivot axis, relative to the frame and extends and retracts relative to the pivot axis;

wherein the articulated arm has an end effector pivotally mounted to the at least one articulated arm link forming a joint between the end effector and the at least one articulated arm link with an arm joint pivot axis disposed so that the end effector rotates relative to the at least one articulated arm link about the arm joint pivot axis, and wherein the articulated arm has a drive band transmission with drive and driven pulleys where the driven pulley is connected to the articulated wrist, wherein the at least one band is wrapped around at least one of the connected pulleys so the at least one band is overwrapped relative to itself so the transmission is capable of generating rotation of the end effector well in excess of 180 Deg in either direction.

2. The substrate transport apparatus of claim 1, wherein the rotation of the end effector between a maximum extension stroke and a maximum retraction stroke is at least about 300°.

3. The substrate transport apparatus of claim 1, wherein the at least one band is overwrapped relative to itself.

4. The substrate processing apparatus of claim 3, wherein the at least one band is overwrapped so that the band wrap spirals over itself on the pulley.

5. The substrate processing apparatus of claim 3, wherein the at least one band is overwrapped so that the band wrap laps over itself.

6. The substrate processing apparatus of claim 3, wherein the at least one band is overwrapped so that the band wrap spirals alongside itself with the band being wrapped having coil edges juxtaposed along a pulley axis.

7. The substrate transport apparatus of claim 1, wherein at least one pulley of the connected pulleys is an idler pulley coupled to the end effector so that idler pulley rotation rotates the end effector about the joint pivot axis.

8. The substrate transport apparatus of claim 7, wherein the at least one band is overwrapped relative to itself around the idler pulley.

9. The substrate transport apparatus of claim 7, wherein the idler pulley is non-circular pulley.

10. The substrate transport apparatus of claim 7, wherein the idler pulley has a band seating surface with a non-circular radial periphery on which the at least one band seats as the band is wound and dispensed from the idler pulley.

11. The substrate transport apparatus of claim 7, wherein another of the at least one pulley of the connected pulleys is a drive pulley, where the drive pulley is a non-circular pulley.

12. The substrate transport apparatus of claim 11, wherein the idler pulley and the drive pulley have pulley profiles that engage respective opposing bands winding and unwinding so as to maintain a substantially constant reduction ratio between the idler pulley and the drive pulley in each rotation direction throughout the end effector extension and retraction strokes.

13. The substrate transport apparatus of claim 1, wherein the end effector has a substrate holding station thereon.

14. The substrate transport apparatus of claim 1, wherein the end effector has more than one substrate holding stations, at least two of the more than one substrate holding stations being on opposite ends of the end effector.

15. The substrate transport apparatus of claim 1, wherein the end effector has more than one end effectors connected to respective idler pulleys.

16. A substrate transport apparatus comprising:
a frame;
a drive section connected to the frame; and
an articulated arm having at least one articulated arm link operably connected to the drive section so that the articulated arm rotates, about a pivot axis, relative to the frame and extends and retracts relative to the pivot axis;
wherein the articulated arm has an end effector pivotally mounted to the at least one articulated arm link forming a joint between the end effector and the at least one articulated arm link with an arm joint pivot axis disposed so that the end effector rotates relative to the at least one articulated arm link about the arm joint pivot axis, and wherein the articulated arm has a drive band transmission, with pulleys and dual opposing bands connecting the pulleys, that extends and retracts the articulated arm through an arm motion stroke extending or retracting the articulated arm and moving the end effector through a corresponding end effector stroke; and
wherein the dual opposing bands have a winding geometry on at least one of the pulleys that determines rotation of the end effector about the joint pivot axis that provides at least substantially 300° end effector rotation from end to end of the end effector stroke; wherein each of the opposing bands is overwrapped relative to itself.

17. The substrate transport apparatus of claim 16 wherein the winding geometry provides at least substantially 145° end effector rotation from midstroke to either end of the end effector stroke.

18. The substrate transport apparatus of claim 16, wherein the winding geometry effects asymmetric winding and unwinding rates of respective opposing bands for common rotation of the at least one of the pulleys.

19. The substrate transport apparatus of claim 18, wherein another pulley of the at least one of the pulleys connected to each other by the opposing bands is configured with a compensator arranged to compensate for the asymmetric winding and unwinding of the respective opposing bands so as to maintain substantially constant tension on each band of the opposing bands throughout the end effector stroke.

20. The substrate transport apparatus of claim 19, wherein the compensator has a geometry that generates, for a common rotation of the another pulley, asymmetric unwinding rates and winding rates of the respective opposing bands on the another pulley commensurate with asymmetric winding rates and unwinding rates of the respective opposing bands on the at least one of the pulleys.

21. The substrate transport apparatus of claim 19, wherein the another pulley has respective non-circular pulley profile with a cam lobe for each of the respective opposing bands, the respective cam lobes of the respective non-circular profiles form the compensator.

22. The substrate transport apparatus of claim 21, wherein the respective cam lobes of the respective non-circular pulley profiles are disposed on the pulley periphery out of phase by a degree that defines the compensator geometry.

23. The substrate transport apparatus of claim 19, wherein the at least one of the pulleys is an idler pulley, and the another pulley is a drive pulley.

24. The substrate transport apparatus of claim 23, wherein the idler pulley and the drive pulley have pulley profiles that engage the respective opposing bands winding and unwinding so as to maintain a substantially constant reduction ratio between the idler pulley and the drive pulley in each rotation direction throughout the end effector stroke.

25. The substrate transport apparatus of claim 23, wherein the idler pulley has a band seating surface with a non-circular radial periphery on which the at least one band seats as the band is wound and dispensed from the idler pulley.

26. The substrate transport apparatus of claim 25, wherein another of the at least one pulley of the connected pulleys is a drive pulley, where the drive pulley is a non-circular pulley.

27. The substrate processing apparatus of claim 16, wherein each of the opposing bands is overwrapped so that the band wrap spirals over itself on the pulley.

28. The substrate processing apparatus of claim 16, wherein each of the opposing bands is overwrapped so that the band wrap laps over itself.

29. The substrate processing apparatus of claim 16, wherein each of the opposing bands is overwrapped so that the band wrap spirals alongside itself with the band being wrapped having coil edges juxtaposed along a pulley axis.

30. The substrate transport apparatus of claim 16, wherein the at least one of the pulleys is an idler pulley coupled to the end effector so that idler pulley rotation rotates the end effector about the joint pivot axis.

31. The substrate transport apparatus of claim 30, wherein each of the opposing bands is overwrapped relative to itself around the idler pulley.

32. A method comprising:
providing a substrate transport apparatus, where the substrate transport apparatus includes:
a frame,
a drive section connected to the frame,
an articulated arm having at least one articulated arm link operably connected to the drive section so that the articulated arm rotates, about a pivot axis, relative to the frame and extends and retracts relative to the pivot axis, and
an end effector pivotally mounted to the at least one articulated arm link forming a joint between the end effector and the at least one articulated arm link with an arm joint pivot axis disposed so that the end effector rotates relative to the at least one articulated arm link about the arm joint pivot axis;
moving the end effector respectively through an extension stroke and a retraction stroke with a drive band transmission with pulleys and at least one band connecting the pulleys that extends and retracts the articulated arm; and
wherein the at least one band is wrapped around at least one of the connected pulleys so the at least one band is overwrapped relative to itself so the transmission generates rotation of the end effector, relative to the at least one articulated arm link, about the joint pivot axis that is at least about 145° from an end effector midstroke rotation position of the end effector to a maximum stroke rotation position of the end effector.

33. The method of claim 32, wherein the rotation of the end effector between a maximum extension stroke and a maximum retraction stroke is at least about 300°.

* * * * *